United States Patent [19]
Kokubun

[11] Patent Number: 6,008,716
[45] Date of Patent: Dec. 28, 1999

[54] FUSE STRUCTURE CONNECTING FIRST LEVEL AND SECOND LEVEL INTERCONNECTIONS IN INTER-LAYER INSULATOR

[75] Inventor: Tetsuya Kokubun, Tokyo, Japan

[73] Assignee: NEC Corporation, Tokyo, Japan

[21] Appl. No.: 09/157,539

[22] Filed: Sep. 21, 1998

[30] Foreign Application Priority Data

Sep. 19, 1997 [JP] Japan ................................. 9-255306

[51] Int. Cl.⁶ ...................... H01H 85/046; H01H 85/08; H01L 27/115; H01L 29/00; H01R 9/09
[52] U.S. Cl. ........................ 337/297; 337/296; 337/290; 337/160; 337/405; 257/529; 257/530
[58] Field of Search .................. 337/5, 297, 296, 337/290, 298, 159–161, 401, 404, 405, 416, 417; 174/261; 257/209, 529, 530

[56] References Cited

U.S. PATENT DOCUMENTS

| | | | |
|---|---|---|---|
| 4,893,167 | 1/1990 | Boudou et al. | 357/51 |
| 5,420,455 | 5/1995 | Gilmour et al. | 257/529 |
| 5,451,811 | 9/1995 | Whitten et al. | 257/530 |
| 5,625,219 | 4/1997 | Takagi | 257/530 |
| 5,861,674 | 1/1999 | Ishikawa | 257/758 |

FOREIGN PATENT DOCUMENTS

| | | | |
|---|---|---|---|
| 407273199 | 10/1995 | Japan | H01L 21/82 |
| 409266249 | 10/1997 | Japan | H01L 21/768 |

*Primary Examiner*—Donald Sparks
*Assistant Examiner*—Anatoly Vortman
*Attorney, Agent, or Firm*—Young & Thompson

[57] ABSTRACT

The present invention provides a fuse structure formed in an inter-layer insulator having a first level interconnection and a second level interconnection isolated by the inter-layer insulator from the first level interconnection. The fuse structure comprises a conductive plug for providing an electrical connection between a first connecting part of the first level interconnection and a second connecting part of the second level interconnection, wherein the fuse structure further comprises at least a void which extends within the inter-layer insulator and also at least a part of the void extends adjacent to the second connecting part of the second level interconnection, so that when the second connecting part is rapidly evaporated by receiving a thermal energy, an evaporated material of the second connecting part is deposited on an inner wall of the void for causing an electrical disconnection between the first and second interconnections.

43 Claims, 27 Drawing Sheets

FUSE STRUCTURE CONNECTING FIRST LEVEL AND SECOND LEVEL INTERCONNECTIONS IN INTER-LAYER INSULATOR

BACKGROUND OF THE INVENTION

The present invention relates to an improved fuse structure connecting first level and second level interconnections in an inter-layer insulator in a semiconductor device, wherein the fuse structure is to be electrically disconnected to shift a defective circuit into a redundancy circuit upon receipt of an irradiation of a pulse laser beam.

In wafer checking processes, a chip verified as defective is required to change a defective circuit in the chip into a redundancy circuit by an irradiation of a pulse laser beam onto a fuse in the chip for electrical disconnection of the fuse. In a semiconductor device having a memory of a large capacity, redundancy bit cells are previously formed in memory cell arrays so that if a bit cell is verified as defective in checking process, then the defective bit cell is changed into a redundancy bit cell by an irradiation of a pulse laser beam onto a fuse connected to the defective bit cell for electrical disconnection of the fuse. As a result, it is possible to salvage the defective chip, thereby increasing the yield thereof.

The increase in yield of the chips is one of the most important issues to be realized particularly as the high density integration of the semiconductor devices and the scale of the chip have increased. In this circumstances, it is effective that the fuse is electrically disconnected to change the defective circuit in the chip into the redundancy circuit to relief the defective chip, thereby increasing the yield thereof.

In the past, the conventional fuse often comprises a polysilicon layer, a part of which serves as a gate electrode of a MOS field effect transistor. In recent years, however, in order to respond to the multi-level interconnection semiconductor devices, there has been proposed a fuse structure comprising a metal plug in a via hole for electrically connecting first level and second level interconnections. This technique will be disclosed with reference to FIGS. 1A, 1B, 2A and 2B. FIG. 1A is a fragmentary plan view illustrative of a first conventional fuse structure comprising a metal plug connecting first and second level interconnections in an inter-layer insulator before the fuse structure is disconnected by an irradiation of a laser beam. FIG. 1B is a fragmentary cross sectional elevation view illustrative of the first conventional fuse structure of FIG. 1A taken along an IB—IB line in FIG. 1A. FIG. 2A is a fragmentary plan view illustrative of a first conventional fuse structure comprising a metal plug connecting first and second level interconnections in an inter-layer insulator after the fuse structure was disconnected by an irradiation of a laser beam. FIG. 2B is a fragmentary cross sectional elevation view illustrative of the first conventional fuse structure of FIG. 2A taken along an IIB—IIB line in FIG. 2A.

A first level interconnection 102 extends over a first inter-layer insulator 101. A second inter-layer insulator 103 overlies the first interlayer insulator 101 and the first level interconnection 102. The second inter-layer insulator 103 has a via hole within which a metal plug 105 is filled. Namely, the metal plug 105 is buried within the second inter-layer insulator 103. The metal plug 105 is electrically connected to a first connecting part of the first level interconnection. A second level interconnection 104 extends over the second inter-layer insulator 103 so that a second connecting part of the second level interconnection 104 is positioned over the via hole, whereby the second connecting part of the second level interconnection 104 is electrically connected to the metal plug 105. As a result, the first level interconnection 102 and the second level interconnection 104 are electrically connected through the metal plug 105 to each other. The first level interconnection 102 and the second level interconnection 104 extend in anti-parallel directions, that is, parallel but oppositely directed. The first level interconnection 102 and the second level interconnection 104 have the same longitudinal direction. A first longitudinal axis of the first level interconnection 102 is aligned with a second longitudinal axis of the second level interconnection 104 in a plan view. The second connecting part of the second level interconnection 104 overlaps the first connecting part of the first level interconnection 102 in the plan view. A third inter-layer insulator 107 overlies the second inter-layer insulator 103 and the second level interconnection 104, whereby the second level interconnection 4 is buried in the third level interconnection 107. A passivation film 109 extends over the third inter-layer insulator 107.

A recess 108 is formed over the second connecting part of the second level interconnection 104, wherein the recess 108 extends through the passivation film 109 and into the upper region of the third inter-layer insulator 107 so that the bottom of the recess 108 is separated by a thin wall of the third inter-layer insulator 107 from the second connecting part of the second level interconnection 104. The plan size of the recess 108 is sufficiently larger than the second connecting part of the second level interconnection 104.

The first level interconnection 102 and the second level interconnection 104 are connected to circuits for selecting a redundancy circuit, so that, upon electrical disconnection between the first level interconnection 102 and the second level interconnection 104, the defective circuit comes non-selected whilst the redundancy circuit comes selected. The electrical disconnection between the first level interconnection 102 and the second level interconnection 104 may be obtained by irradiation of a pulse laser beam toward the second connecting part of the second level interconnection 104 as a target in order to cause a rapid and explosive evaporation of the second connecting part of the second level interconnection 104.

With reference to FIGS. 2A and 2B, a pulse laser beam is irradiated toward the second connecting part of the second level interconnection 104 as a target so that the pulse laser beam penetrates through the recess 108 and the third inter-layer insulator 107 to be irradiated onto the second connecting part of the second level interconnection 104, where the pulse laser beam is absorbed by the second connecting part of the second level interconnection 104. Namely, the second connecting part of the second level interconnection 104 receives a large thermal energy, so that the second connecting part of the second level interconnection 104 shows a rapid and explosive evaporation, whereby the thin walls of the third inter-layer insulator 107 between the second connecting part of the second level interconnection 104 and the recess 108 are broken by the above explosive evaporation of the second connecting part of the second level interconnection 104. As a result of the explosive evaporation of the second connecting part of the second level interconnection 104, the explosively evaporated material such as aluminum of the second connecting part of the second level interconnection 104 is explosively blown through the broken thin wall up to the recess 108, whereby the evaporated material is then deposited on side walls of a hole over the metal plug 105 formed by the explosive evaporation. As a result, the metal plug 105 is electrically disconnected from the second level interconnection 104 missing the second connecting part. Therefore, the second level interconnection 104 is electrically disconnected from the first level interconnection 102. Upon electrical disconnection between the first level interconnection 102 and the second level interconnection 104, the defective circuit comes non-selected whilst the redundancy circuit comes selected.

The existence of the recess 108 over the second connecting part of the second level interconnection 104 but separated by the thin wall of the third inter-layer insulator 107 from the second connecting part of the second level interconnection 104 allows that, upon irradiation of the pulse laser beam toward the second connecting part of the second level interconnection 104, the second connecting part of the second level interconnection 104 is explosively evaporated and then the evaporated material of the second connecting part of the second level interconnection 104 is explosively blown through the broken thin wall of the third inter-layer insulator 107 up to the recess 108 before the evaporated material is deposited onto the side walls of the hole made by explosive evaporation, whilst substantially no evaporated material of the second connecting part of the second level interconnection 104 resides over the metal plug 105, resulting in a certain electrical disconnection between the second level interconnection 104 is electrically disconnected from the first level interconnection 102.

The above first conventional fuse structure has the following disadvantages. Each of the first inter-layer insulator 101, the second inter-layer insulator 103, and the third inter-layer insulator 107 is made by both a high density plasma enhanced chemical vapor deposition and subsequent chemical mechanical polishing method to form a planar surface thereof, in order to obtain a global planarization in a short time period. Further, in order to reduce the parasitic capacitance between the first level and second level interconnections 102 and 104, each of the first inter-layer insulator 101, the second inter-layer insulator 103, and the third inter-layer insulator 107 is made of fluorine containing silicon oxide having a low dielectric constant but a high hygroscopicity. The absence of the passivation film 109 having relatively low hygroscopicity over the second connecting part of the second level interconnection 104 allows a substantive permeation of moisture into the third inter-layer insulator 107 shown through the recess 108, whereby the second level interconnection 104, the metal plug 105 and the first level interconnection 102 are exposed to the permeation of the moisture, whereby the second level interconnection 104, the metal plug 105 and the first level interconnection 102 may show erosion due to the moisture permeation.

In order to settle the above problem with moisture permeation through the recess, a second conventional fuse structure has also been proposed, which will be described with reference to FIGS. 3A, 3B, 4A and 4B. FIG. 3A is a fragmentary plan view illustrative of a second conventional fuse structure comprising a metal plug connecting first and second level interconnections in an inter-layer insulator before the fuse structure is disconnected by an irradiation of a laser beam. FIG. 3B is a fragmentary cross sectional elevation view illustrative of the second conventional fuse structure of FIG. 3A taken along an IIIB—IIIB line in FIG. 3A. FIG. 4A is a fragmentary plan view illustrative of a second conventional fuse structure comprising a metal plug connecting first and second level interconnections in an inter-layer insulator after the fuse structure was disconnected by an irradiation of a laser beam. FIG. 4B is a fragmentary cross sectional elevation view illustrative of the second conventional fuse structure of FIG. 4A taken along an IVB—IVB line in FIG. 4A.

A first level interconnection 102 extends over a first inter-layer insulator 101. A second inter-layer insulator 103 overlies the first inter-layer insulator 101 and the first level interconnection 102. The second inter-layer insulator 103 has a via hole within which a metal plug 105 is filled. Namely, the metal plug 105 is buried within the second inter-layer insulator 103. The metal plug 105 is electrically connected to a first connecting part of the first level interconnection. A second level interconnection 104 extends over the second inter-layer insulator 103 so that a second connecting part of the second level interconnection 104 is positioned over the via hole, whereby the second connecting part of the second level interconnection 104 is electrically connected to the metal plug 105. As a result, the first level interconnection 102 and the second level interconnection 104 are electrically connected through the metal plug 105 to each other. The first level interconnection 102 and the second level interconnection 104 extend in anti-parallel directions. The first level interconnection 102 and the second level interconnection 104 have the same longitudinal direction. A first longitudinal axis of the first level interconnection 102 is aligned with a second longitudinal axis of the second level interconnection 104 in a plan view. The second connecting part of the second level interconnection 104 overlaps the first connecting part of the first level interconnection 102 in the plan view. A third inter-layer insulator 107 overlies the second inter-layer insulator 103 and the second level interconnection 104, whereby the second level interconnection 104 is buried in the third level interconnection 107. A passivation film 109 extends over an entire surface of the third inter-layer insulator 107.

In order to settle the above problem with the moisture permeation, no recess is formed over the second connecting part of the second level interconnection 104.

The first level interconnection 102 and the second level interconnection 104 are connected to circuits for selecting a redundancy circuit, so that, upon electrical disconnection between the first level interconnection 102 and the second level interconnection 104, the defective circuit becomes non-selected whilst the redundancy circuit is selected. The electrical disconnection between the first level interconnection 102 and the second level interconnection 104 may be obtained by irradiation of a pulse laser beam toward the second connecting part of the second level interconnection 104 as a target in order to cause a rapid and explosive evaporation of the second connecting part of the second level interconnection 104.

With reference to FIGS. 4A and 4B, a pulse laser beam is irradiated toward the second connecting part of the second level interconnection 104 as a target so that the pulse laser beam penetrates through the passivation film 109 and the third inter-layer insulator 107 to be irradiated onto the second connecting part of the second level interconnection 104, where the pulse laser beam is absorbed by the second connecting part of the second level interconnection 104. Namely, the second connecting part of the second level interconnection 104 receives a large thermal energy, so that the second connecting part of the second level interconnection 104 shows a rapid and explosive evaporation. Since, however, no recess is formed over the second connecting part of the second level interconnection 104, the explosively evaporated material such as aluminum of the second connecting part of the second level interconnection 104 is confined within the space of the second connecting part of the second level interconnection 104, whereby the evaporated material is then deposited on inner walls of the space of the second connecting part of the second level interconnection 104 to reside on the metal plug 105. As a result, the metal plug 105 remains electrically connected through the deposited metal material to the second level interconnection 104 even missing the second connecting part. Therefore, the second level interconnection 104 remains electrically connected from the first level interconnection 102.

In the above circumstances, it had been required to develop a novel fuse structure comprising a metal plug connecting first level and second level interconnections in an inter-layer insulator free from the above problems.

SUMMARY OF THE INVENTION

Accordingly, it is an object of the present invention to provide a novel fuse structure comprising a metal plug connecting first level and second level interconnections in an inter-layer insulator free from the above problems.

It is a further object of the present invention to provide a novel fuse structure comprising a metal plug connecting first level and second level interconnections in an inter-layer insulator capable of a certain electrical disconnection by a rapid and explosive evaporation of a second connecting part of the second level interconnection upon receipt of a pulse laser beam irradiation.

It is a still further object of the present invention to provide a novel fuse structure comprising a metal plug connecting first level and second level interconnections in an inter-layer insulator free from moisture permeation.

It is yet a further object of the present invention to provide a novel fuse structure comprising a metal plug connecting first level and second level interconnections in an inter-layer insulator capable of obtaining a global planarization.

It is a further object of the present invention to provide a novel fuse structure comprising a metal plug connecting first level and second level interconnections in an inter-layer insulator reducing parasitic capacitance between the first level and second level interconnections.

The present invention provides a fuse structure formed in an inter-layer insulator having a first level interconnection and a second level interconnection isolated by the inter-layer insulator from the first level interconnection. The fuse structure comprises a conductive plug for providing an electrical connection between a first connecting part of the first level interconnection and a second connecting part of the second level interconnection, wherein the fuse structure further comprises at least a void which extends within the inter-layer insulator and also at least a part of the void extends adjacent to the second connecting part of the second level interconnection, so that when the second connecting part is rapidly evaporated by receiving sufficient thermal energy, evaporated material of the second connecting part is deposited on an inner wall of the void causing an electrical disconnection between the first and second interconnections.

The above and other objects, features and advantages of the present invention will be apparent from the following descriptions.

BRIEF DESCRIPTION OF THE DRAWINGS

Preferred embodiments according to the present invention will be described in detail with reference to the accompanying drawings.

Figure 7A:
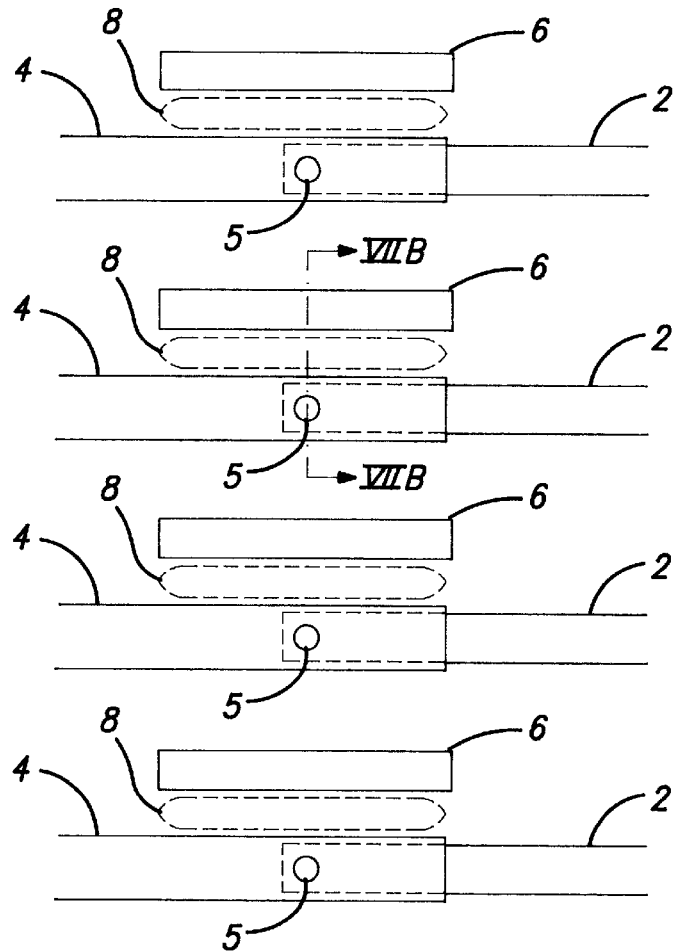
FIG. 7A is a fragmentary plan view illustrative of an alignment of plural fuse structures, each of which comprises a metal plug connecting first and second level interconnections in an inter-layer insulator and a single void extending at the same level as the second level interconnection and along a predetermined one side of the second level interconnection before selected ones of the fuse structures are disconnected by irradiation of laser beams in a second embodiment in accordance with the present invention.

7A taken along an VIIB—VIIB line in FIG. 7A in a second embodiment in accordance with the present invention.

Figure 8A:
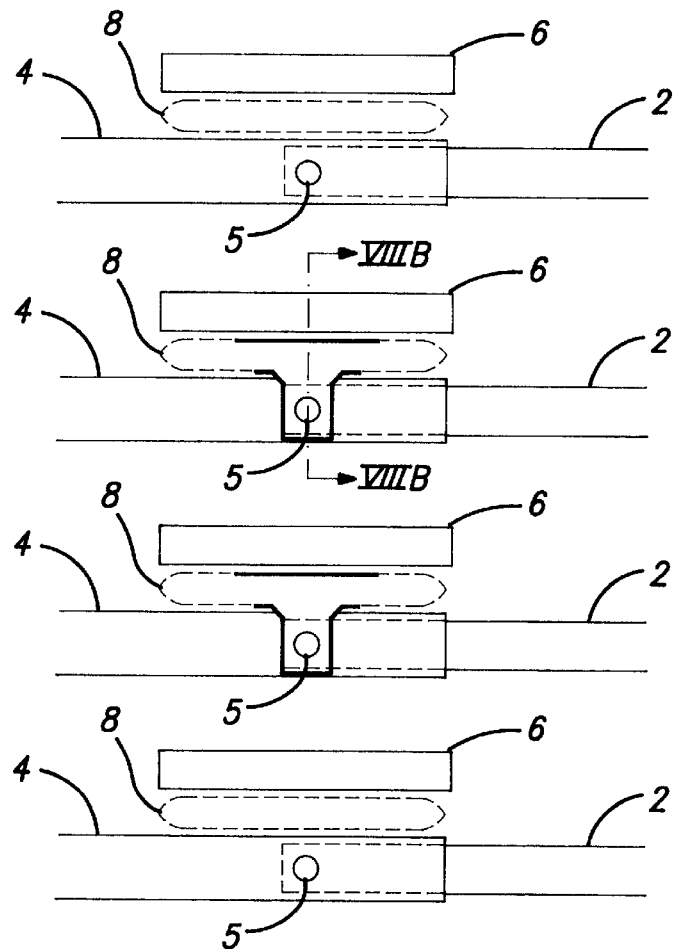

FIG. 8A is a fragmentary plan view illustrative of an alignment of plural fuse structures, each of which comprises a metal plug connecting first and second level interconnections in an inter-layer insulator and a single void extending at the same level as the second level interconnection and along a predetermined one side of the second level interconnection after selected ones of the fuse structures were disconnected by irradiation of laser beams in a second embodiment in accordance with the present invention.

Figure 8B:
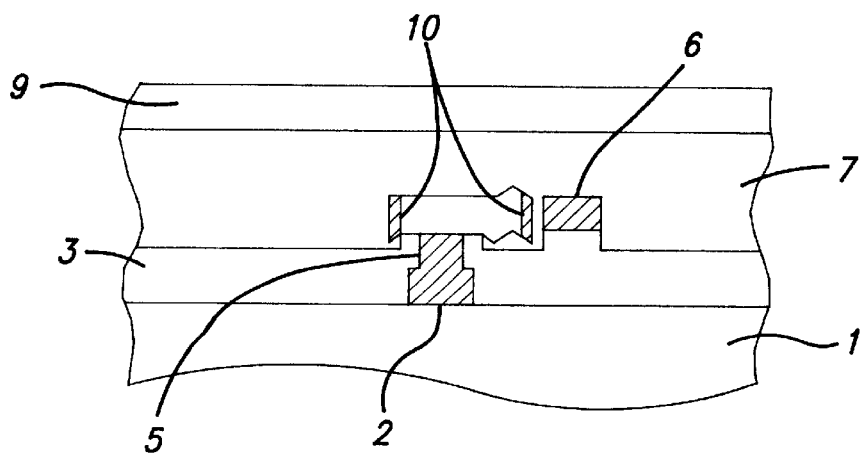

FIG. 8B is a fragmentary cross sectional elevation view illustrative of selected one of the fuse structures of FIG. 8A taken along an VIIIB—VIIIB line in FIG. 8A in a second embodiment in accordance with the present invention.

Figure 9A:
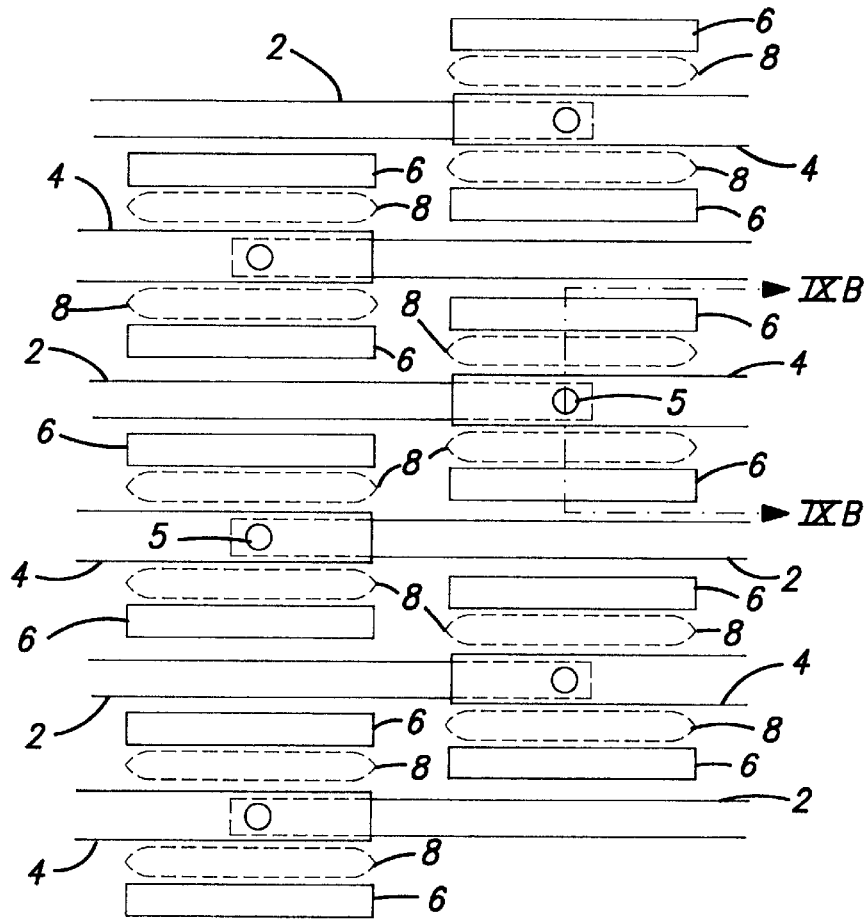

FIG. 9A is a fragmentary plan view illustrative of an array of fuse structures, each of which comprises a metal plug connecting first and second level interconnections in an inter-layer insulator and voids extending at the same level as the second level interconnection and along opposite sides of the second level interconnection before selected ones of the fuse structures in arrays are disconnected by an irradiation of laser beams in a third embodiment in accordance with the present invention.

Figure 9B:
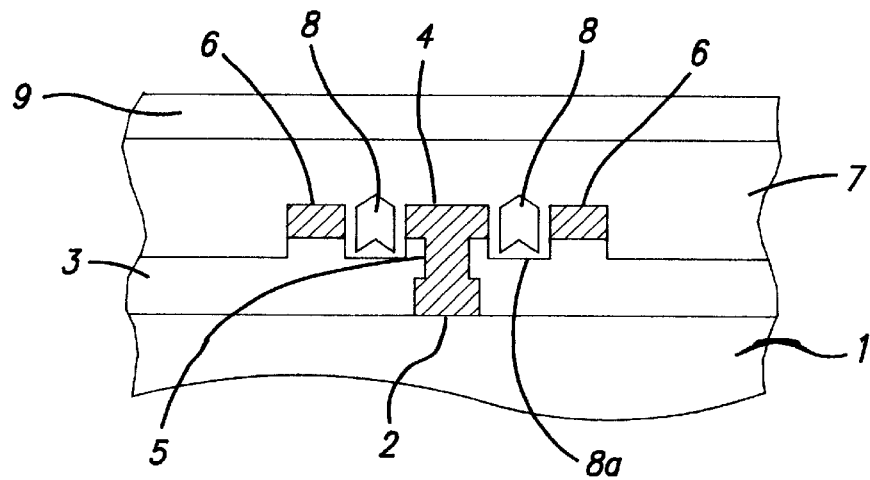

FIG. 9B is a fragmentary cross sectional elevation view illustrative of selected one of the fuse structures to be electrically disconnected of FIG. 9A taken along an IXB—IXB line in FIG. 9A in a third embodiment in accordance with the present invention.

Figure 10A:
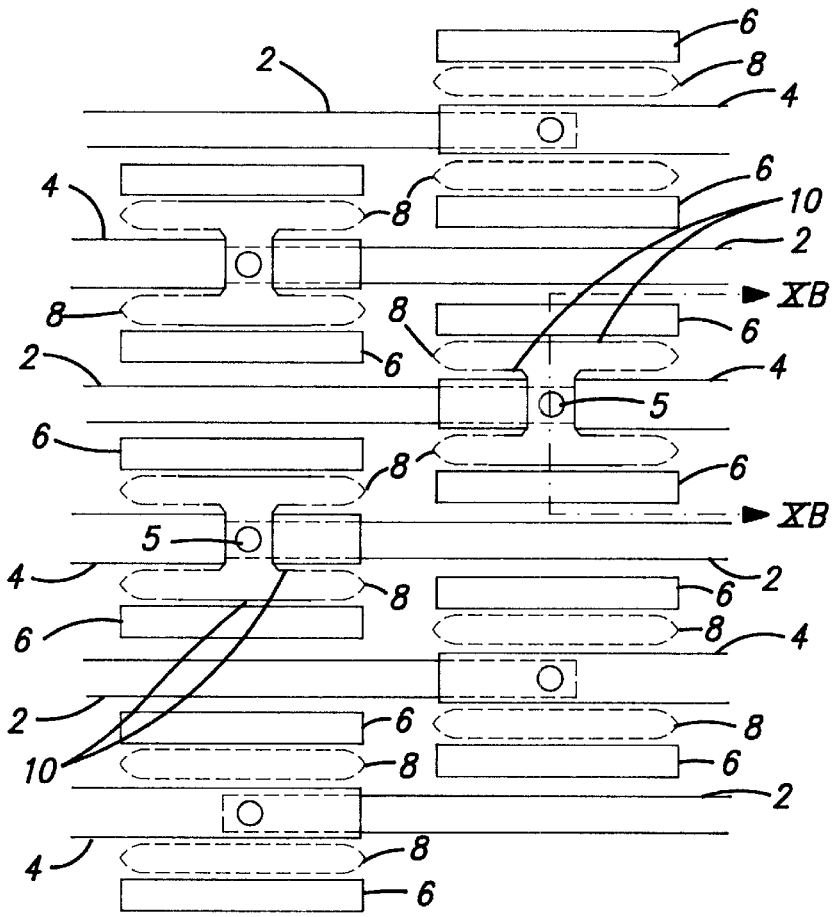

FIG. 10A is a fragmentary plan view illustrative of an array of fuse structures, each of which comprises a metal plug connecting first and second level interconnections in an inter-layer insulator and voids extending at the same level as the second level interconnection and along opposite sides of the second level interconnection after selected ones of the fuse structures in the array were disconnected by an irradiation of laser beams in a third embodiment in accordance with the present invention.

Figure 10B:
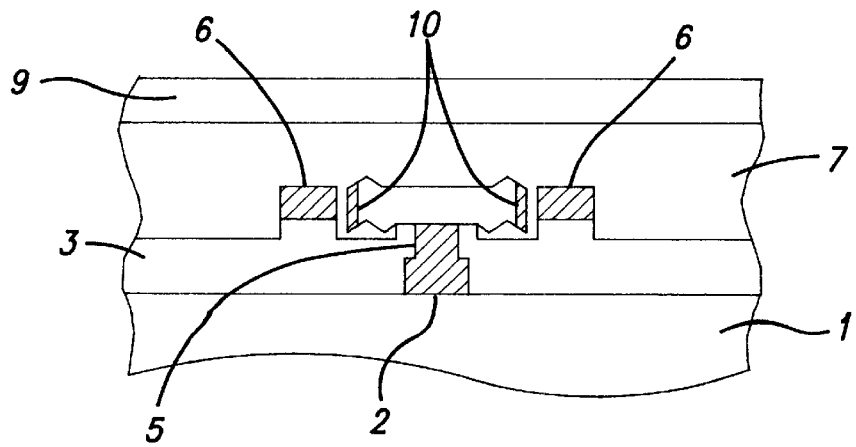

FIG. 10B is a fragmentary cross sectional elevation view illustrative of selected one of the fuse structures electrically disconnected of FIG. 10A taken along an XB—XB line in FIG. 10A in a third embodiment in accordance with the present invention.

Figure 11A:
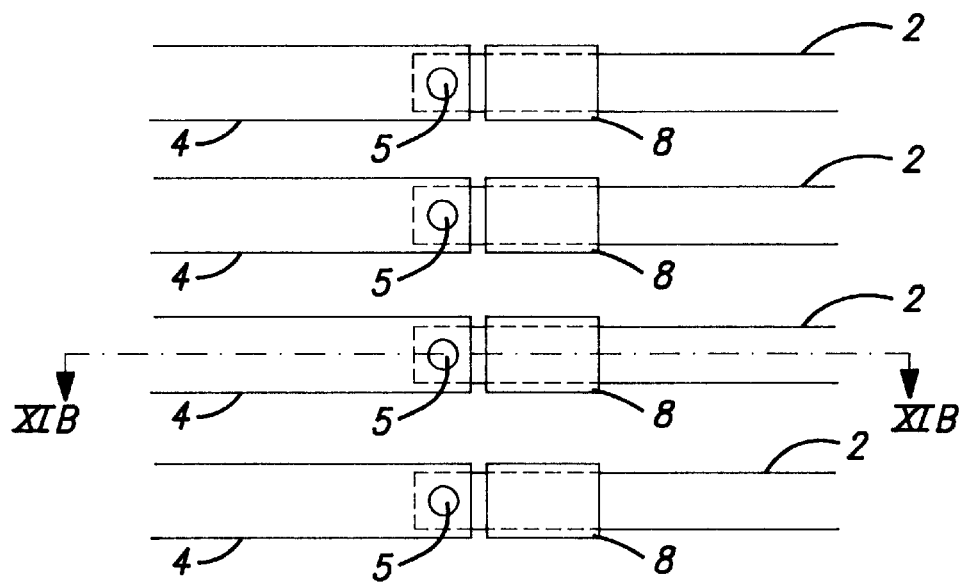

FIG. 11A is a fragmentary plan view illustrative of an alignment of plural fuse structures, each of which comprises a metal plug connecting first and second level interconnections in an inter-layer insulator and a single void extending at the same level as the second level interconnection and on an extending longitudinal center line of the second level interconnection before selected ones of the fuse structures are disconnected by irradiation of laser beams in a fourth embodiment in accordance with the present invention.

Figure 11B:
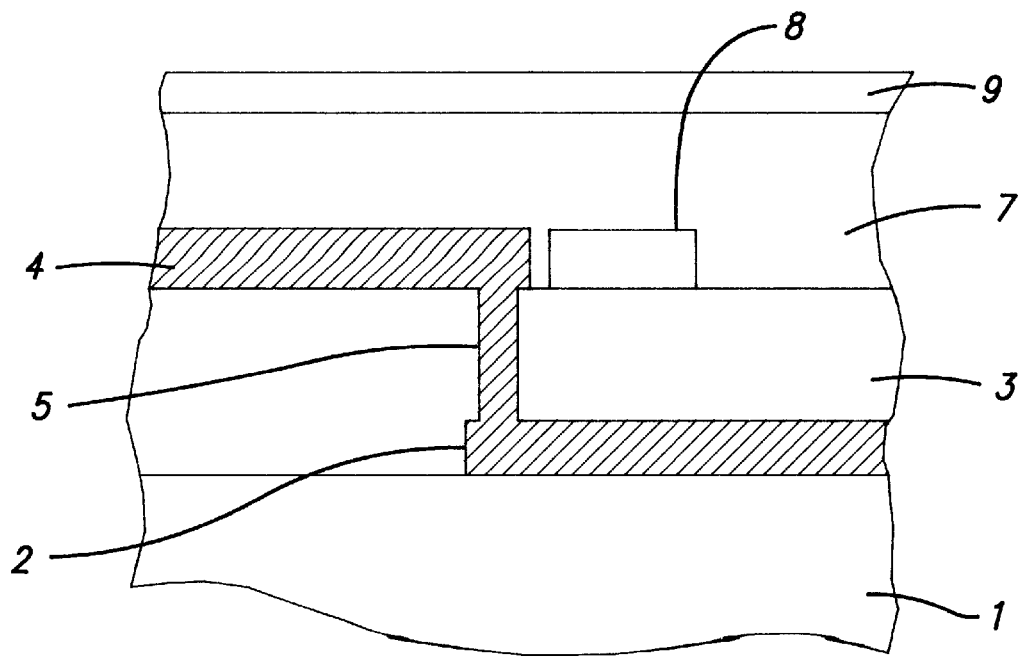

FIG. 11B is a fragmentary cross sectional elevation view illustrative of individual one of the fuse structures of FIG. 11A taken along a XIB—XIB line in FIG. 11A in a fourth embodiment in accordance with the present invention.

Figure 12A:
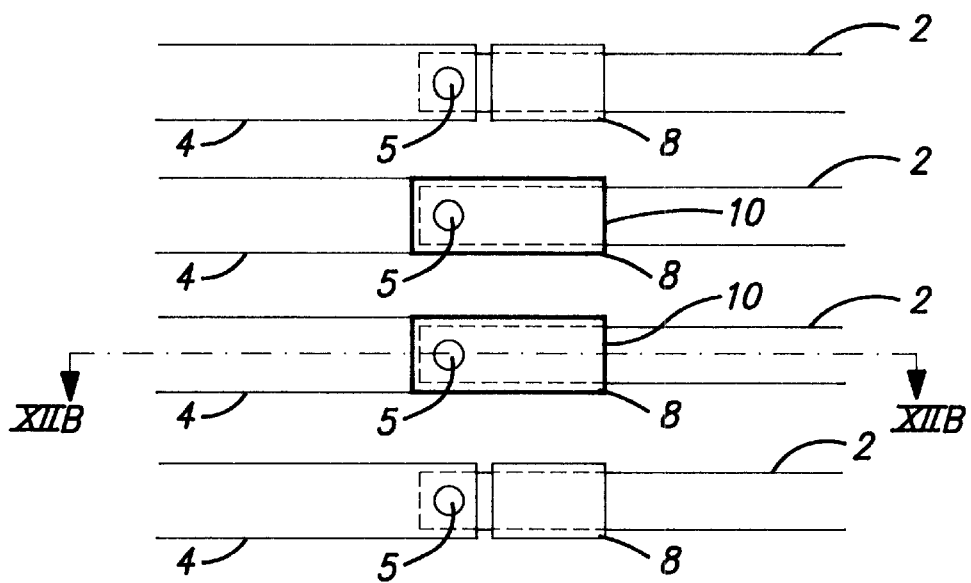

FIG. 12A is a fragmentary plan view illustrative of an alignment of plural fuse structures, each of which comprises a metal plug connecting first and second level interconnections in an inter-layer insulator and a single void extending at the same level as the second level interconnection and on an extending longitudinal center line of the second level interconnection after selected ones of the fuse structures were disconnected by irradiation of laser beams in a fourth embodiment in accordance with the present invention.

Figure 12B:
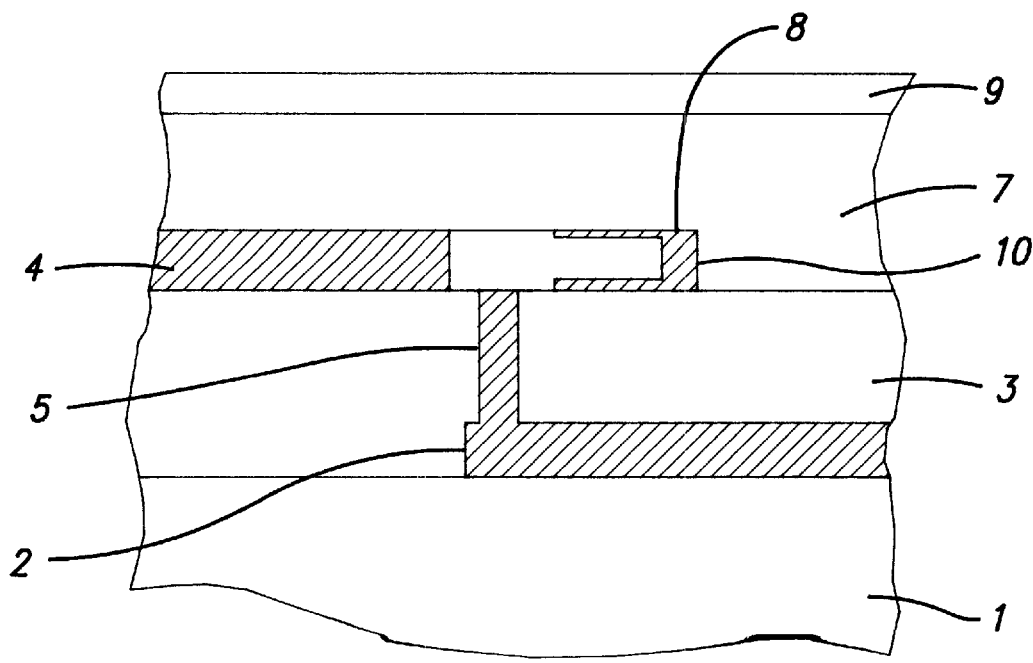

FIG. 12B is a fragmentary cross sectional elevation view illustrative of selected one of the fuse structures of FIG. 12A taken along a XIIB—XIIB line in FIG. 12A in a fourth embodiment in accordance with the present invention.

Figure 13A:
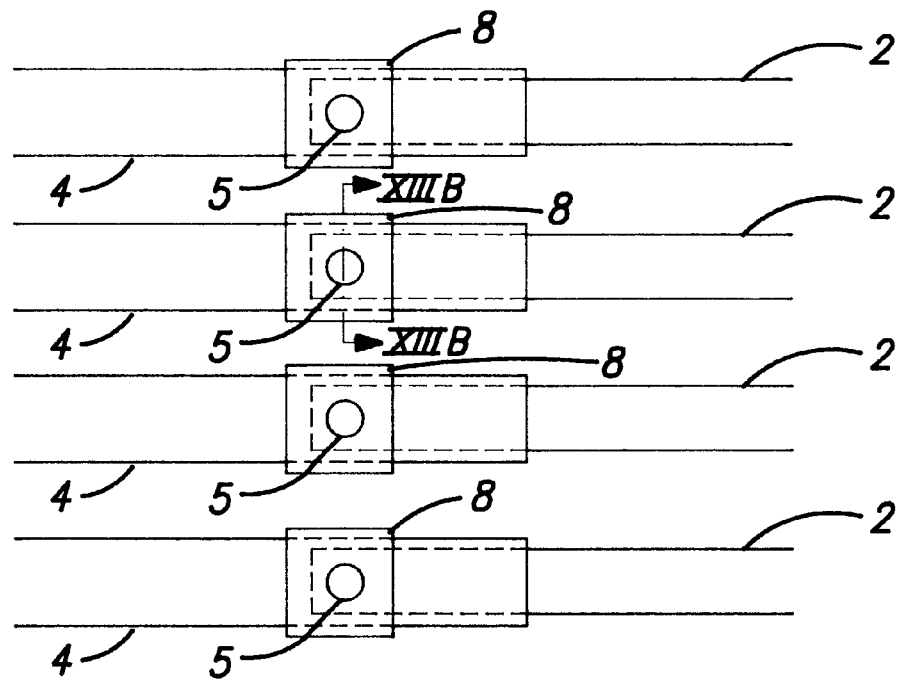

FIG. 13A is a fragmentary plan view illustrative of an alignment of plural fuse structures, each of which comprises a metal plug connecting first and second level interconnections in an inter-layer insulator and a single void extending at a higher level than the second level interconnection and over the second connecting part of the second level interconnection before selected ones of the fuse structures are disconnected by irradiation of laser beams in a fifth embodiment in accordance with the present invention.

Figure 13B:
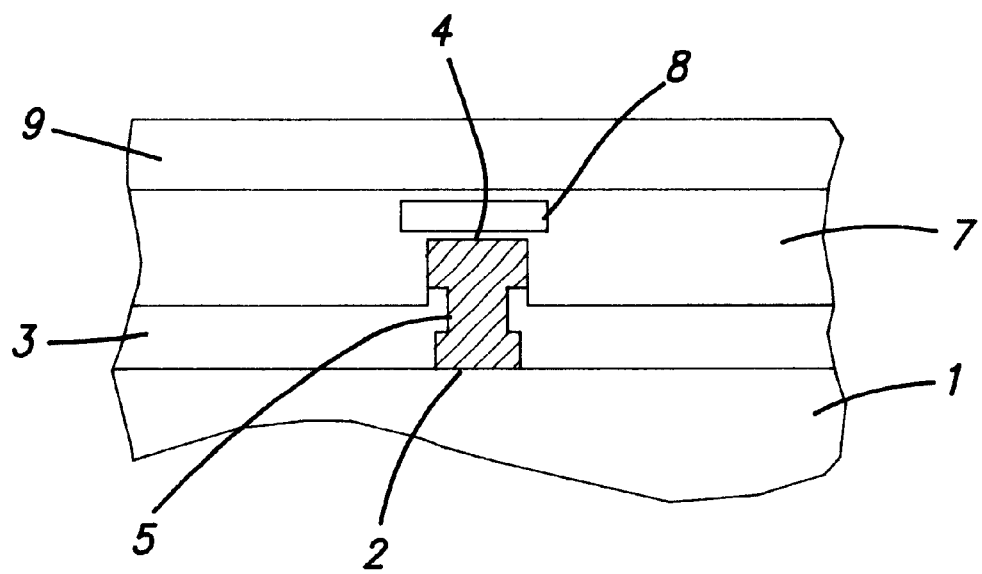

FIG. 13B is a fragmentary cross sectional elevation view illustrative of individual one of the fuse structures of FIG. 13A taken along an XIIIB—XIIIB line in FIG. 13A in a fifth embodiment in accordance with the present invention.

Figure 14A:
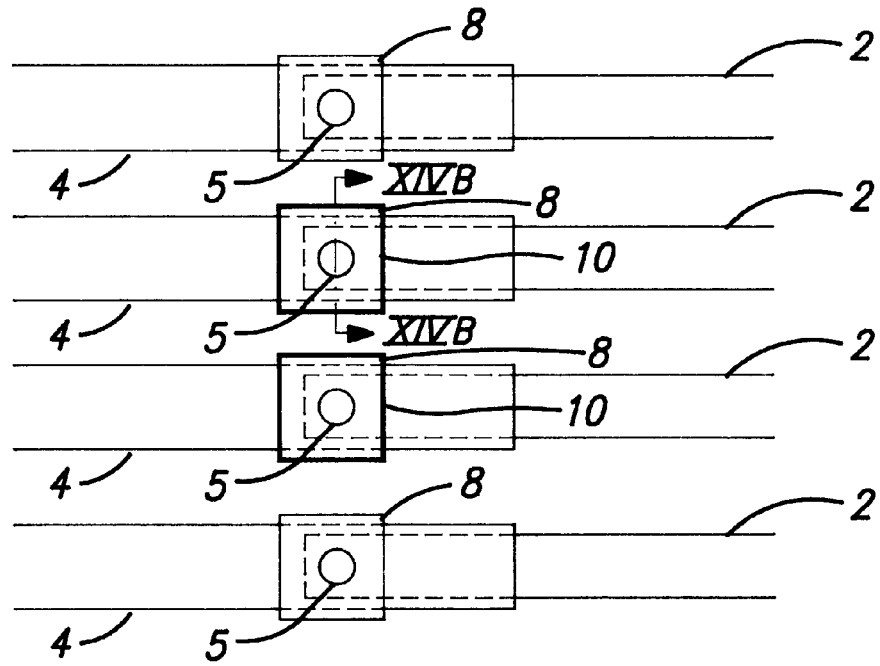

FIG. 14A is a fragmentary plan view illustrative of an alignment of plural fuse structures, each of which comprises a metal plug connecting first and second level interconnections in an inter-layer insulator and a single void extending at a higher level than the second level interconnection and over the second connecting part of the second level interconnection after selected ones of the fuse structures were disconnected by irradiation of laser beams in a fifth embodiment in accordance with the present invention.

Figure 14B:
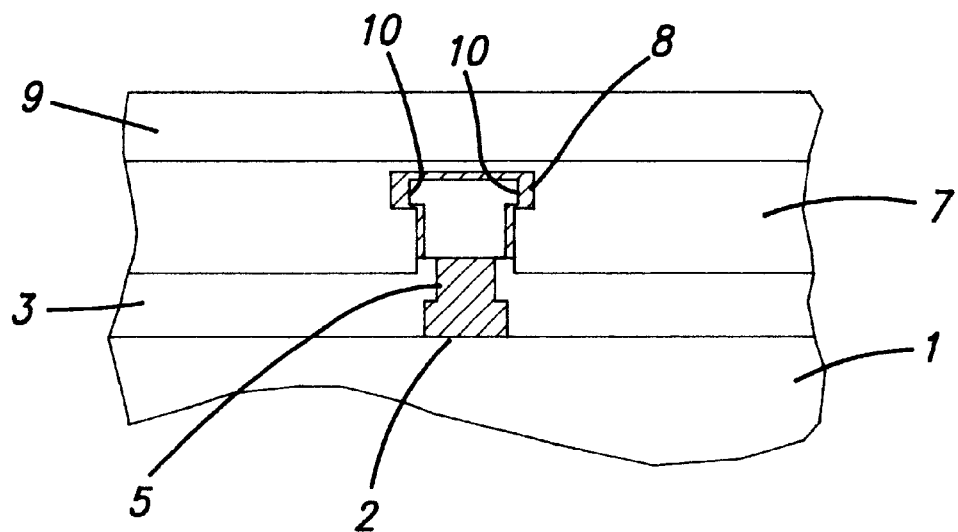

FIG. 14B is a fragmentary cross sectional elevation view illustrative of selected one of the fuse structures of FIG. 14A taken along an XIVB—XIVB line in FIG. 14A in a fifth embodiment in accordance with the present invention.

Figure 15A:
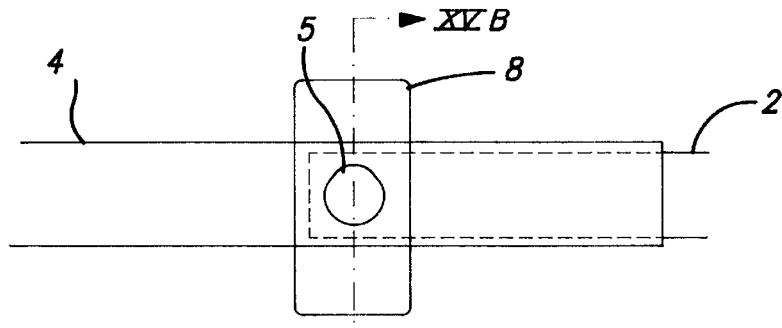

FIG. 15A is a fragmentary plan view illustrative of a fuse structure comprising a metal plug connecting first and second level interconnections in an inter-layer insulator and a single vertically extending U-shaped void extending from the same level as up to a higher level than the second level interconnection and over and opposite sides of the second connecting part of the second level interconnection before selected ones of the fuse structures are disconnected by irradiation of laser beams in a sixth embodiment in accordance with the present invention.

Figure 15B:
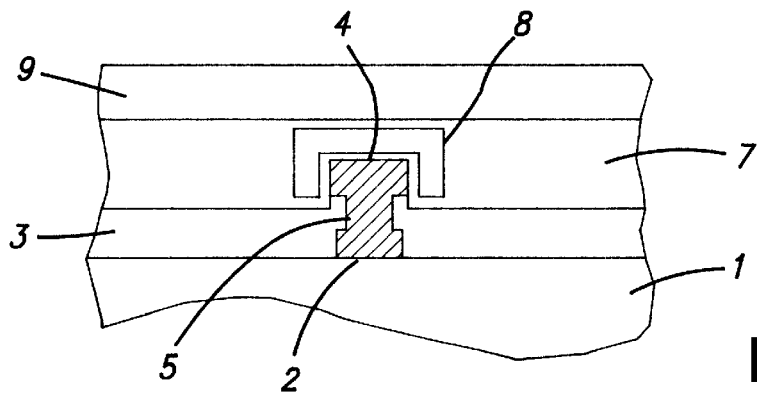

FIG. 15B is a fragmentary cross sectional elevation view illustrative of individual one of the fuse structures of FIG. 15A taken along an XVB—XVB line in FIG. 15A in a sixth embodiment in accordance with the present invention.

Figure 16A:
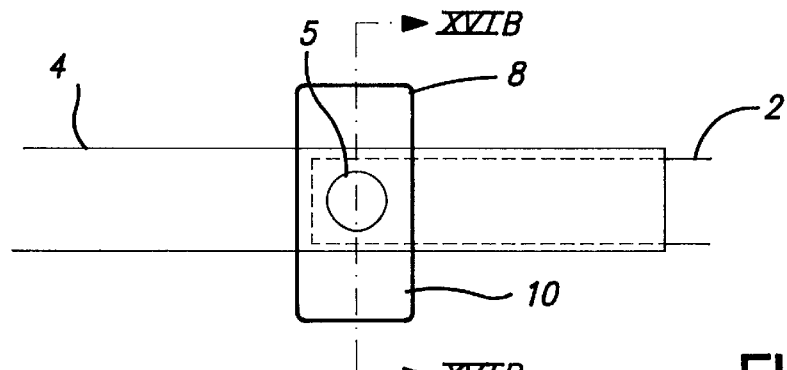

FIG. 16A is a fragmentary plan view illustrative of a fuse structure comprising a metal plug connecting first and second level interconnections in an inter-layer insulator and a single vertically extending U-shaped void extending from the same level as up to a higher level than the second level interconnection the over and opposite sides of the second connecting part of the second level interconnection after selected ones of the fuse structures were disconnected by irradiation of laser beams in a sixth embodiment in accordance with the present invention.

Figure 16B:
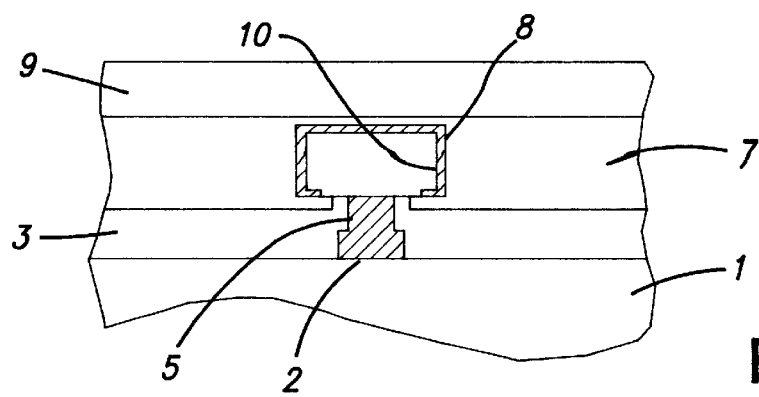

FIG. 16B is a fragmentary cross sectional elevation view illustrative of selected one of the fuse structures of FIG. 16A taken along an XVIB—XVIB line in FIG. 16A in a sixth embodiment in accordance with the present invention.

Figure 17A:
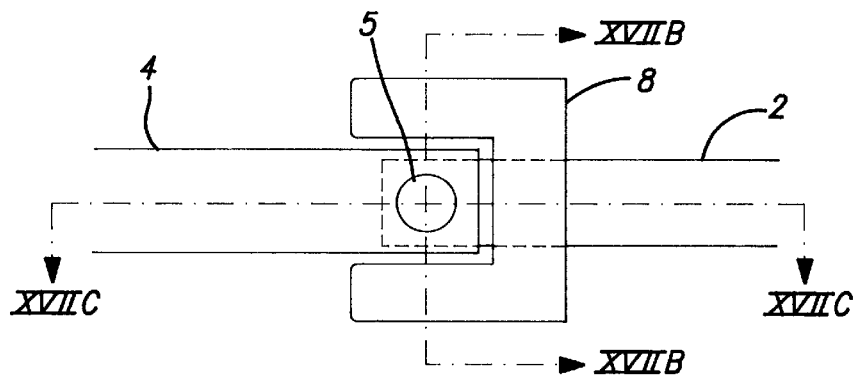

FIG. 17A is a fragmentary plan view illustrative of a fuse structure comprising a metal plug connecting first and second level interconnections in an inter-layer insulator and a single horizontally extending U-shaped void extending at the same level as the second level interconnection at one end and on opposite sides of the second connecting part of the second level interconnection before selected ones of the fuse structures are disconnected by irradiation of laser beams in a seventh embodiment in accordance with the present invention.

Figure 17B:
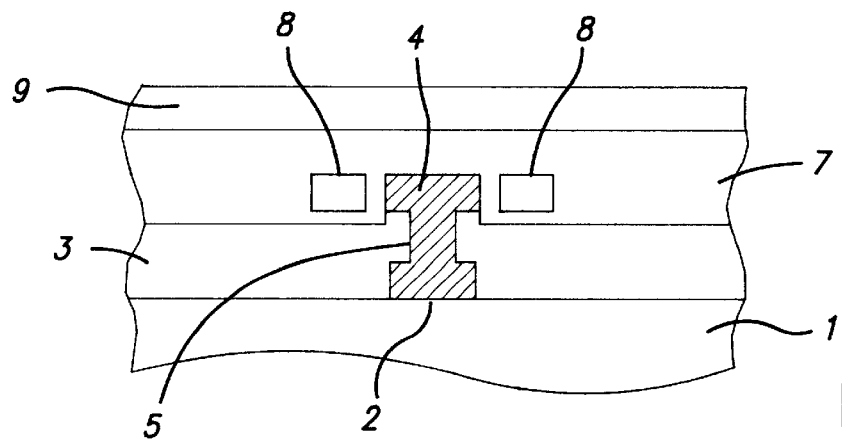

FIG. 17B is a fragmentary cross sectional elevation view illustrative of individual one of the fuse structures of FIG. 17A taken along an XVIIB—XVIIB line in FIG. 17A in a seventh embodiment in accordance with the present invention.

Figure 17C:
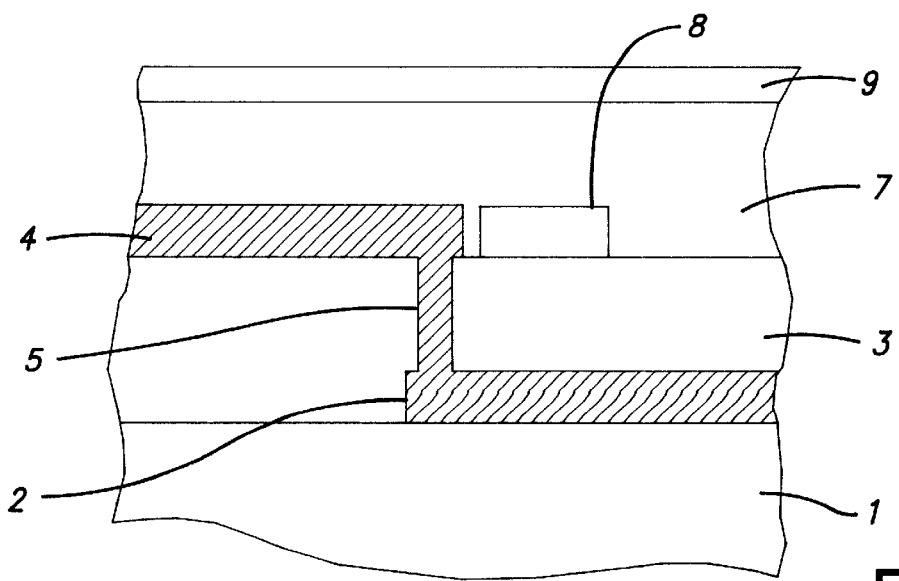

FIG. 17C is a fragmentary cross sectional elevation view illustrative of individual one of the fuse structures of FIG. 17A taken along a XVIIC—XVIIC line in FIG. 17A in a seventh embodiment in accordance with the present invention.

Figure 18A:
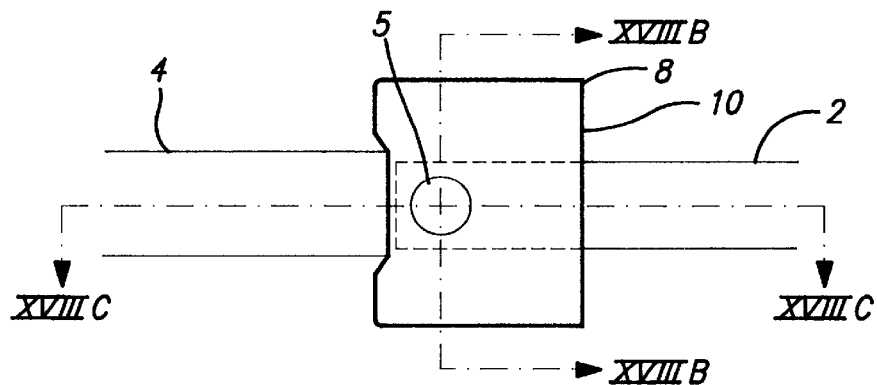

FIG. 18A is a fragmentary plan view illustrative of a fuse structure comprising a metal plug connecting first and second level interconnections in an inter-layer insulator and a single horizontally extending U-shaped void extending at the same level as the second level interconnection at one end and on opposite sides of the second connecting part of the second level interconnection after selected ones of the fuse structures were disconnected by irradiation of laser beams in a seventh embodiment in accordance with the present invention.

Figure 18B:
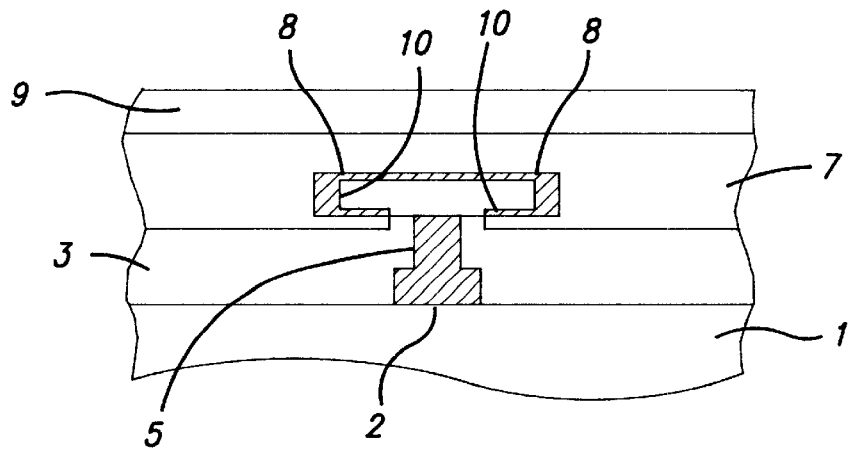

FIG. 18B is a fragmentary cross sectional elevation view illustrative of selected one of the fuse structures of FIG. 18A taken along an XVIIIB—XVIIIB line in FIG. 18A in a seventh embodiment in accordance with the present invention.

Figure 18C:
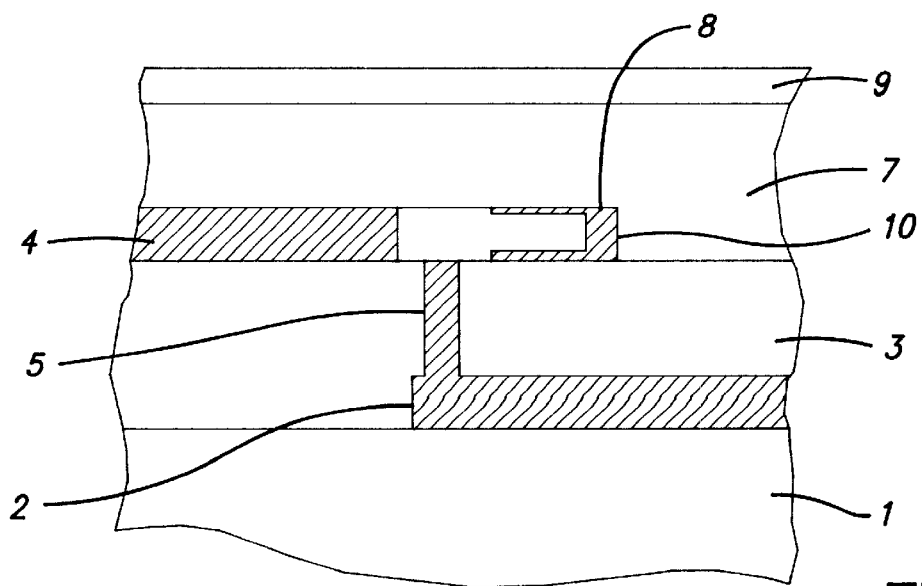

FIG. 18C is a fragmentary cross sectional elevation view illustrative of selected one of the fuse structures of FIG. 18A taken along a XVIIIC—XVIIIC line in FIG. 18A in a seventh embodiment in accordance with the present invention.

Figure 19A:
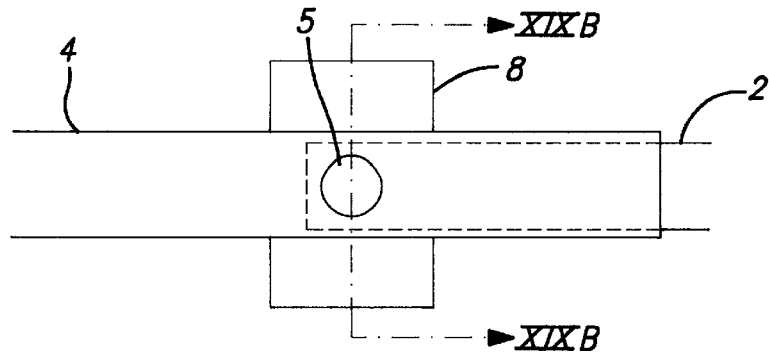

FIG. 19A is a fragmentary plan view illustrative of a fuse structure comprising a metal plug connecting first and second level interconnections in an inter-layer insulator and voids extending at the same level as the second level interconnection and along opposite sides of the second level interconnection before the fuse structure is disconnected by an irradiation of a laser beam in an eighth embodiment in accordance with the present invention.

Figure 19B:
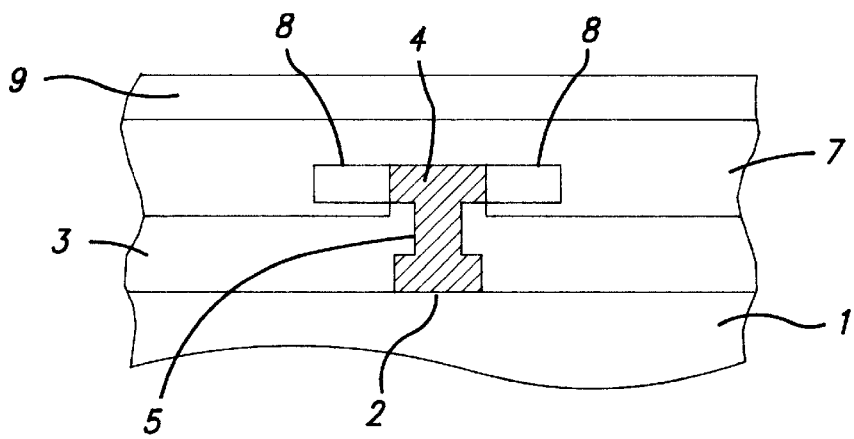

FIG. 19B is a fragmentary cross sectional elevation view illustrative of the fuse structure of FIG. 19A taken along an XIXB—XIXB line in FIG. 19A in an eighth embodiment in accordance with the present invention.

Figure 20A:
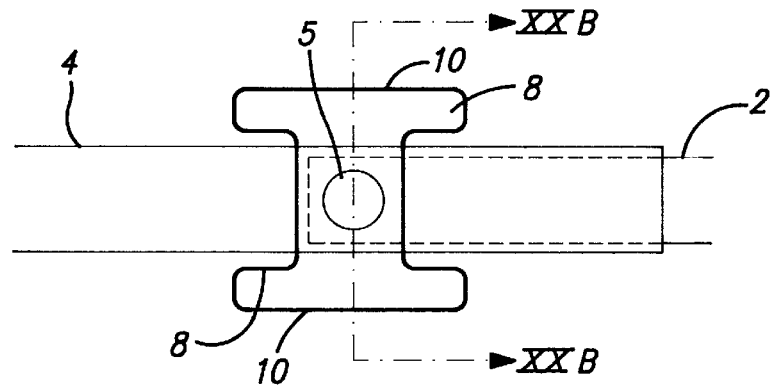

FIG. 20A is a fragmentary plan view illustrative of a fuse structure comprising a metal plug connecting first and second level interconnections in an inter-layer insulator and voids extending at the same level as the second level interconnection and along opposite sides of the second level interconnection after the fuse structure was disconnected by an irradiation of a laser beam in an eighth embodiment in accordance with the present invention.

Figure 20B:
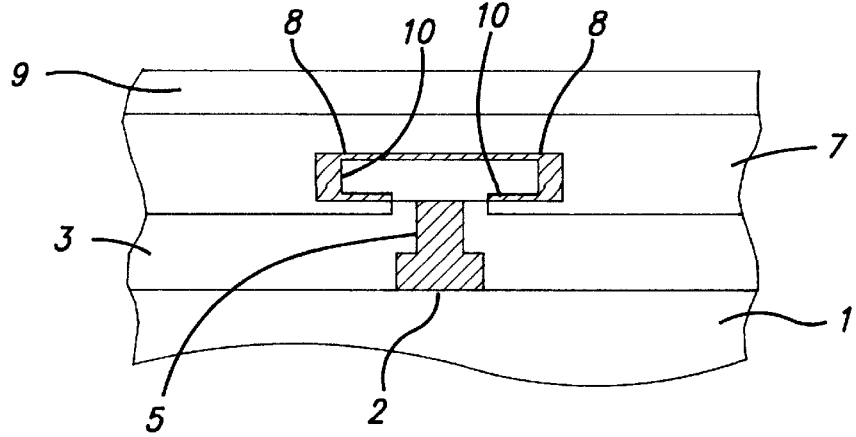

FIG. 20B is a fragmentary cross sectional elevation view illustrative of the fuse structure of FIG. 20A taken along an XXB—XXB line in FIG. 20A in an eighth embodiment in accordance with the present invention.

Figure 21A:
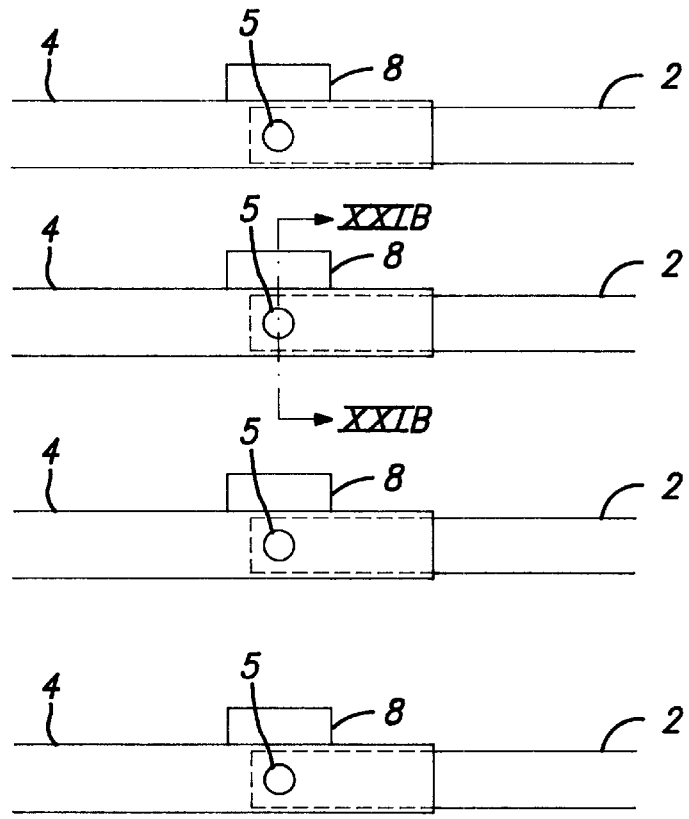

FIG. 21A is a fragmentary plan view illustrative of an alignment of plural fuse structures, each of which comprises a metal plug connecting first and second level interconnections in an inter-layer insulator and a single void extending at the same level as the second level interconnection and along a predetermined one side of the second level interconnection before selected ones of the fuse structures are disconnected by irradiation of laser beams in a ninth embodiment in accordance with the present invention.

Figure 21B:
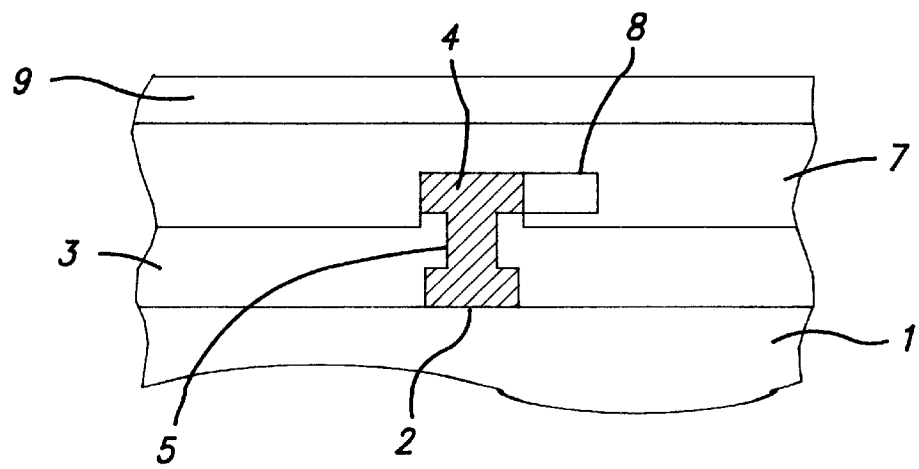

FIG. 21B is a fragmentary cross sectional elevation view illustrative of individual one of the fuse structures of FIG. 21A taken along an XXIB—XXIB line in FIG. 21A in a ninth embodiment in accordance with the present invention.

Figure 22A:
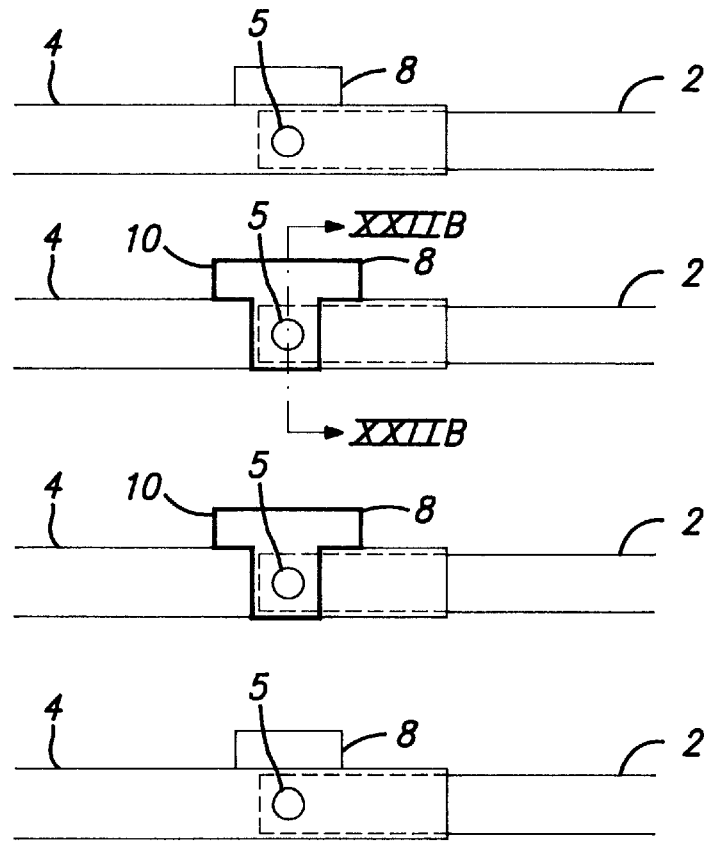

FIG. 22A is a fragmentary plan view illustrative of an alignment of plural fuse structures, each of which comprises a metal plug connecting first and second level interconnections in an inter-layer insulator and a single void extending at the same level as the second level interconnection and along a predetermined one side of the second level interconnection after selected ones of the fuse structures were disconnected by irradiation of laser beams in a ninth embodiment in accordance with the present invention.

Figure 22B:
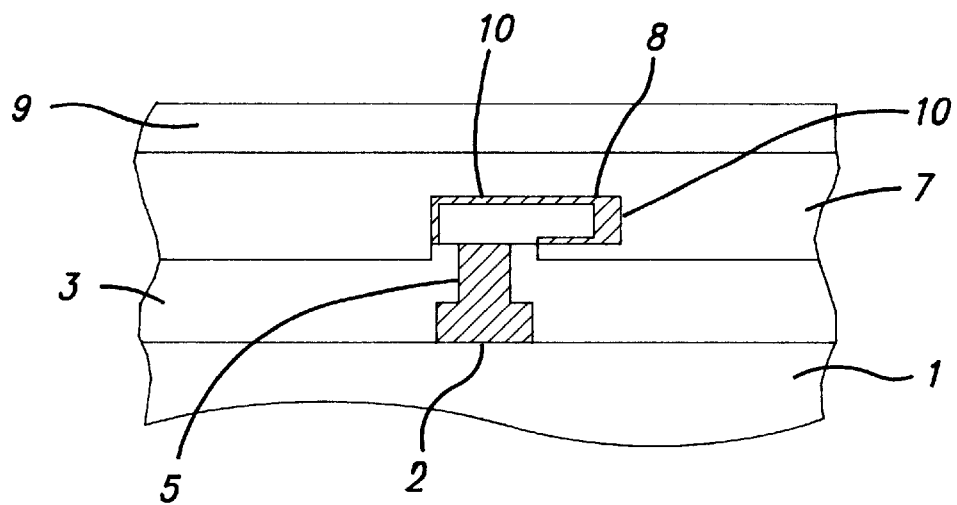

FIG. 22B is a fragmentary cross sectional elevation view illustrative of selected one of the fuse structures of FIG. 22A taken along an XXIIB—XXIIB line in FIG. 22A in a ninth embodiment in accordance with the present invention.

Figure 23A:
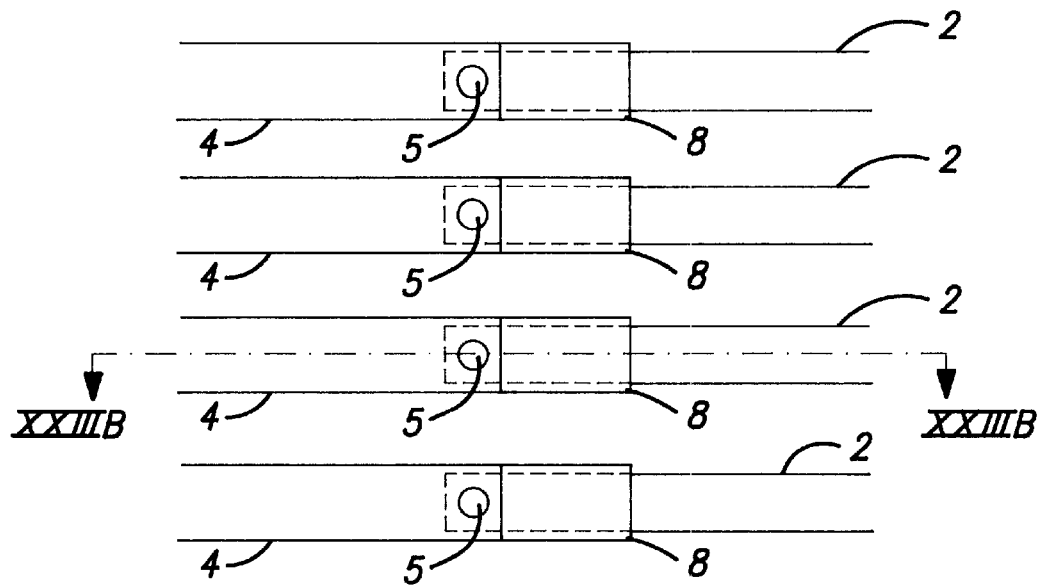

FIG. 23A is a fragmentary plan view illustrative of an alignment of plural fuse structures, each of which comprises a metal plug connecting first and second level interconnections in an inter-layer insulator and a single void extending at the same level as the second level interconnection and on an extending longitudinal center line of the second level interconnection before selected ones of the fuse structures are disconnected by irradiation of laser beams in a tenth embodiment in accordance with the present invention.

Figure 23B:
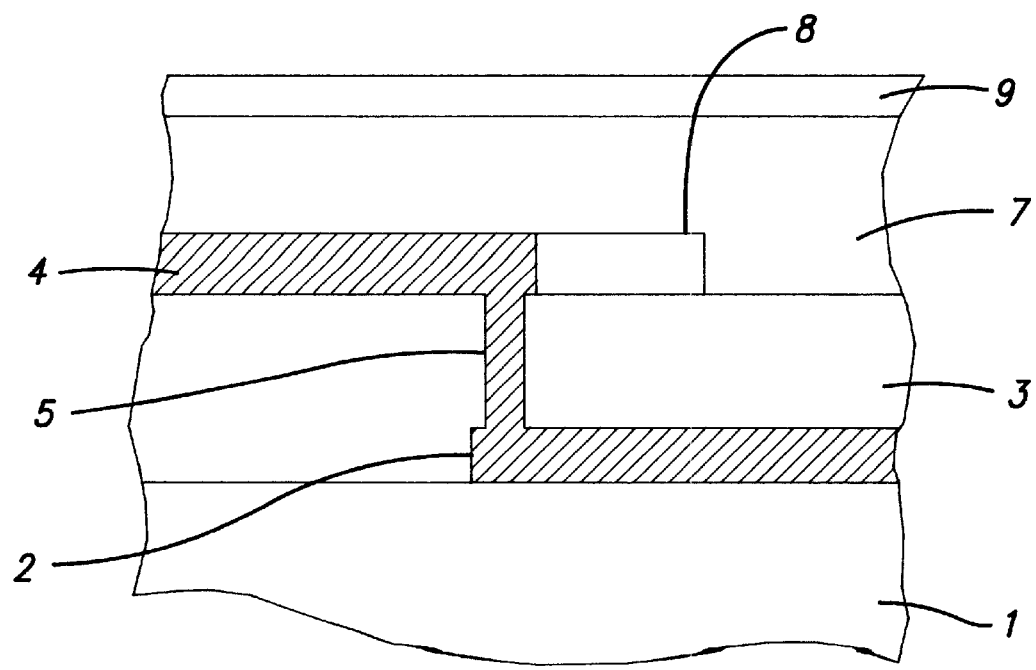

FIG. 23B is a fragmentary cross sectional elevation view illustrative of individual one of the fuse structures of FIG. 23A taken along a XXIIIB—XXIIIB line in FIG. 23A in a tenth embodiment in accordance with the present invention.

Figure 24A:
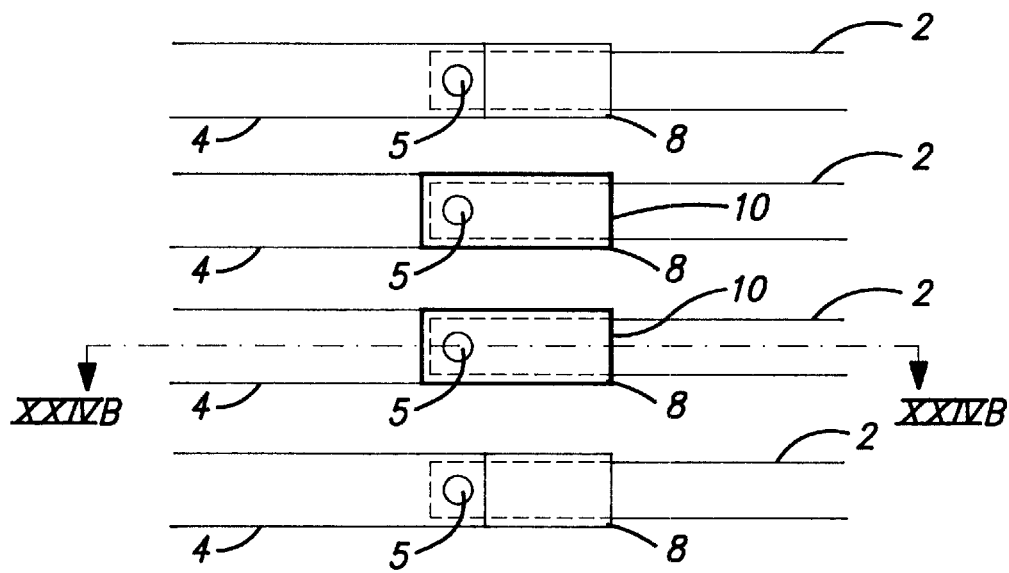

FIG. 24A is a fragmentary plan view illustrative of an alignment of plural fuse structures, each of which comprises a metal plug connecting first and second level interconnections in an inter-layer insulator and a single void extending at the same level as the second level interconnection and on an extending longitudinal center line of the second level interconnection after selected ones of the fuse structures were disconnected by irradiation of laser beams in a tenth embodiment in accordance with the present invention.

Figure 24B:
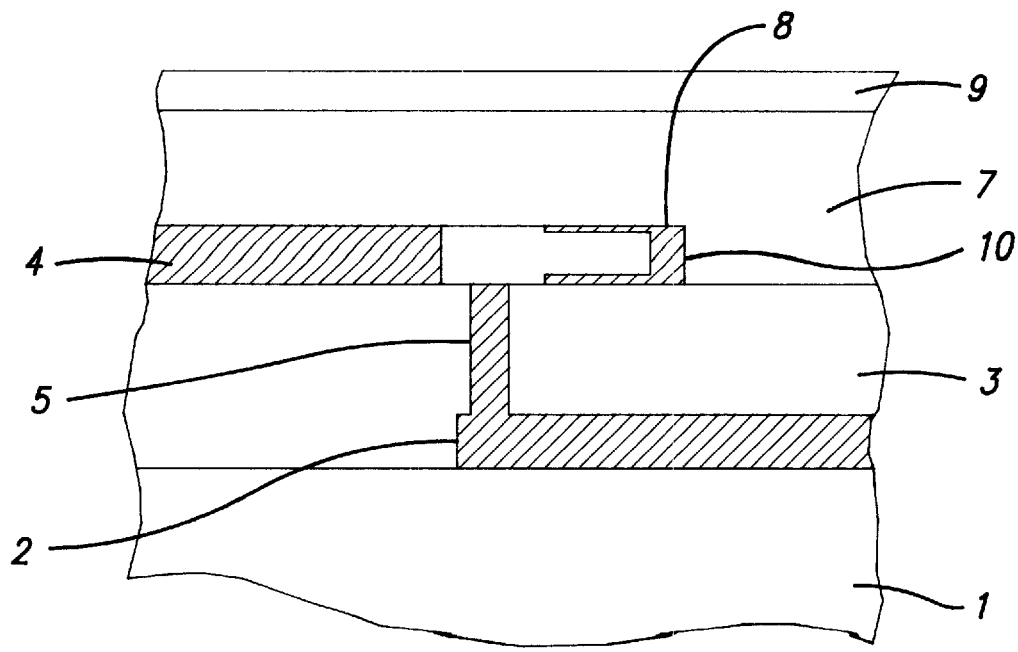

FIG. 24B is a fragmentary cross sectional elevation view illustrative of selected one of the fuse structures of FIG. 24A taken along a XXIVB—XXIVB line in FIG. 24A in a tenth embodiment in accordance with the present invention.

Figure 25A:
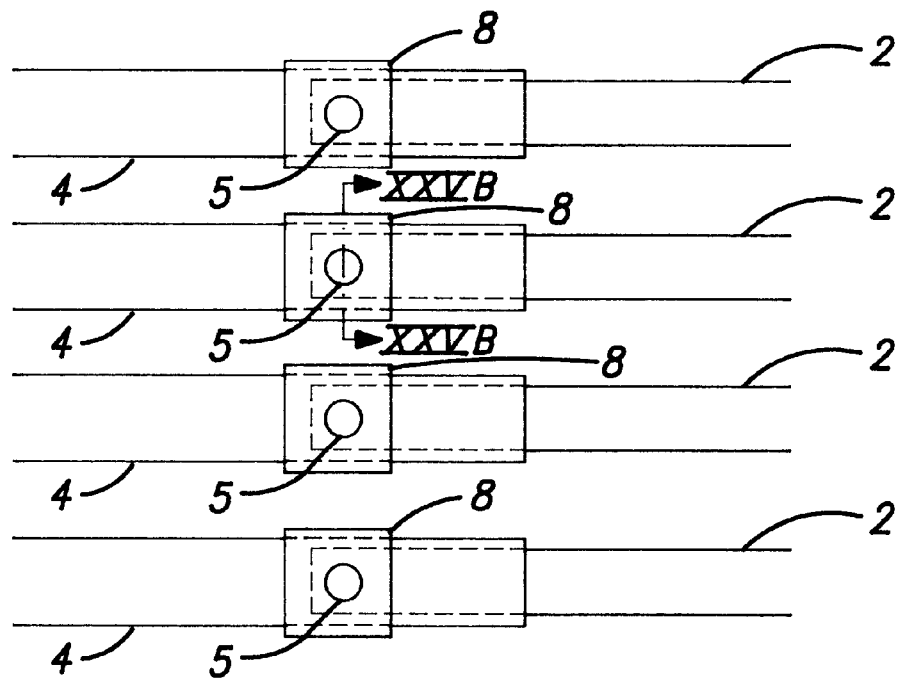

FIG. 25A is a fragmentary plan view illustrative of an alignment of plural fuse structures, each of which comprises a metal plug connecting first and second level interconnections in an inter-layer insulator and a single void extending at a higher level than the second level interconnection and over the second connecting part of the second level interconnection before selected ones of the fuse structures are disconnected by irradiation of laser beams in an eleventh embodiment in accordance with the present invention.

Figure 25B:
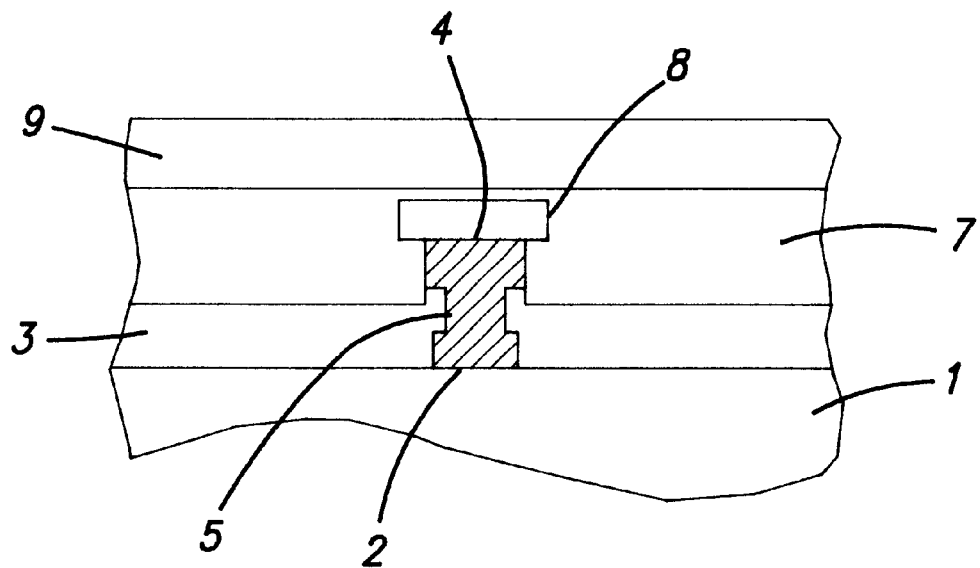

FIG. 25B is a fragmentary cross sectional elevation view illustrative of individual one of the fuse structures of FIG. 25A taken along an XXVB—XXVB line in FIG. 25A in an eleventh embodiment in accordance with the present invention.

Figure 26A:
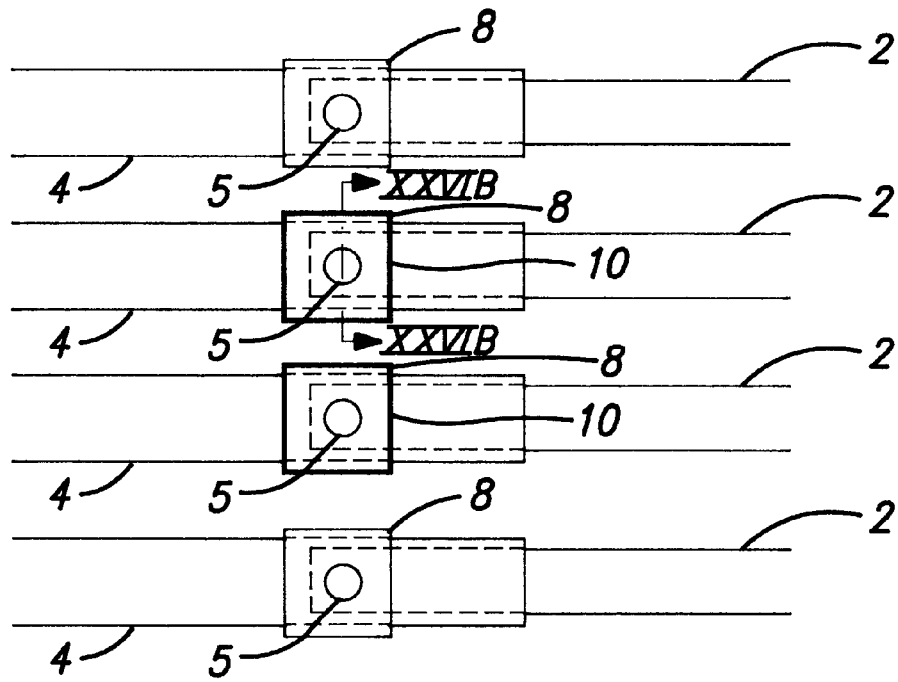

FIG. 26A is a fragmentary plan view illustrative of an alignment of plural fuse structures, each o:f which comprises a metal plug connecting first and second level interconnections in an inter-layer insulator and a single void extending at a higher level than the second level interconnection and over the second connecting part of the second level interconnection after selected ones of the fuse structures were disconnected by irradiation of laser beams in an eleventh embodiment in accordance with the present invention.

Figure 26B:
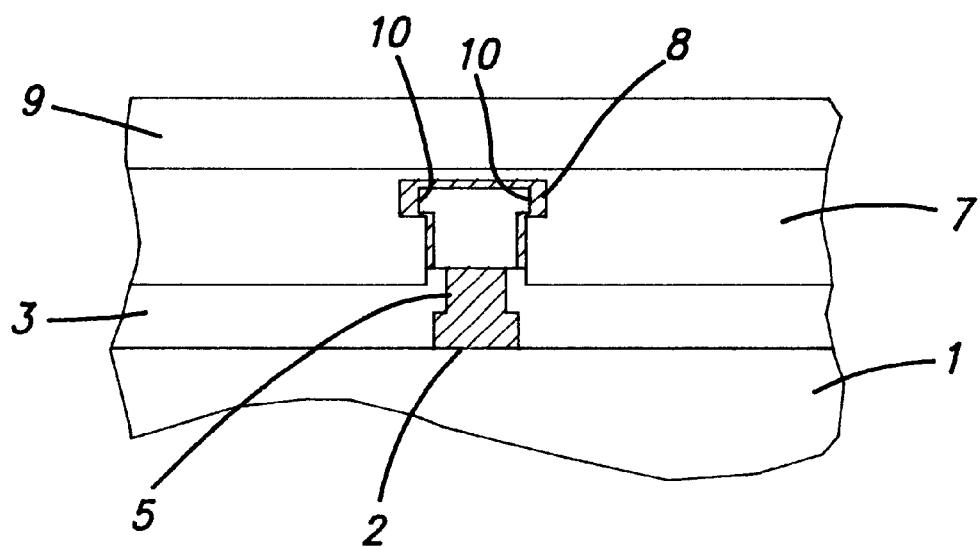

FIG. 26B is a fragmentary cross sectional elevation view illustrative of selected one of the fuse structures of FIG. 26A taken along an XXVIB—XXVIB line in FIG. 26A in an eleventh embodiment in accordance with the present invention.

Figure 27A:
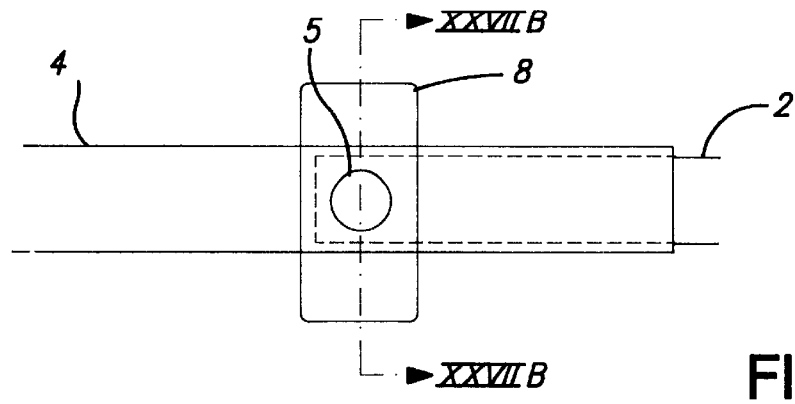

FIG. 27A is a fragmentary plan view illustrative of a fuse structure comprising a metal plug connecting first and second level interconnections in an inter-layer insulator and a single vertically extending U-shaped void extending from the same level up to a higher level than the second level interconnection and over the opposite sides of the second connecting part of the second level interconnection before selected ones of the fuse structures are disconnected by irradiation of laser beams in a twelfth embodiment in accordance with the present invention.

Figure 27B:
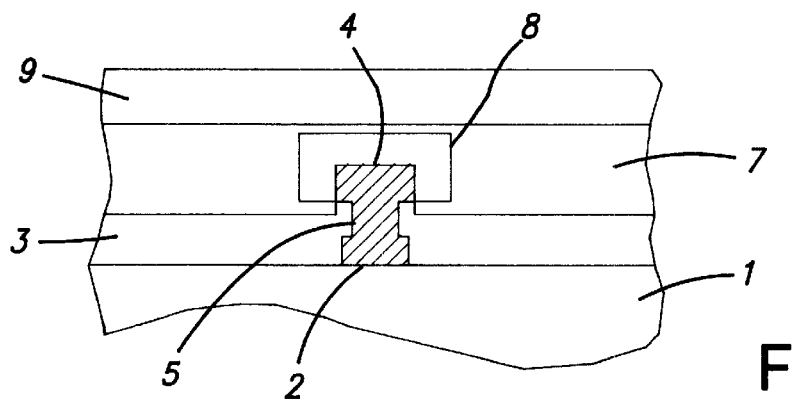

FIG. 27B is a fragmentary cross sectional elevation view illustrative of individual one of the fuse structures of FIG. 27A taken along an XXVIIB—XXVIIB line in FIG. 27A in a twelfth embodiment in accordance with the present invention.

Figure 28A:
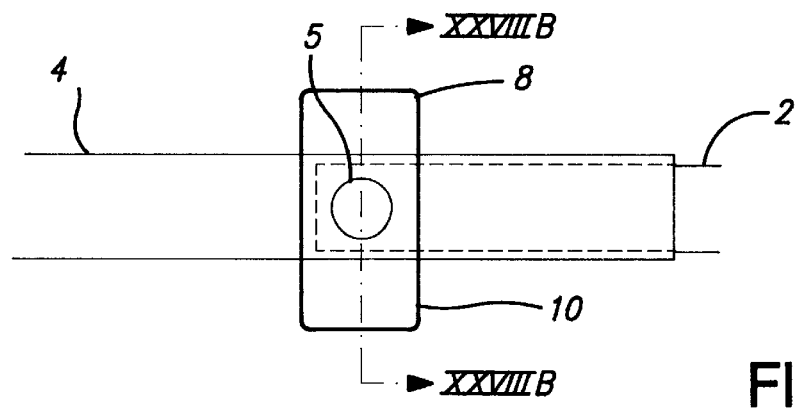

FIG. 28A is a fragmentary plan view illustrative of a fuse structure comprising a metal plug connecting first and second level interconnections in an inter-layer insulator and a single vertically extending U-shaped void extending from the same level up to a higher level than the second level interconnection and over the opposite sides of the second connecting part of the second level interconnection after selected ones of the fuse structures were disconnected by irradiation of laser beams in a twelfth embodiment in accordance with the present invention.

Figure 28B:
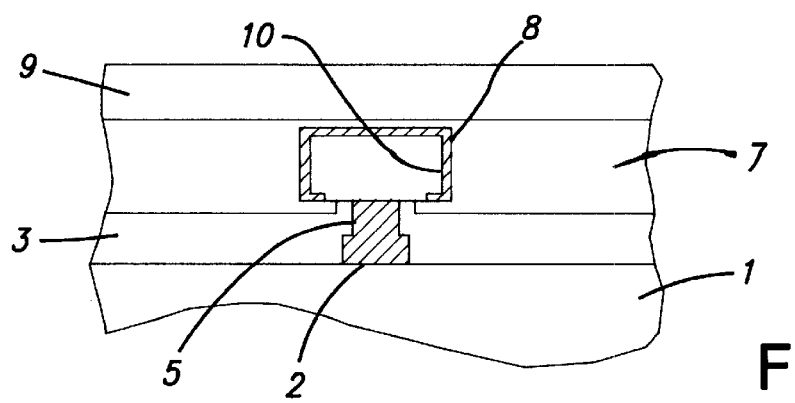

FIG. 28B is a fragmentary cross sectional elevation view illustrative of selected one of the fuse structures of FIG. 28A taken along an XXVIIIB—XXVIIIB line in FIG. 28A in a twelfth embodiment in accordance with the present invention.

Figure 29A:
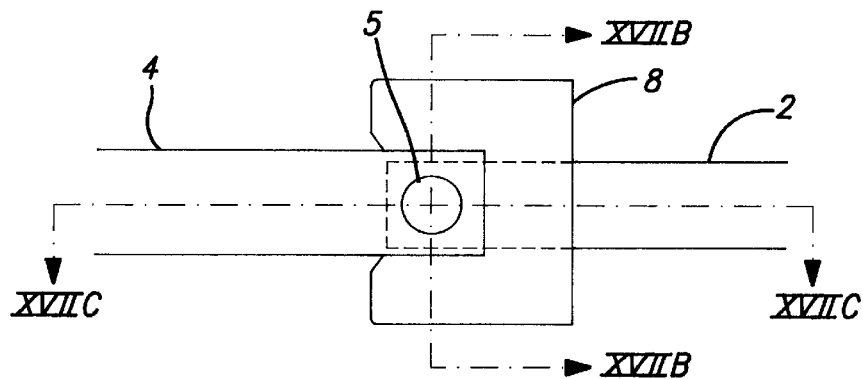

FIG. 29A is a fragmentary plan view illustrative of a fuse structure comprising a metal plug connecting first and second level interconnections in an inter-layer insulator and a single horizontally extending U-shaped void extending at the same level as the second level interconnection at one end and on opposite sides of the second connecting part of the second level interconnection before selected ones of the fuse structures are disconnected by irradiation of laser beams in a thirteenth embodiment in accordance with the present invention.

Figure 29B:
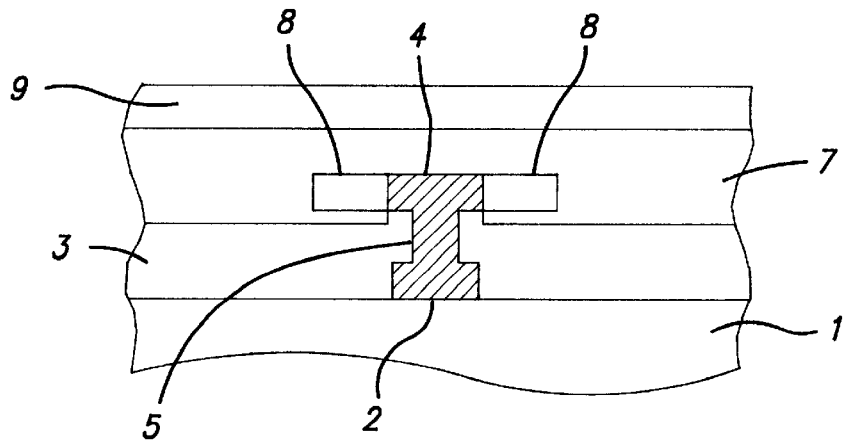

FIG. 29B is a fragmentary cross sectional elevation view illustrative of individual one of the fuse structures of FIG. 29A taken along an XXIXB—XXIXB line in FIG. 29A in a thirteenth embodiment in accordance with the present invention.

Figure 29C:
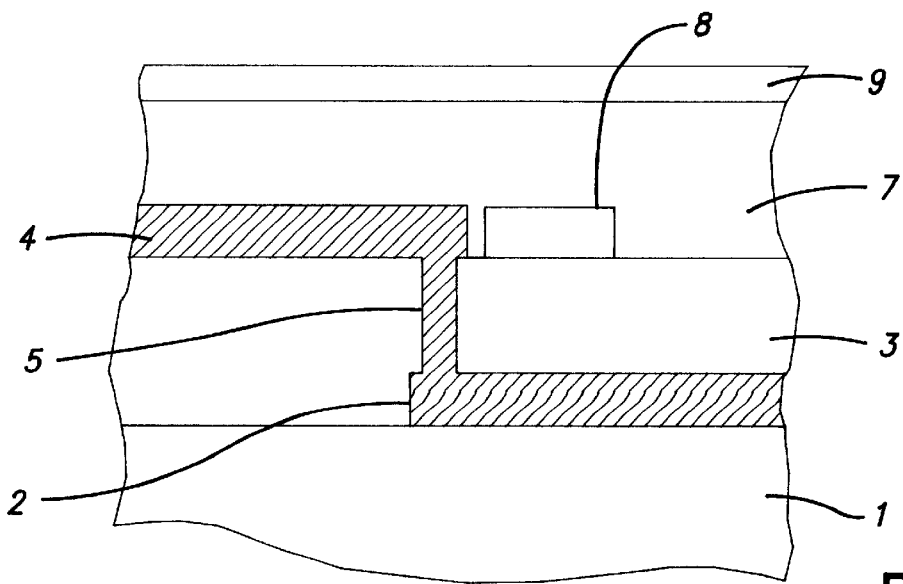

FIG. 29C is a fragmentary cross sectional elevation view illustrative of individual one of the fuse structures of FIG. 29A taken along a XXIXC—XXIXC line in FIG. 29A in a thirteenth embodiment in accordance with the present invention.

Figure 30A:
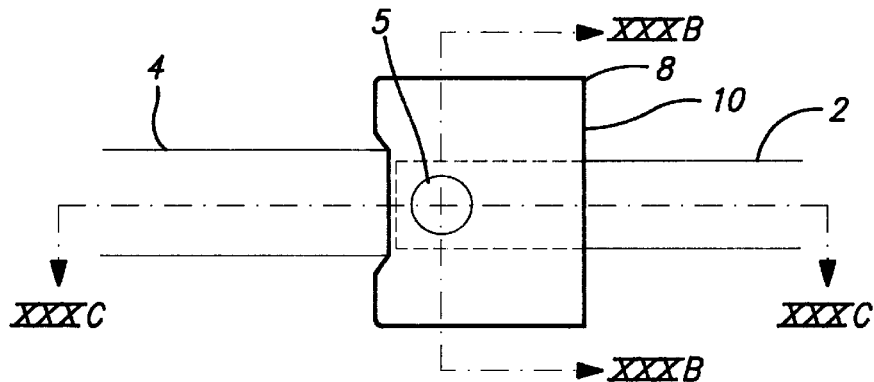

FIG. 30A is a fragmentary plan view illustrative of a fuse structure comprising a metal plug connecting first and second level interconnections in an inter-layer insulator and a single horizontally extending U-shaped void extending at the same level as the second level interconnection at one end and on opposite sides of the second connecting part of the second level interconnection after selected ones of the fuse structures were disconnected by irradiation of laser beams in a thirteenth embodiment in accordance with the present invention.

Figure 30B:
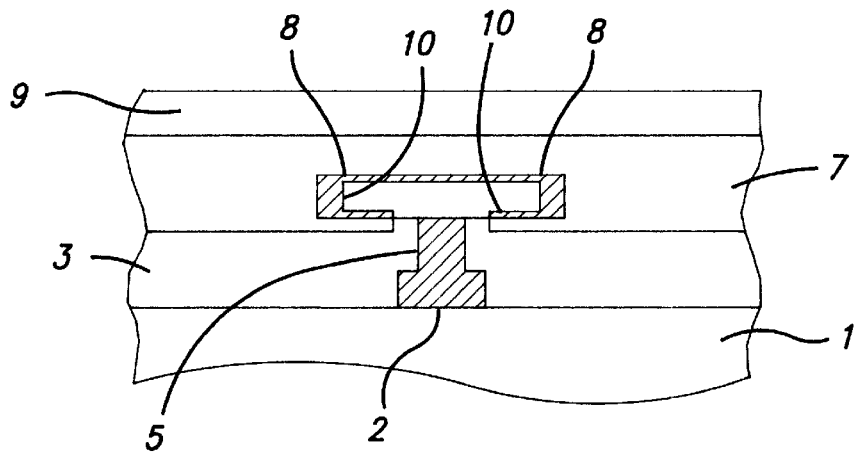

FIG. 30B is a fragmentary cross sectional elevation view illustrative of selected one of the fuse structures of FIG. 30A taken along an XXXB—XXXB line in FIG. 30A in a seventh embodiment in accordance with the present invention.

Figure 30C:
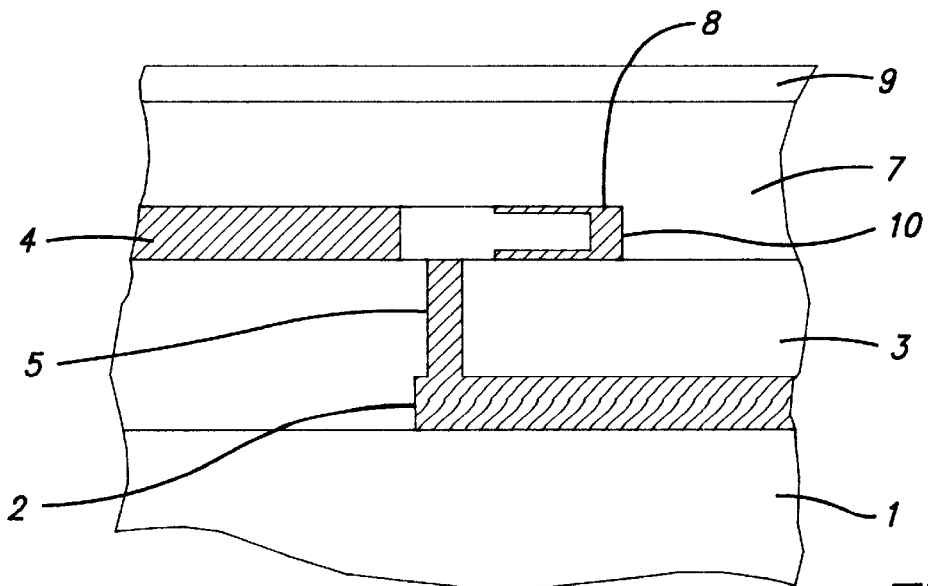

FIG. 30C is a fragmentary cross sectional elevation view illustrative of selected one of the fuse structures of FIG. 30A taken along a XXXC—XXXC line in FIG. 30A in a thirteenth embodiment in accordance with the present invention.

DISCLOSURE OF THE PREFERRED EMBODIMENTS

The first present invention provides a fuse structure formed in an inter-layer insulator having a first level interconnection and a second level interconnection isolated by the inter-layer insulator from the first level interconnection. The fuse structure comprises a conductive plug for providing an electrical connection between a first connecting part of the first level interconnection and a second connecting part of the second level interconnection, wherein the fuse structure further comprises at least a void which extends within the inter-layer insulator and also at least a part of the void extends adjacent to the second connecting part of the second level interconnection, so that when the second connecting part is rapidly evaporated by receiving a thermal energy, an evaporated material of the second connecting part is deposited on an inner wall of the void for causing an electrical disconnection between the first and second interconnections.

It is possible that the void is separated by a part of the inter-layer insulator from the second connecting part of the second level interconnection.

It is also possible that the void extends in contact with the second connecting part of the second level interconnection.

It is also possible that the inter-layer insulator has a relatively high hygroscopicity, and the inter-layer insulator is covered by a passivation film having a relatively low hygroscopicity.

It is also possible that the void has substantially the same level as the second level interconnection and the void extends in one side of the second level interconnection, so that the void is displaced from a longitudinal center line of the second level interconnection.

It is further possible that the first level interconnection and the second level interconnection extend anti-parallel to each other from the first and second connecting parts respectively, so that the first level interconnection and the second level interconnection have the same longitudinal direction, wherein the second interconnection has an extension extending from the second connecting part in the longitudinal direction of the second interconnection, so that the extension of the second level interconnection extends over the first level interconnection, and wherein the second level interconnection including the extension is wider than the first level interconnection so that the first connecting part and other parts of the first level interconnection in the vicinity of the second connecting part are covered by the second level interconnection with the extension.

It is furthermore possible to additionally comprise an extra interconnection extending in parallel to the second level interconnection, wherein the extra interconnection has substantially the same level as the second level interconnection, and the extra interconnection is displaced from the second level interconnection in a direction perpendicular to the longitudinal direction of the second level interconnection, and further the extra interconnection extends substantially symmetrical with reference to a center line extending both on a center of the second connecting part and in the direction perpendicular to the longitudinal direction of the second level interconnection, thereby to define an inter-layer insulator channel region between the second level interconnection and the extra interconnection, and wherein the void extends along the inter-layer insulator channel region between the second level interconnection and the extra interconnection, so that the void extends in parallel to the second level interconnection and also parallel to the extra interconnection, and opposite ends of the void are positioned in correspondence with opposite ends of the extra interconnection in a view perpendicular to the longitudinal direction of the second level interconnection, whereby the void extends substantially symmetrical with reference to the center line extending on the second connecting part and in the direction perpendicular to the longitudinal direction of the second level interconnection.

It is also possible that two of the voids have substantially the same level as the second level interconnection and the two voids extend in opposite sides of the second level interconnection, so that the two voids sandwich the second connecting part in a direction perpendicular to a longitudinal direction of the second level interconnection.

It is further possible that the first level interconnection and the second level interconnection extend anti-parallel to each other from the first and second connecting parts respectively, so that the first level interconnection and the second level interconnection have the same longitudinal direction, wherein the second interconnection has an extension extending from the second connecting part in the longitudinal direction of the second interconnection, so that the extension of the second level interconnection extends over the first level interconnection, and wherein the second level interconnection including the extension is wider than the first level interconnection so that the first connecting part and other parts of the first level interconnection in the vicinity of the second connecting part are covered by the second level interconnection with the extension.

It is furthermore possible to additionally comprise a pair of extra interconnections extending in parallel to the second level interconnection, wherein each of the paired extra interconnections has substantially the same level as the second level interconnection, and the paired extra interconnections are displaced from the second level interconnection in a direction perpendicular to the longitudinal direction of the second level interconnection, and further the paired extra interconnections extend substantially symmetrical with reference to a center line extending both on a center of the second connecting part and in the direction perpendicular to the longitudinal direction of the second level interconnection, thereby to define two inter-layer insulator channel regions between the second level interconnection and the paired extra interconnections respectively, and wherein the two voids extend along the two inter-layer insulator channel regions between the second level interconnection and the paired extra interconnections, so that the two voids extend in parallel to the, second level interconnection and also parallel to the paired extra interconnections, and opposite ends of each of the two voids are positioned in correspondence with opposite ends of each of the paired extra interconnections in a view perpendicular to the longitudinal direction of the second level interconnection, whereby each of the two voids extends substantially symmetrical with reference to the center line extending on the second connecting part and in the direction perpendicular to the longitudinal direction of the second level interconnection.

It is also possible that the second connecting part of the second level interconnection comprises one end of the second level interconnection, and wherein the void has substantially the same level as the second level interconnection, and the void extends in one end side of the second level interconnection, so that the void extends on an extending longitudinal center line of the second level interconnection.

It is also possible that the void extends over the second connecting part of the second level interconnection.

It is also possible that the second connecting part of the second level interconnection comprises one end of the second level interconnection, and wherein the void extends in a form of a U-shape which surrounds the second connecting part in about three quarter of omnidirections, so that the U-shape of the void has substantially the same level as the second level interconnection, and the U-shape of the void extends in one end side and in opposite sides of the second connecting part of the second level interconnection.

It is also possible that the void extends in a form of a U-shape which surrounds the second connecting part in about three quarter of omnidirections, so that the U-shape of the void has substantially the same level as and higher level than the second level interconnection, and the U-shape of the void extends over and in opposite sides of the second connecting part of the second level interconnection.

The second present invention provides a fuse array of fuse structures formed in an inter-layer insulator having a first level interconnection and a second level interconnection isolated by the inter-layer insulator from the first level interconnection. The first level and second level interconnections have the same longitudinal direction as each other. The fuse structure comprises a conductive plug for providing an electrical connection between a first connecting part of the first level interconnection and a second connecting part of the second level interconnection, wherein each of the fuse structures further comprises at least a void which extends within the inter-layer insulator and also at least a part of the void extends adjacent to the second connecting part of the second level interconnection, so that when the second connecting part is rapidly evaporated by receiving a thermal energy, an evaporated material of the second connecting part is deposited on an inner wall of the void for causing an electrical disconnection between the first and second interconnections, and wherein the fuse structures are aligned alternately to be displaced from each other in a direction parallel to the longitudinal direction of the first level and second level interconnections so as to form a plurality of parallel alignments of the fuse structures extending in a direction perpendicular to the longitudinal direction of the first level and second level interconnections.

It is possible that the void is separated by a part of the inter-layer insulator from the second connecting part of the second level interconnection.

It is also possible that the void extends in contact with the second connecting part of the second level interconnection.

It is also possible that the inter-layer insulator has a relatively high hygroscopicity, and the inter-layer insulator is covered by a passivation film having a relatively low hygroscopicity.

It is also possible that the void has substantially the same level as the second level interconnection and the void extends in one side of the second level interconnection, so that the void is displaced from a longitudinal center line of the second level interconnection.

It is further possible that the first level interconnection and the second level interconnection extend anti-parallel to each other from the first and second connecting parts respectively, so that the first level interconnection and the second level interconnection have the same longitudinal direction, wherein the second interconnection has an extension extending from the second connecting part in the longitudinal direction of the second interconnection, so that the extension of the second level interconnection extends over the first level interconnection, and wherein the second level interconnection including the extension is wider than the first level interconnection so that the first connecting part and other parts of the first level interconnection in the vicinity of the second connecting part are covered by the second level interconnection with the extension.

It is furthermore possible to additionally comprise an extra interconnection extending in parallel to the second level interconnection, wherein the extra interconnection has substantially the same level as the second level interconnection, and the extra interconnection is displaced from the second level interconnection in a direction perpendicular to the longitudinal direction of the second level interconnection, and further the extra interconnection extends substantially symmetrical with reference to a center line extending both on a center of the second connecting part and in the direction perpendicular to the longitudinal direction of the second level interconnection, thereby to define an inter-layer insulator channel region between the second level interconnection and the extra interconnection, and wherein the void extends along the inter-layer insulator channel region between the second level interconnection and the extra interconnection, so that the void extends in parallel to the second level interconnection and also parallel to the extra interconnection, and opposite ends of the void are positioned in correspondence with opposite ends of the extra interconnection in a view perpendicular to the longitudinal direction of the second level interconnection, whereby the void extends substantially symmetrical with reference to the center line extending on the second connecting part and in the direction perpendicular to the longitudinal direction of the second level interconnection.

It is also possible that two of the voids have substantially the same level as the second level interconnection and the two voids extend in opposite sides of the second level interconnection, so that the two voids sandwich the second connecting part in a direction perpendicular to a longitudinal direction of the second level interconnection.

It is further possible that the first level interconnection and the second level interconnection extend anti-parallel to each other from the first and second connecting parts respectively, so that the first level interconnection and the second level interconnection have the same longitudinal direction, wherein the second interconnection has an extension extending from the second connecting part in the longitudinal direction of the second interconnection, so that the extension of the second level interconnection extends over the first level interconnection, and wherein the second level interconnection including the extension is wider than the first level interconnection so that the first connecting part and other parts of the first level interconnection in the vicinity of the second connecting part are covered by the second level interconnection with the extension.

It is furthermore possible to additionally comprise a pair of extra interconnections extending in parallel to the second level interconnection, wherein each of the paired extra interconnections has substantially the same level as the second level interconnection, and the paired extra interconnections are displaced from the second level interconnection in a direction perpendicular to the longitudinal direction of the second level interconnection, and further the paired extra interconnections extend substantially symmetrical with reference to a center line extending both on a center of the second connecting part and in the direction perpendicular to the longitudinal direction of the second level interconnection, thereby to define two inter-layer insulator channel regions between the second level interconnection and the paired extra interconnections respectively, and wherein the two voids extend along the two inter-layer insulator channel regions between the second level interconnection and the paired extra interconnections, so that the two voids extend in parallel to the second level interconnection and also parallel to the paired extra interconnections, and opposite ends of each of the two voids are positioned in correspondence with opposite ends of each of the paired extra interconnections in a view perpendicular to the longitudinal direction of the second level interconnection, whereby each of the two voids extends substantially symmetrical with reference to the center line extending on the second connecting part and in the direction perpendicular to the longitudinal direction of the second level interconnection.

It is also possible that the second connecting part of the second level interconnection comprises one end of the second level interconnection, and wherein the void has substantially the same level as the second level interconnection, and the void extends in one end side of the second level interconnection, so that the void extends on an extending longitudinal center line of the second level interconnection.

It is also possible that the void extends over the second connecting part of the second level interconnection.

It is also possible that the second connecting part of the second level interconnection comprises one end of the second level interconnection, and wherein the void extends in a form of a U-shape which surrounds the second connecting part in about three quarter of omnidirections, so that the U-shape of the void has substantially the same level as the second level interconnection, and the U-shape of the void extends in one end side and in opposite sides of the second connecting part of the second level interconnection.

It is also possible that the void extends in a form of a U-shape which surrounds the second connecting part in about three quarter of omnidirections, so that the U-shape of the void has substantially the same level as and higher level than the second level interconnection, and the U-shape of the void extends over and in opposite sides of the second connecting part of the second level interconnection.

The third present invention provides a fuse structure formed in an inter-layer insulator having a first level interconnection and a second level interconnection isolated by the inter-layer insulator from the first level interconnection. The inter-layer insulator is covered by a passivation film having a lower hygroscopicity than the inter-layer insulator. The fuse structure comprises a conductive plug for providing an electrical connection between a first connecting part of the first level interconnection and a second connecting part of the second level interconnection, wherein the fuse structure further comprises at least a void which extends within the inter-layer insulator and also at least a part of the void extends adjacent to the second connecting part of the second level interconnection, so that when the second connecting part is rapidly evaporated by receiving a thermal energy, an evaporated material of the second connecting part is deposited on an inner wall of the void for causing an electrical disconnection between the first and second interconnections.

It is possible that the void is separated by a part of the inter-layer insulator from the second connecting part of the second level interconnection.

It is also possible that the void extends in contact with the second connecting part of the second level interconnection.

It is also possible that a top of the void is in contact with a bottom of the passivation film.

It is also possible that a top of the void is separated by the inter-layer insulator from a bottom of the passivation film.

It is also possible that the void has substantially the same level as the second level interconnection and the void extends in one side of the second level interconnection, so that the void is displaced from a longitudinal center line of the second level interconnection.

It is further possible that the first level interconnection and the second level interconnection extend anti-parallel to each other from the first and second connecting parts respectively, so that the first level interconnection and the second level interconnection have the same longitudinal direction, wherein the second interconnection has an extension extending from the second connecting part in the longitudinal direction of the second interconnection, so that the extension of the second level interconnection extends over the first level interconnection, and wherein the second level interconnection including the extension is wider than the first level interconnection so that the first connecting part and other parts of the first level interconnection in the vicinity of the second connecting part are covered by the second level interconnection with the extension.

It is furthermore possible to additionally comprise an extra interconnection extending in parallel to the second level interconnection, wherein the extra interconnection has substantially the same level as the second level interconnection, and the extra interconnection is displaced from the second level interconnection in a direction perpendicular to the longitudinal direction of the second level interconnection, and further the extra interconnection extends substantially symmetrical with reference to a center line extending both on a center of the second connecting part and in the direction perpendicular to the longitudinal direction of the second level interconnection, thereby to define an inter-layer insulator channel region between the second level interconnection and the extra interconnection, and wherein the void extends along the inter-layer insulator channel region between the second level interconnection and the extra interconnection, so that the void extends in parallel to the second level interconnection and also parallel to the extra interconnection, and opposite ends of the void are positioned in correspondence with opposite ends of the extra interconnection in a view perpendicular to the longitudinal direction of the second level interconnection, whereby the void extends substantially symmetrical with reference to the center line extending on the second connecting part and in the direction perpendicular to the longitudinal direction of the second level interconnection.

It is also possible that two of the voids have substantially the same level as the second level interconnection and the two voids extend in opposite sides of the second level interconnection, so that the two voids sandwich the second connecting part in a direction perpendicular to a longitudinal direction of the second level interconnection.

It is further possible that the first level interconnection and the second level interconnection extend anti-parallel to each other from the first and second connecting parts respectively, so that the first level interconnection and the second level interconnection have the same longitudinal direction, wherein the second interconnection has an extension extending from the second connecting part in the longitudinal direction of the second interconnection, so that the extension of the second level interconnection extends over the first level interconnection, and wherein the second level interconnection including the extension is wider than the first level interconnection so that the first connecting part and other parts of the first level interconnection in the vicinity of the second connecting part are covered by the second level interconnection with the extension.

It is furthermore possible to additionally comprise a pair of extra interconnections extending in parallel to the second level interconnection, wherein each of the paired extra interconnections has substantially the same level as the second level interconnection, and the paired extra interconnections are displaced from the second level interconnection in a direction perpendicular to the longitudinal direction of the second level interconnection, and further the paired extra interconnections extend substantially symmetrical with reference to a center line extending both on a center of the second connecting part and in the direction perpendicular to the longitudinal direction of the second level interconnection, thereby to define two inter-layer insulator channel regions between the second level interconnection and the paired extra interconnections respectively, and wherein the two voids extend along the two inter-layer insulator channel regions between the second level interconnection and the paired extra interconnections, so that the two voids extend in parallel to the second level interconnection and also parallel to the paired extra interconnections, and opposite ends of each of the two voids are positioned in correspondence with opposite ends of each of the paired extra interconnections in a view perpendicular to the longitudinal direction of the second level interconnection, whereby each of the two voids extends substantially symmetrical with reference to the center line extending on the second connecting part and in the direction perpendicular to the longitudinal direction of the second level interconnection.

It is also possible that the second connecting part of the second level interconnection comprises one end of the second level interconnection, and wherein the void has substantially the same level as the second level interconnection, and the void extends in one end side of the second level interconnection, so that the void extends on an extending longitudinal center line of the second level interconnection.

It is also possible that the void extends over the second connecting part of the second level interconnection.

It is also possible that the second connecting part of the second level interconnection comprises one end of the second level interconnection, and wherein the void extends in a form of a U-shape which surrounds the second connecting part in about three quarter of omnidirections, so that the U-shape of the void has substantially the same level as the second level interconnection, and the U-shape of the void extends in one end side and in opposite sides of the second connecting part of the second level interconnection.

It is also possible that the void extends in a form of a U-shape which surrounds the second connecting part in about three quarter of omnidirections, so that the U-shape of the void has substantially the same level as and higher level than the second level interconnection, and the U-shape of the void extends over and in opposite sides of the second connecting part of the second level interconnection.

A first embodiment according to the present invention will be described in detail with reference to FIGS. 5A, 5B, 6A and 6B.

Figure 1A:
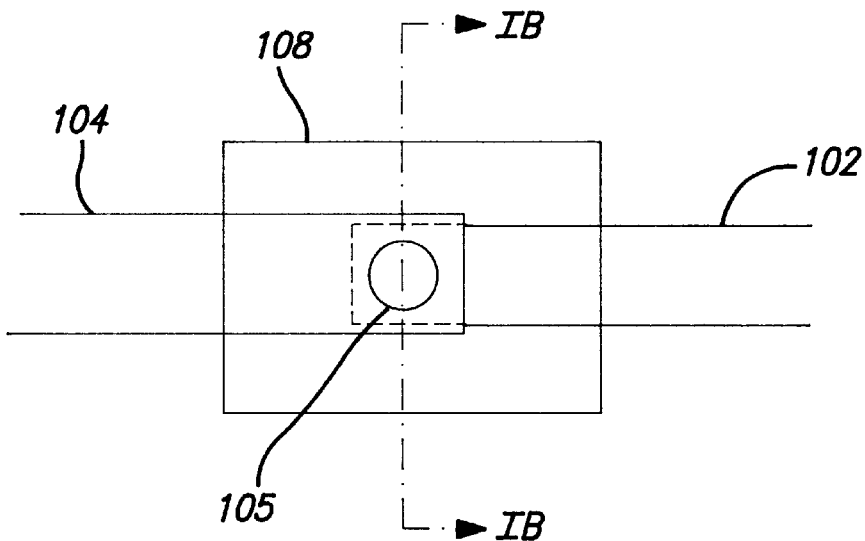
FIG. 1A is a fragmentary plan view illustrative of a first conventional fuse structure comprising a metal plug connecting first and second level interconnections in an inter-layer insulator before the fuse structure is disconnected by an irradiation of a laser beam.
Figure 1B:
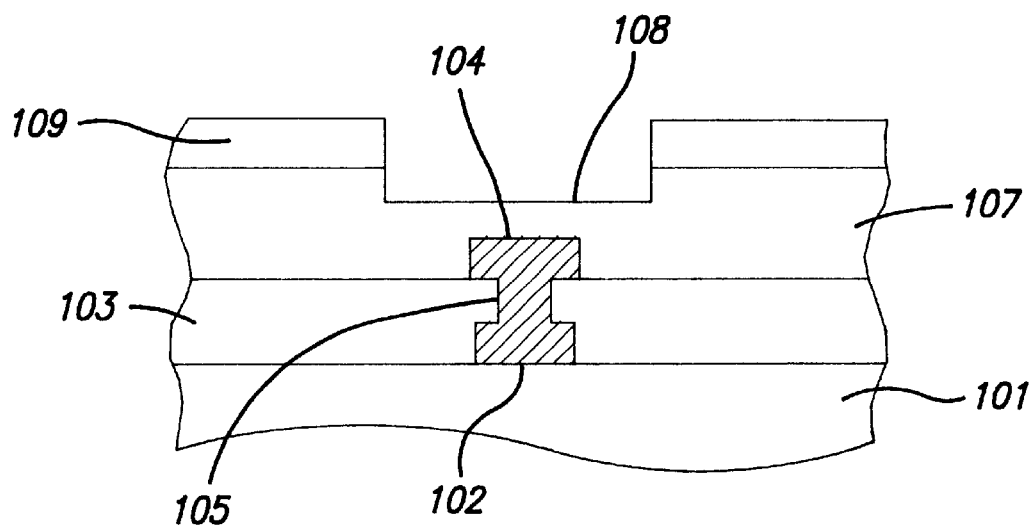
FIG. 1B is a fragmentary cross sectional elevation view illustrative of the first conventional fuse structure of FIG. IA taken along an IB—IB line in FIG. 1A.
Figure 2A:
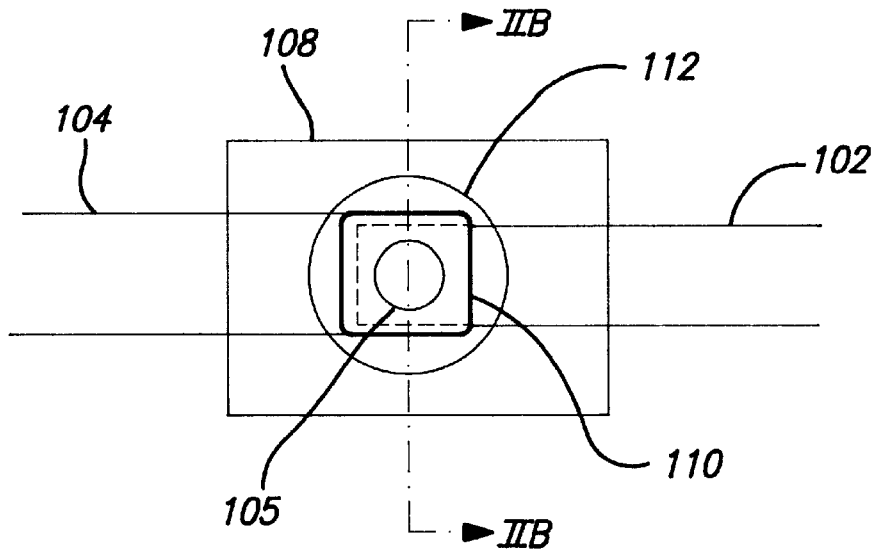
FIG. 2A is a fragmentary plan view illustrative of a first conventional fuse structure comprising a metal plug connecting first and second level interconnections in an inter-layer insulator after the fuse structure was disconnected by an irradiation of a laser beam.
Figure 2B:
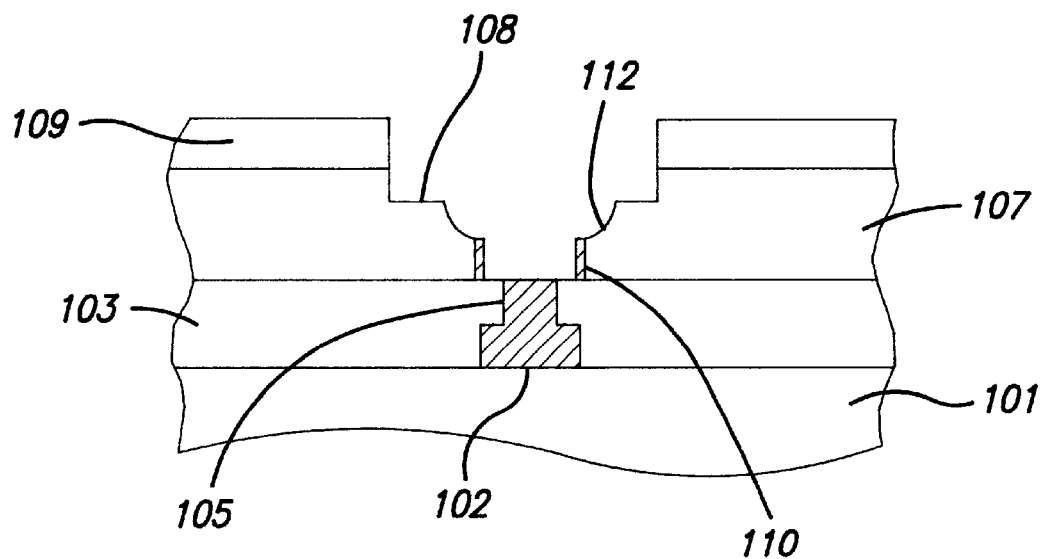
FIG. 2B is a fragmentary cross sectional elevation view illustrative of the first conventional fuse structure of FIG. 2A taken along an IIB—IIB line in FIG. 2A.
Figure 3A:
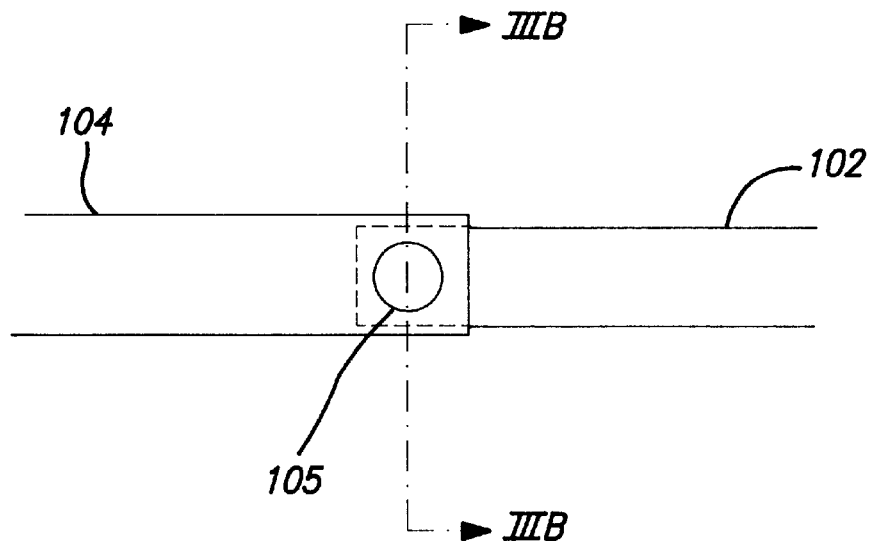
FIG. 3A is a fragmentary plan view illustrative of a second conventional fuse structure comprising a metal plug connecting first and second level interconnections in an inter-layer insulator before the fuse structure is disconnected by an irradiation of a laser beam.
Figure 3B:
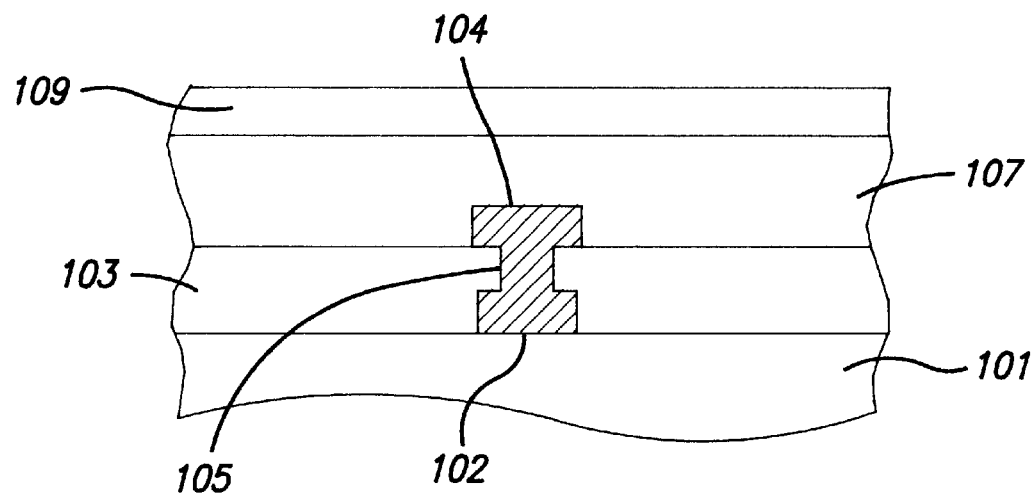
FIG. 3B is a fragmentary cross sectional elevation view illustrative of the second conventional fuse structure of FIG. 3A taken along an IIIB—IIIB line in FIG. 3A.
Figure 4A:
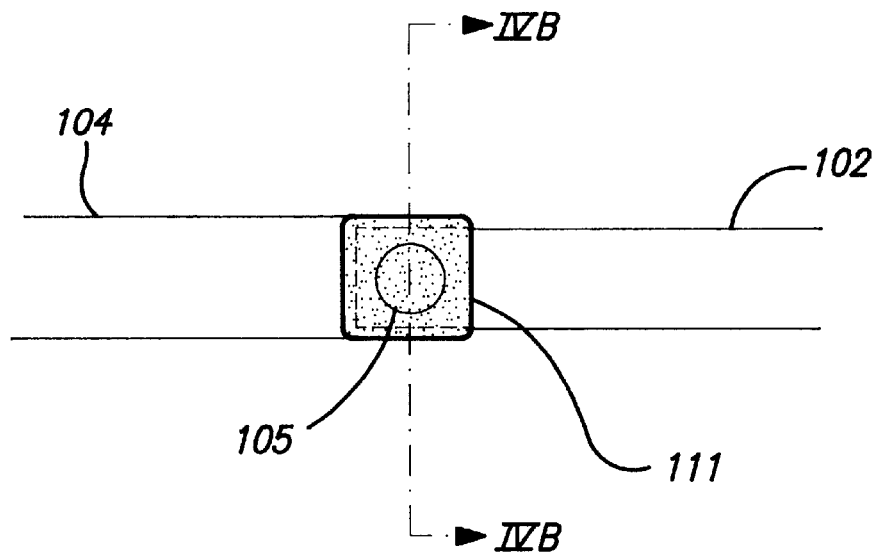
FIG. 4A is a fragmentary plan view illustrative of a second conventional fuse structure comprising a metal plug connecting first and second level interconnections in an inter-layer insulator after the fuse structure was disconnected by an irradiation of a laser beam.
Figure 4B:
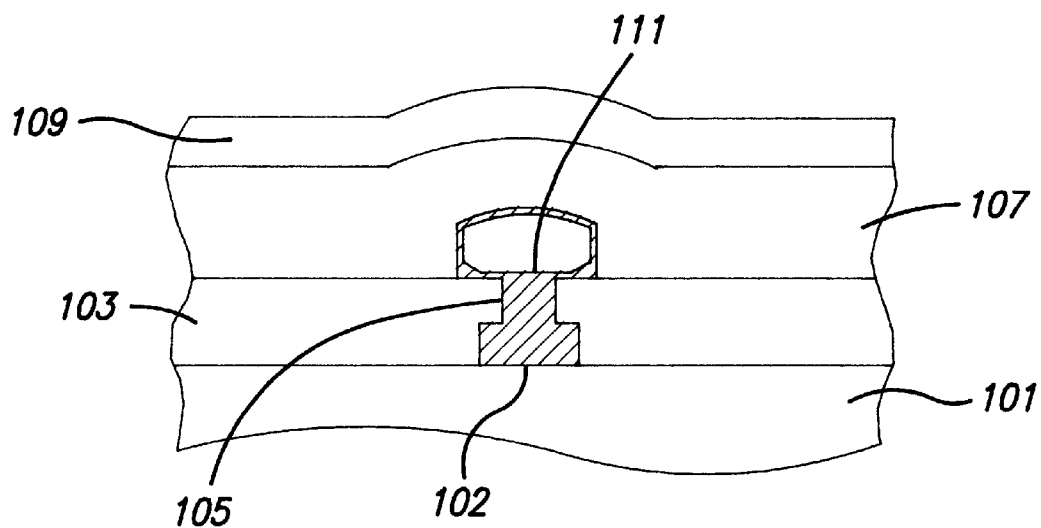
FIG. 4B is a fragmentary cross sectional elevation view illustrative of the second conventional fuse structure of FIG. 4A taken along an IVB—IVB line in FIG. 4A.
Figure 5A:
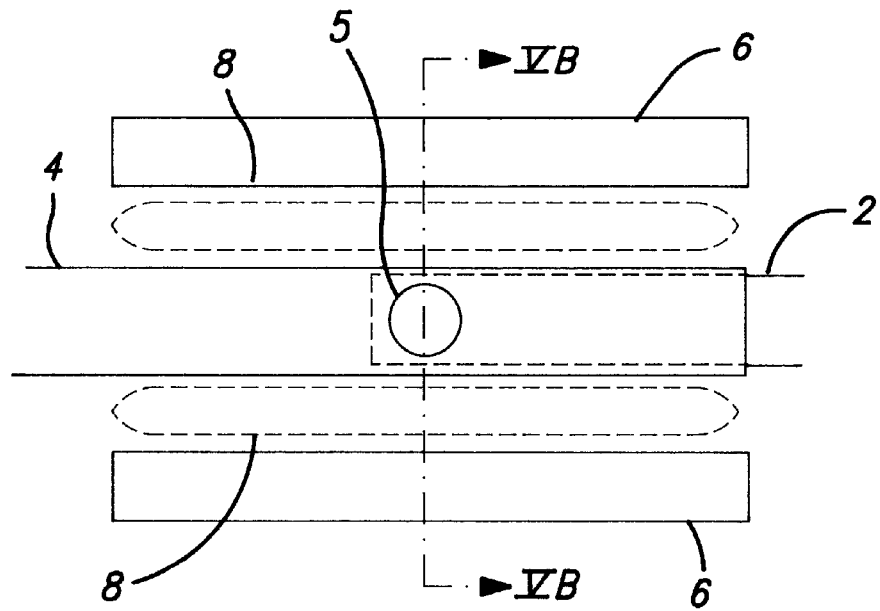
FIG. 5A is a fragmentary plan view illustrative of a fuse structure comprising a metal plug connecting first and second level interconnections in an inter-layer insulator and voids extending at the same level as the second level interconnection and along opposite sides of the second level interconnection before the fuse structure is disconnected by an irradiation of a laser beam in a first embodiment in accordance with the present invention.
Figure 5B:
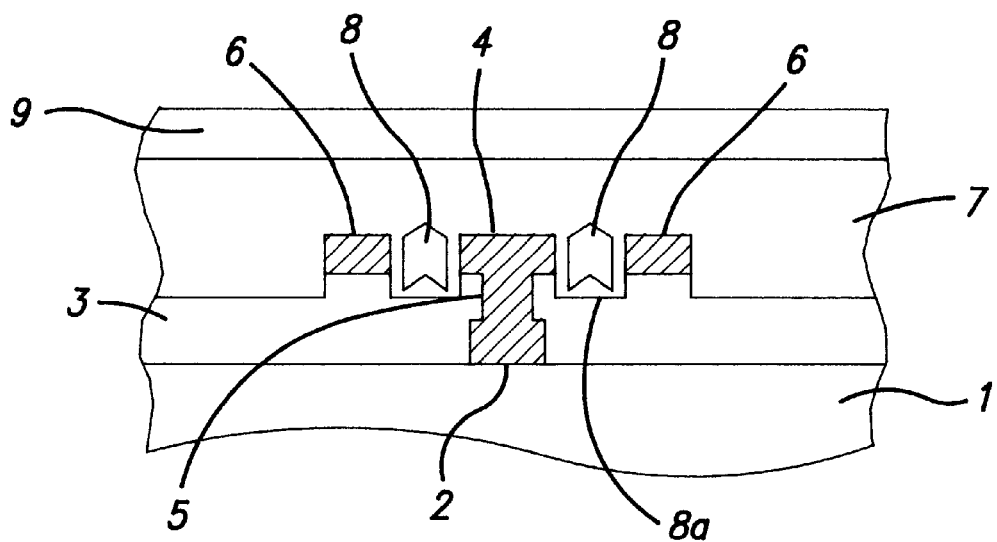
FIG. 5B is a fragmentary cross sectional elevation view illustrative of the fuse structure of FIG. 5A taken along an VB—VB line in FIG. 5A in a first embodiment in accordance with the present invention.

With reference to FIGS. 5A and 5B, the following description is made directed to the novel fuse structure comprising a metal plug connecting first and second level interconnections in an inter-layer insulator and voids extending at the same level as the second level interconnection and along opposite sides of the second level interconnection before the fuse structure is disconnected by an irradiation of a laser beam.

A first level interconnection 2 extends over a first inter-layer insulator 1. A second inter-layer insulator 3 overlies the first inter-layer insulator 1 and the first level interconnection 2. The second inter-layer insulator 3 has a via hole within which a metal plug 5 is filled. Namely, the metal plug 5 is buried within the second inter-layer insulator 3. The metal plug 5 is electrically connected to a first connecting part of the first level interconnection 2a. A second level interconnection 4 extends over the second inter-layer insulator 3 so that a second connecting part of the second level interconnection 4b is positioned over the via hole, whereby the second connecting part of the second level interconnection 4b is electrically connected to the metal plug 5. As a result, the first level interconnection 2 and the second level interconnection 4 are electrically connected through the metal plug 5 to each other. The first level interconnection 2 and the second level interconnection 4 extend in anti-parallel directions, for example, opposite directions. The first level interconnection 2 and the second level interconnection 4 have the same longitudinal direction. A first longitudinal axis of the first level interconnection 2 is aligned with a second longitudinal axis of the second level interconnection 4 in a plane view. The second connecting part of the second level interconnection 4 overlaps the first connecting part of the first level interconnection 2 in the plane view.

The second level interconnection 4 has an extension extending from the second connecting part in the same direction as the first level interconnection extends, so that the extension of the second level interconnection 4 overlaps an adjacent part of the first level interconnection 2 to the first connecting part. The second level interconnection 4 is wider than the first level interconnection 2 so that the second connecting part and the extension of the second level interconnection 4 cover the first connecting part of the first level interconnection 2 and the adjacent part thereof to the first connecting part in the plane view.

Two extra metal interconnections 6 extend over the second inter-layer insulator 3. The two extra metal interconnections 6 extend in opposite sides of the second level interconnection 4. The two extra metal interconnections 6 have the same level as the second level interconnection 4. The two extra metal interconnections 6 extend in parallel to the second level interconnection 4 and are distanced from the second level interconnection 4 to form two slender grooves defined between the second level interconnection 4 and the two extra metal interconnections 6. Each of the two extra metal interconnections 6 extends symmetrical with reference to a center line extending on at center of the metal plug 5 or the second connecting part of the second level interconnection and also extending in a direction perpendicular to the longitudinal direction of the first level and second level interconnections 2 and 4 as well as the two extra metal interconnections 6. One end of each of the two extra metal interconnections 6 is positioned in correspondence with the end of the extension of the second level interconnection 4 in a view perpendicular to the longitudinal direction of the first level and second level interconnections 2 and 4 as well as the two extra metal interconnections 6. A third inter-layer insulator 7 overlies the second inter-layer insulator 3 and the second level interconnection 4 as well as the two extra metal interconnections 6, whereby the second level interconnection 4 and the two extra metal interconnections 6 are buried in the third level interconnection 7. A passivation film 9 extends over the third inter-layer insulator 7 so that an entire surface of the third inter-layer insulator 7 is covered by the passivation film 9.

Two voids 8 extend through the third inter-layer insulator 7 within the two slender grooves defined between the second level interconnection 4 and the two extra metal interconnections 6. The two voids 8 extend in parallel to the second level interconnection 4 and the two extra metal interconnections 6. The two voids 8 extend at the same level as the second level interconnection 4 and the two extra metal interconnections 6. The two voids 8 extend between the second level interconnection 4 and the two extra metal interconnections 6. The two voids 8 are surrounded by the third inter-layer insulator 7 within the two grooves, so that the two voids 8 are isolated by thin walls of the third inter-layer insulator 7 from the second level interconnection 4 and the two extra metal interconnections 6. Each of the two voids 8 extends symmetrical with reference to the center line extending on the center of the metal plug 5 or the second connecting part of the second level interconnection and also extending in a direction perpendicular to the longitudinal direction of the first level and second level interconnections 2 and 4 as well as the two extra metal interconnections 6. Opposite ends of each of the two voids 8 are positioned in correspondence with the opposite ends of the extra metal interconnections 6 in the view perpendicular to the longitudinal direction of the first level and second level interconnections 2 and 4 as well as the two extra metal interconnections 6. Namely, the two voids 8 are sandwiched between the second level interconnection 4 and the two extra metal interconnections 6.

The first level interconnection 2 and the second level interconnection 4 may be made of aluminum. The metal plug 5 may be made of tungsten or aluminum. Alternatively, each of the first level interconnection 2 and the second level interconnection 4 may comprise laminations of a barrier metal layer such as a titanium nitride layer and an anti-reflecting film. In order to reduce a parasitic capacitance between the first level interconnection 2 and the second level interconnection 4, it is preferable that the first, second and third inter-layer insulators 1, 3 and 7 are made of an insulating material having a relatively low dielectric constant, for example, fluorine containing silicon oxide having a dielectric constant in the range of about 3.2 to about 3.5. The first, second and third fluorine containing silicon oxide inter-layer insulators 1, 3 and 7 may be deposited by a high density plasma enhanced chemical vapor deposition method in order to obtain a global planarization or an entire planarization and to allow the grooves to be filled with the third interlayer insulator 7. The first, second and third fluorine containing silicon oxide inter-layer insulators 1, 3 and 7 have a relatively high hygroscopicity, for which reason the passivation film 9 has to be made of an insulating material having a relatively low hygroscopicity, for example, one of polyimide resins or nitrogen containing silicon oxide, whereby the passivation film 9 prevents any substantive permeation of moisture into the third inter-layer insulator 7. This means that the passivation film 9 protects the second level interconnection 4, the metal plug 5 and the first level interconnection 2 as well as the extra metal interconnections 6 from the moisture.

The first level interconnection 2 and the second level interconnection 4 are connected to circuits for selecting a redundancy circuit, so that, upon electrical disconnection between the first level interconnection 2 and the second level interconnection 4, the defective circuit comes non-selected whilst the redundancy circuit comes selected. The electrical disconnection between the first level interconnection 2 and the second level interconnection 4 may be obtained by irradiation of a pulse laser beam toward the second connecting part of the second level interconnection 4 as a target in order to cause a rapid and explosive evaporation of the second connecting part of the second level interconnection 4.

Figure 6A:
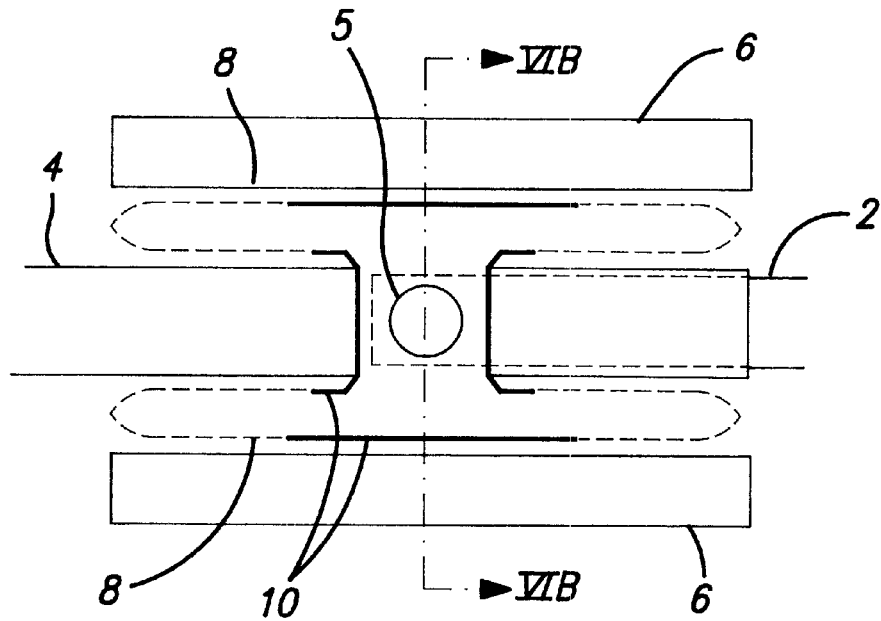
FIG. 6A is a fragmentary plan view illustrative of a fuse structure comprising a metal plug connecting first and second level interconnections in an inter-layer insulator and voids extending at the same level as the second level interconnection and along opposite sides of the second level interconnection after the fuse structure was disconnected by an irradiation of a laser beam in a first embodiment in accordance with the present invention.
Figure 6B:
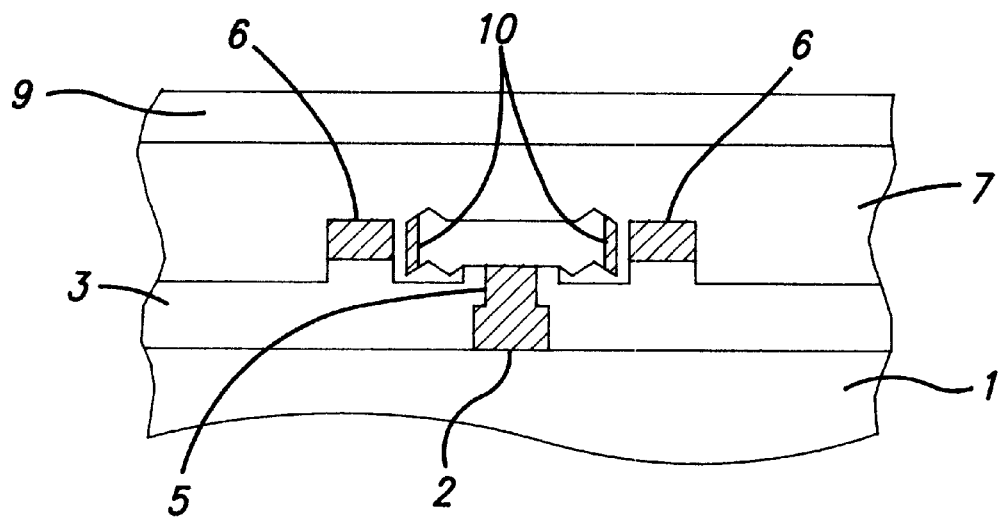
FIG. 6B is a fragmentary cross sectional elevation view illustrative of the fuse structure of FIG. 6A taken along an VIB—VIB line in FIG. 6A in a first embodiment in accordance with the present invention.

With reference to FIGS. 6A and 6B, a pulse laser beam is irradiated toward the second connecting part of the second level interconnection 4 as a target so that the pulse laser beam penetrates through the passivation film 9 and the third inter-layer insulator 7 to be irradiated onto the second connecting part of the second level interconnection 4, where the pulse laser beam is absorbed by the second connecting part of the second level interconnection 4. Namely, the second connecting part of the second level interconnection 4 receives a large thermal energy, so that the second connecting part of the second level interconnection 4 shows a rapid and explosive evaporation, whereby the thin walls of the third inter-layer insulator between the second connecting part of the second level interconnection 4 and the two voids 8 are broken by the above explosive evaporation of the second connecting part of the second level interconnection 4 and thus the two voids 8 are connected with the second connecting part of the second level interconnection 4. As a result of the explosive evaporation of the second connecting part of the second level interconnection 4, the explosively evaporated material such as aluminum of the second connecting part of the second level interconnection 4 is explosively blown into the two voids 8, whereby the evaporated material is then deposited on inner walls of the two voids 8 thereby forming deposited metal films 10 on the inner walls of the voids 8, whilst substantially no second connecting part of the second level interconnection 4 resides over the metal plug 5. As a result, the metal plug 5 is electrically disconnected from the second level interconnection 4 missing the second connecting part. Therefore, the second level interconnection 4 is electrical disconnected from the first level interconnection 2. Upon electrical disconnection between the first level interconnection 2 and the second level interconnection 4, the defective circuit comes non-selected whilst the redundancy circuit comes selected.

As a laser beam source, there may be used a solid-state semiconductor excited dimer laser having a wavelength in the range of about 1–1.3 micrometers. An aperture diameter of the solid-state semiconductor excited dimer laser is slightly larger than the width of the second level interconnection 4 so that at least an entirety of the second connecting part of the second level interconnection receives the irradiation of the pulse laser beam so that the entire part of the second connecting part of the second level interconnection 4 shows the rapid and explosive evaporation. As described above, however, the second level interconnection 4 has the extension and is wider than the first level interconnection 2, for which reason the first connecting part of the first level interconnection 2 and the adjacent part thereof to the first connecting part are covered by the extension and the second connecting part of the second level interconnection 4, whereby the first level interconnection 2 is free from any irradiation of the pulse laser beam, for which reason the first level interconnection 2 is free from any unintended electrical disconnection.

The existence of the two voids adjacent to the second connecting part of the second level interconnection 4 but separated by the thin walls of the third inter-layer insulator 7 from the second connecting part of the second level interconnection 4 allows that, upon irradiation of the pulse laser beam toward the second connecting part of the second level interconnection 4, the second connecting part of the second level interconnection 4 is explosively evaporated and then the evaporated material of the second connecting part of the second level interconnection 4 is explosively brown through the broken thin walls of the third inter-layer insulator 7 into the two voids 8 before the evaporated material is deposited onto the inner walls of the two voids 8 thereby forming deposited metal films 10 on the inner walls of the voids 8, whilst substantially no evaporated material of the second connecting part of the second level interconnection 4 resides over the metal plug 5, resulting in a certain electrical disconnection between the second level interconnection 4 is electrically disconnected from the first level interconnection 2.

Further, the existence of the passivation film 9 having the relatively low hygroscopicity prevents any substantive permeation of moisture into the third inter-layer insulator 7, whereby the passivation film 9 protects the second level interconnection 4, the metal plug 5 and the first level interconnection 2 as well as the extra metal interconnections 6 from the permeation of the moisture, whereby the second level interconnection 4, the metal plug 5 and the first level interconnection 2 as well as the extra metal interconnections 6 are free from erosion due to the moisture permeation.

Each of the first inter-layer insulator 1, the second inter-layer insulator 3, and the third inter-layer insulator 7 may be made by both a high density plasma enhanced chemical vapor deposition of fluorine containing silicon oxide having a low dielectric constant but a high hygroscopicity and subsequent chemical mechanical polishing method to form a planar surface thereof.

Each of the two voids 8 may be made as follows. The extra metal interconnections 6 and the second level interconnection 4 are formed so that the extra metal interconnections 6 extend in parallel to but are distanced from the second level interconnection 4, wherein it is important that the distance between the second level interconnection 4 and each of the extra metal interconnections 6 is sufficiently narrow but the extra metal interconnections 6 are sufficiently long. Thereafter, the second level interconnection 4 and the extra metal interconnections 6 arm used as masks for etching surface regions of the second inter-layer insulator 3 between the second level interconnection 4 and the extra metal interconnections 6, so that fine and slender grooves 8a are formed between thee second level interconnection 4 and the extra metal interconnections 6. The third inter-layer insulator 5 is deposited by using the high density plasma enhanced chemical vapor deposition system, wherein a radio frequency bias voltage is applied to a substrate, over which the first inter-layer insulator 1 extends, in order to cause a sputtering effect. The applied bias voltage to the substrate is adjusted so that the fine and slender grooves 8a defined between the second level interconnection 4 and the extra metal interconnections 6 are incompletely filled with the third inter-layer insulator 7, whereby the voids 8 are thus formed within the fine and slender grooves 8a which are isolated by thin walls of the third inter-layer insulator 7 from the second level interconnection 4 and the extra metal interconnections 6.

From the above descriptions, it can be understood that an object of providing the extra metal interconnections 6 is only to form the voids 8 by combining the high density plasma enhanced chemical vapor deposition method with the radio frequency bias voltage application to the substrate under voltage adjustment. Therefore, the extra metal interconnections 6 are not essential for the present invention in the structural viewpoints.

A second embodiment according to the present invention will be described in detail with reference to FIGS. 7A, 7B, 8A and 8B.

Figure 7B:
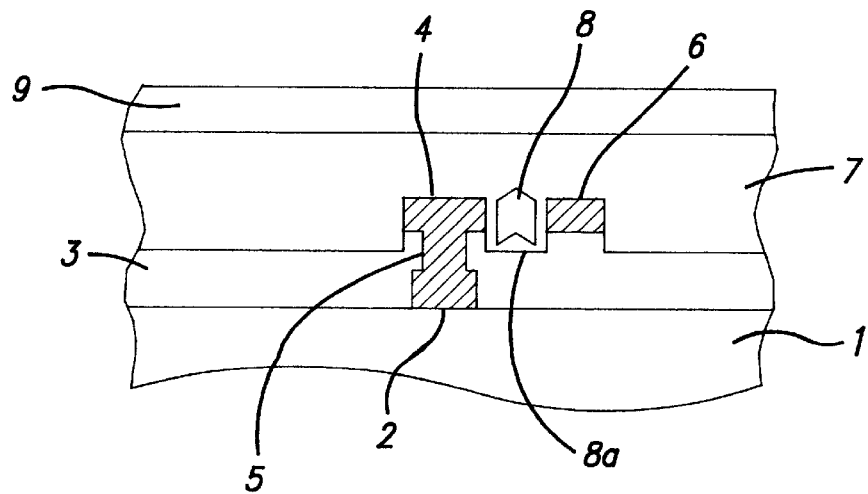
FIG. 7B is a fragmentary cross sectional elevation view illustrative of individual one of the fuse structures of FIG.

With reference to FIG. 7B, the following description is made directed to individual one of the novel fuse structures aligned, each of which comprises a metal plug connecting first and second level interconnections in an inter-layer insulator and a single void extending at the same level as the second level interconnection and along a predetermined one side of the second level interconnection before the selected ones of the fuse structures are disconnected by an irradiation of laser beams.

A first level interconnection 2 extends over a first inter-layer insulator 1. A second inter-layer insulator 3 overlies the first inter-layer insulator 1 and the first level interconnection 2. The second inter-layer insulator 3 has a via hole within which a metal plug 5 is filled. Namely, the metal plug 5 is buried within the second inter-layer insulator 3. The metal plug 5 is electrically connected to a first connecting part of the first level interconnection. A second level interconnection 4 extends over the second inter-layer insulator 3 so that a second connecting part of the second level interconnection 4 is positioned over the via hole, whereby the second connecting part of the second level interconnection 4 is electrically connected to the metal plug 5. As a result, the first level interconnection 2 and the second level interconnection 4 are electrically connected through the metal plug 5 to each other. The first level interconnection 2 and the second level interconnection 4 extend in anti-parallel directions, for example, opposite directions. The first level interconnection 2 and the second level interconnection 4 have the same longitudinal Action. A first longitudinal axis of the first level interconnection 2 is aligned with a second longitudinal axis of the second level interconnection 4 in a plane view. The second connecting part of the second level interconnection 4 overlaps the first connecting part of the first level interconnection 2 in the plane view.

The second level interconnection 4 has an extension extending from the second connecting part in the same direction as the first level interconnection extends, so that the extension of the second level interconnection 4 overlaps an adjacent part of the first level interconnection 2 to the first connecting part. The second level interconnection 4 is wider than the first level interconnection 2 so that the second connecting part and the extension of the second level interconnection 4 cover the first connecting part of the first level interconnection 2 and the adjacent part thereof to the first connecting part in the plane view.

A single extra metal interconnection 6 extends over the second inter-layer insulator 3. The single extra metal interconnection 6 extends in predetermined one side of the second level interconnection 4. The single extra metal interconnection 6 has the same level as the second level interconnection 4. The single extra metal interconnection 6 extends in parallel to the second level interconnection 4 and is distanced from the second level interconnection 4 to form a single slender groove defined between the second level interconnection 4 and the single extra metal interconnection 6. The single extra metal interconnection 6 extends symmetrical with reference to a center line extending on a center of the metal plug 5 or the second connecting part of the second level interconnection 4 and also extending in a direction perpendicular to the longitudinal direction of the first level and second level interconnections 2 and 4 as well as the single extra metal interconnection 6. One end of the single extra metal interconnection 6 is positioned in correspondence with the end of the extension of the second level interconnection 4 in a view perpendicular to the longitudinal direction of the first level and second level interconnections 2 and 4 as well as the single extra metal interconnection 6. A third inter-layer insulator 7 overlies the second inter-layer insulator 3 and the second level interconnection 4 as well as the single extra metal interconnection 6, whereby the second level interconnection 4 and the single extra metal interconnection 6 are buried in the third level interconnection 7. A passivation film 9 extends over the inter-layer insulator 7 so that an entire surface of the third inter-layer insulator 7 is covered by the passivation film 9.

A single void 8 extends through the third inter-layer insulator 7 within the single slender groove defined between the second level interconnection 4 and the single extra metal interconnection 6. The single void 8 extends in parallel to the second level interconnection 4 and the single extra metal interconnection 6. The single void 8 extends at the same level as the second level interconnection 4 and the single extra metal interconnection 6. The single void 8 extends between the second level interconnection 4 and the single extra metal interconnection 6. The single void 8 is surrounded by the third inter-layer insulator 7 within the single groove, so that the single void 8 is isolated by thin walls of the third inter-layer insulator 7 from the second level interconnection 4 and the single extra metal interconnection 6. The single void 8 extends symmetrical with reference to the center line extending on the center of the metal plug 5 or the second connecting part of the second level interconnection and also extending in a direction perpendicular to the longitudinal direction of the first level and second level interconnections 2 and 4 as well as the single extra metal interconnection 6. Opposite ends of the single void 8 is positioned in correspondence with the opposite ends of the extra metal interconnection 6 in the view perpendicular to the longitudinal direction of the first level and second level interconnections 2 and 4 as well as the single extra metal interconnection 6. Namely, the single void 8 is sandwiched between the second level interconnection 4 and the single extra metal interconnection 6.

The first level interconnection 2 and the second level interconnection 4 may be made of aluminum. The metal plug 5 may be made of tungsten or aluminum. Alternatively, each of the first level interconnection 2 and the second level interconnection 4 may comprise laminations of a barrier metal layer such as a titanium nitride layer and an anti-reflecting film. In order to reduce a parasitic capacitance between the first level interconnection 2 and the second level interconnection 4, it is preferable that the first, second and third inter-layer insulators 1, 3 and 7 are made of an insulating material having a relatively low dielectric constant, for example, fluorine containing silicon oxide having a dielectric constant in the range of about 3.2 to about 3.5. The first, second and third fluorine containing silicon oxide inter-layer insulators 1, 3 and 7 may be deposited by a high density plasma enhanced chemical vapor deposition method in order to obtain a global planarization or an entire planarization and to allow the groove to be filled with the third interlayer insulator 7. The first, second and third fluorine containing silicon oxide inter-layer insulators 1, 3 and 7 have a relatively high hygroscopicity, for which reason the passivation film 9 has to be made of an insulating material having a relatively low hygroscopicity, for example, one of polyimide resins or nitrogen containing silicon oxide, whereby the passivation film 9 prevents any substantive permeation of moisture into the third inter-layer insulator 7. This means that the passivation film 9 protects the second level interconnection 4, the metal plug 5 and the first level interconnection 2 as well as the extra metal interconnection 6 from the moisture.

With reference to FIG. 7A, the above plurality of fuse structures including the voids 8 are aligned. As described above, the single void 8 is provided to individual one of the metal plug connecting the first level interconnection and the second level interconnection, whereby it is possible to increase the density of the integration of the fuse structures or reduce the area of the fuse structure array as compared to when the dual voids 8 are provided to the individual one of the metal plug.

The first level interconnection 2 and the second level interconnection 4 are connected to circuits for selecting a redundancy circuit, so that, upon electrical disconnection between the first level interconnection 2 and the second level interconnection 4, the defective circuit comes non-selected whilst the redundancy circuit comes selected. The electrical disconnection between the first level interconnection 2 and the second level interconnection 4 may be obtained by irradiation of a pulse laser beam toward the second connecting part of the second level interconnection 4 as a target in order to cause a rapid and explosive evaporation of the second connecting part of the second level interconnection 4.

With reference to FIG. 8B, the description will focus on the selected one of the fuses to be electrically disconnected. A pulse laser beam is irradiated toward the second connecting part of the second level interconnection 4 as a target so that the pulse laser beam penetrates through the passivation film 9 and the third inter-layer insulator 7 to be irradiated onto the second connecting part of the second level interconnection 4, where the pulse laser beam is absorbed by the second connecting part of the second level interconnection 4. Namely, the second connecting part of the second level interconnection 4 receives a large thermal energy, so that the second connecting part of the second level interconnection 4 shows a rapid and explosive evaporation, whereby the thin wall of the third inter-layer insulator between the second connecting part of the second level interconnection 4 and the single void 8 is broken by the above explosive evaporation of the second connecting part of the second level interconnection 4 and thus the single void 8 is connected with the second connecting part of the second level interconnection 4. As a result of the explosive evaporation of the second connecting part of the second level interconnection 4, the explosively evaporated material such as aluminum of the second connecting part of the second level interconnection 4 is explosively blown into the single void 8, whereby the evaporated material is then deposited on inner walls of the single void 8 thereby forming deposited metal films 10 on the inner walls of the void 8, whilst substantially no second connecting part of the second level interconnection 4 resides over the metal plug 5. As a result, the metal plug 5 is electrically disconnected from the second level interconnection 4 missing the second connecting part. Therefore, the second level interconnection 4 is electrically disconnected from the first level interconnection 2. Upon electrical disconnection between the first level interconnection 2 and the second level interconnection 4, the defective circuit comes non-selected whilst the redundancy circuit comes selected.

As a laser beam source, there may be used a solid-state semiconductor excited dimer laser having a wavelength in the range of about 1–1.3 micrometers. An aperture diameter of the solid-state semiconductor excited dimer laser is slightly larger than the width of the second level interconnection 4 so that at least an entire of the second connecting part of the second level interconnection receives the irradiation of the pulse laser beam so that the entire part of the second connecting part of the second level interconnection 4 shows the rapid and explosive evaporation. As described above, however, the second level interconnection 4 has the extension and is wider than the first level interconnection 2, for which reason the first connecting part of the first level interconnection 2 and the adjacent part thereof to the first connecting part are covered by the extension and the second connecting part of the second level interconnection 4, whereby the first level interconnection 2 is free from any irradiation of the pulse laser beam, for which reason the fist level interconnection 2 is free from any unintended electrical disconnection.

With reference to FIG. 8A, selected two of the fuse structures aligned are electrically disconnected by irradiation of the pulse laser beams in order to switch from the defective circuits into the redundancy circuits.

The existence of the single void adjacent to the second connecting part of the second level interconnection 4 but separated by the thin wall of the third inter-layer insulator 7 from the second connecting part of the second level interconnection 4 allows that, upon irradiation of the pulse laser beam toward the second connecting part of the second level interconnection 4, the second connecting part of the second level interconnection 4 is explosively evaporated and then the evaporated material of the second connecting part of the second level interconnection 4 is explosively brown through the broken thin wall of the third inter-layer insulator 7 into the single void 8 before the evaporated material is deposited onto the inner walls of the single void 8 thereby forming deposited metal films 10 on the inner walls of the void 8, whilst substantially no evaporated material of the second connecting part of the second level interconnection 4 resides over the metal plug 5, resulting in a certain electrical disconnection between the second level interconnection 4 is electrically disconnected from the first level interconnection 2.

The existence of the single void in the predetermined one side of the second level interconnection 4 increases the density of the integration of the fuse structures or reduces the area of the fuse structure array as compared to when the dual voids 8 are provided to the individual one of the metal plug.

Further, the existence of the passivation film 9 having the relatively low hygroscopicity prevents any substantive permeation of moisture into the third inter-layer insulator 7, whereby the passivation film 9 protects the second level interconnection 4, the metal plug 5 and the first level interconnection 2 as well as the extra metal interconnections 6 from the permeation of the moisture, whereby the second level interconnection 4, the metal plug 5 and the first level interconnection 2 as well as the extra metal interconnections 6 are free from erosion due to the moisture permeation.

Each of the first inter-layer insulator 1, the second inter-layer insulator 3, and the third inter-layer insulator 7 may be made by both a high density plasma enhanced chemical vapor deposition of fluorine containing silicon oxide having a low dielectric constant but a high hygroscopicity and subsequent chemical mechanical polishing method to form a planar surface thereof.

The single void 8 may be made as follows. The extra metal interconnection 6 and the second level interconnection 4 are formed so that the extra metal interconnection 6 extends in parallel to but are distanced from the second level interconnection 4, wherein it is important that the distance between the second level interconnection 4 and the extra metal interconnection 6 is sufficiently narrow but the extra metal interconnection 6 is sufficiently long. Thereafter, the second level interconnection 4 and the extra metal interconnection 6 are used as masks for etching surface regions of the second inter-layer insulator 3 between the second level interconnection 4 and the extra metal interconnection 6, so that fine and slender grooves 8a are formed between the second level interconnection 4 and the extra metal interconnections 6. The third inter-layer insulator 5 is deposited by using the high density plasma enhanced chemical vapor deposition system, wherein a radio frequency bias voltage is applied to a substrate, over which the first inter-layer insulator 1 extends, in order to cause a sputtering effect. The applied bias voltage to the substrate is adjusted so that the fine and slender groove 8a defined between the second level interconnection 4 and the extra metal interconnection 6 is incompletely filled with the third inter-layer insulator 7, whereby the void 8 is thus formed within the fine and slender groove 8a which is isolated by the thin wall of the third inter-layer insulator 7 from the second level interconnection 4 and the extra metal interconnection 6.

From the above descriptions, it can be understood that an object of providing the extra metal interconnection 6 is only to form the void 8 by combining the high density plasma enhanced chemical vapor deposition method with the radio frequency bias voltage application to the substrate under voltage adjustment. Therefore, the extra metal interconnection 6 is not essential for the present invention in the structural viewpoints.

A third embodiment according to the present invention will be described in detail with reference to FIGS. 9A, 9B, 10A and 10B.

With reference to FIG. 9B, the following description is made directed to one of the novel fuse structures in array, each of which comprises a metal plug connecting first and second level interconnections in an inter-layer insulator and voids extending at the same level as the second level interconnection and along opposite sides of the second level interconnection before selected ones of the fuse structures in array are disconnected by an irradiation of laser beams.

A first level interconnection 2 extends over a fist inter-layer insulator 1. A second inter-layer insulator 3 overlies the first inter-layer insulator 1 and the first level interconnection 2. The second inter-layer insulator 3 has a via hole within which a metal plug 5 is filled. Namely, the metal plug 5 is buried within the second inter-layer insulator 3. The metal plug 5 is electrically connected to a first connecting part of the first level interconnection. A second level interconnection 4 extends over the second inter-layer insulator 3 so that a second connecting part of the second level interconnection 4 is positioned over the via hole, whereby the second connecting part of the second level interconnection 4 is electrically connected to the metal plug 5. As a result, the first level interconnection 2 and the second level interconnection 4 are electrically connected through the metal plug 5 to each other. The first level interconnection 2 and the second level interconnection 4 extend in anti-parallel directions, for example, opposite directions. The first level interconnection 2 and the second level interconnection 4 have the same longitudinal direction. A first longitudinal axis of the first level interconnection 2 is aligned with a second longitudinal axis of the second level interconnection 4 in a plan view. The second connecting part of the second level interconnection 4 overlaps the first connecting part of the first level interconnection 2 in the plan view.

The second level interconnection 4 has an extension extending from the second connecting part in the same direction as the first level interconnection extends, so that the extension of the second level interconnection 4 overlaps an adjacent part of the first level interconnection 2 to the first connecting part. The second level interconnection 4 is wider than the first level interconnection 2 so that the second connecting part and the extension of the second level interconnection 4 cover the first connecting part of the first level interconnection 2 and the adjacent part thereof to the first connecting part in the plane view.

Two extra metal interconnections 6 extend over the second inter-layer insulator 3. The two extra metal interconnections 6 extend in opposite sides of the second level interconnection 4. The two extra metal interconnections 6 have the same level as the second level interconnection 4. The two extra metal interconnections 6 extend in parallel to the second level interconnection 4 and are distanced from the second level interconnection 4 to form two slender grooves defined between the second level interconnection 4 and the two extra metal interconnections 6. Each of the two extra metal interconnections 6 extends symmetrical with reference to a center line extending on a center of the metal plug 5 or the second connecting part of the second level interconnection and also extending in a direction perpendicular to the longitudinal direction of the fist level and second level interconnections 2 and 4 as well as the two extra metal interconnections 6. One end of each of the two extra metal interconnections 6 is positioned in correspondence with the end of the extension of the second level interconnection 4 in a view perpendicular to the longitudinal direction of the first level and second level interconnections 2 and 4 as well as the two extra metal interconnections 6. A third inter-layer insulator 7 overlies the second inter-layer insulator 3 and the second level interconnection 4 as well as the two extra metal interconnections 6, whereby the second level interconnection 4 and the two extra metal interconnections 6 are buried in the third level interconnection 7. A passivation film 9 extends over the third inter-layer insulator 7 so that an entire surface of the third inter-layer insulator 7 is covered by the passivation film 9.

Two voids 8 extend through the third inter-layer insulator 7 within the two slender grooves defined between the second level interconnection 4 and the two extra metal interconnections 6. The two voids 8 extend in parallel to the second level interconnections and the two extra metal interconnections 6. The two voids 8 extend at the same level as the second level interconnection 4 and the two extra metal interconnections 6. The two voids 8 extend between the second level interconnection 4 and the two extra metal interconnections 6. The two voids 8 are surrounded by the third inter-layer insulator 7 within the two grooves, so that the two voids 8 are isolated by thin walls of the third inter-layer insulator 7 from the second level interconnection 4 and the two extra metal interconnections 6. Each of the two voids 8 extends symmetrical with reference to the center line extending on the center of the metal plug 5 or the second connecting part of the second level interconnection and also extending in a direction perpendicular to the longitudinal direction of the first level and second level interconnections 2 and 4 as well as the two extra metal interconnections 6. Opposite ends of each of the two voids 8 are positioned in correspondence with the opposite ends of the extra metal interconnections 6 in the view perpendicular to the longitudinal direction of the first level and second level interconnections 2 and 4 as well as the two extra metal interconnections 6. Namely, the two voids 8 are sandwiched between the second level interconnection 4 and the two extra metal interconnections 6.

The first level interconnection 2 and the second level interconnection 4 may be made of aluminum. The metal plug 5 may be made of tungsten or aluminum. Alternatively, each of the first level interconnection 2 and the second level interconnection 4 may comprise laminations of a barrier metal layer such as a titanium nitride layer and an anti-reflecting film. In order to reduce a parasitic capacitance between the first level interconnection 2 and the second level interconnection 4, it is preferable that the first, second and third inter-layer insulators 1, 3 and 7 are made of an insulating material having a relatively low dielectric constant, for example, fluorine containing silicon oxide having a dielectric constant in the range of about 3.2 to about 3.5. The first, second and third fluorine containing silicon oxide inter-layer insulators 1, 3 and 7 may be deposited by a high density plasma enhanced chemical vapor deposition method in order to obtain a global planarization or an entire planarization and to allow the grooves to be filled with the third interlayer insulator 7. The first, second and third fluorine containing silicon oxide inter-layer insulators 1, 3 and 7 have a relatively high hygroscopicity, for which reason the passivation film 9 has to be made of an insulating material having a relatively low hygroscopicity, for example, one of polyimide resins or nitrogen containing silicon oxide, whereby the passivation film 9 prevents any substantive permeation of moisture into the third inter-layer insulator 7. This means that the passivation film 9 protects the second level interconnection 4, the metal plug 5 and the first level interconnection 2 as well as the extra metal interconnections 6 from the moisture.

The first level interconnection 2 and the second level interconnection 4 are connected to circuits for selecting a redundancy circuit, so that, upon electrical disconnection between the first level interconnection 2 and the second level interconnection 4, the defective circuit comes non-selected whilst the redundancy circuit comes selected. The electrical disconnection between the first level interconnection 2 and the second level interconnection 4 may be obtained by irradiation of a pulse laser beam toward the second connecting part of the second level interconnection 4 as a target in order to cause a rapid and explosive evaporation of the second connecting part of the second level interconnection 4.

With reference to FIG. 9A, the above novel fuse structures are arrayed so that the fuse structures are alternately displaced from each other in the longitudinal directions of the first level interconnection 2, the second level interconnection 4 and the two extra metal interconnections 6, whereby the adjacent two fuse structures partially overlap to each other but only individual regions having a pair of the void 8 and the extra metal interconnection 6 in the view parallel to the longitudinal directions of the first level interconnection 2, the second level interconnection 4 and the two extra metal interconnections 6. As a result, the density of the integration of the fuse structures is increased up to the same density as when the single void and single extra metal interconnection are provided for individual one of the fuse structure but only in the view parallel to the longitudinal directions of the first level interconnection 2, the second level interconnection 4 and the two extra metal interconnections 6.

With reference to FIG. 10B, the description will focus onto selected one of the fuse structures as electrically disconnected. A pulse laser beam is irradiated toward the second connecting part of the second level interconnection 4 as a target so that the pulse laser beam penetrates through the passivation film 9 and the third inter-layer insulator 7 to be irradiated onto the second connecting part of the second level interconnection 4, where the pulse laser beam is absorbed by the second connecting part of the second level interconnection 4. Namely, the second connecting part of the second level interconnection 4 receives a large thermal energy, so that the second connecting part of the second level interconnection 4 shows a rapid and explosive evaporation, whereby the thin walls of the third inter-layer insulator between the second connecting part of the second level interconnection 4 and the two voids 8 are broken by the above explosive evaporation of the second connecting part of the second level interconnection 4 and thus the two voids 8 are connected with the second connecting part of the second level interconnection 4. As a result of the explosive evaporation of the second connecting part of the second level interconnection 4, the explosively evaporated material such as aluminum of the second connecting part of the second level interconnection 4 is explosively blown into the two voids 8, whereby the evaporated material is then deposited on inner walls of the two voids 8 thereby forming deposited metal films 10 on the inner walls of the voids 8, whilst substantially no second connecting part of the second level interconnection 4 resides over the metal plug 5. As a result, the metal plug 5 is electrically disconnected from the second level interconnection 4 missing the second connecting part. Therefore, the second level interconnection 4 is electrically disconnected from the first level interconnection 2. Upon electrical disconnection between the first level interconnection 2 and the second level interconnection 4, the defective circuit comes non-selected whilst the redundancy circuit comes selected.

As a laser beam source, there may be used a solid-state semiconductor excited dimer laser having a wavelength in the range of about 1–1.3 micrometers. An aperture diameter of the solid-state semiconductor excited dimer laser is slightly larger than the width of the second level interconnection 4 so that at least an entire of the second connecting part of the second level interconnection receives the irradiation of the pulse laser beam so that the entire part of the second connecting part of the second level interconnection 4 shows the rapid and explosive evaporation. As described above, however, the second level interconnection 4 has the extension and is wider than the first level interconnection 2, for which reason the first connecting part of the first level interconnection 2 and the adjacent part thereof to the first connecting part are covered by the extension and the second connecting part of the second level interconnection 4, whereby the first level interconnection 2 is free from any irradiation of the pulse laser beam, for which reason the first level interconnection 2 is free from any unintended electrical disconnection.

With reference to FIG. 10A, adjacent three of the fuse structures in array are electrically disconnected to switch the defective circuits into the redundancy circuits. The above array allows that the density of the integration of the fuse structures is increased up to the same density as when the single void and single extra metal interconnection are provided for individual one of the fuse structure but only in the view parallel to the longitudinal directions of the first level interconnection 2, the second level interconnection 4 and the two extra metal interconnections 6.

The existence of the two voids adjacent to the second connecting part of the second level interconnection 4 but separated by walls of the third inter-layer insulator 7 from the second connecting part of the second level interconnection 4 allows that, upon irradiation of the pulse laser beam toward the second connecting part of the second level interconnection 4, the second connecting part of the second level interconnection 4 is explosively evaporated and then the evaporated material of the second connecting part of the second level interconnection 4 is explosively blown through the broken thin walls of the third inter-layer insulator 7 into the two voids 8 before the evaporated material is deposited onto the inner walls of the two voids 8 thereby forming deposited metal films 10 on the inner walls of the voids 8, whilst substantially no evaporated material of the second connecting part of the second level interconnection 4 resides over the metal plug 5, resulting in a certain electrical disconnection between the second level interconnection 4 is electrically disconnected from the first level interconnection 2.

Further, the existence of the passivation film 9 having the relatively low hygroscopicity prevents any substantive permeation of moisture into the third inter-layer insulator 7, whereby the passivation film 9 protects the second level interconnection 4, the metal plug 5 and the first level interconnection 2 as well as the extra metal interconnections 6 from the permeation of the moisture, whereby the second level interconnection 4, the metal plug 5 and the first level interconnection 2 as well as the extra metal interconnections 6 are free from erosion due to the moisture permeation.

Each of the first inter-layer insulator 1, the second inter-layer insulator 3, and the third inter-layer insulator 7 may be made by both a high density plasma enhanced chemical vapor deposition of fluorine containing silicon oxide having a low dielectric constant but a high hygroscopicity and subsequent chemical mechanical polishing method to form a planar surface thereof.

Each of the two voids 8 may be made as follows. The extra metal interconnections 6 and the second level interconnection 4 are formed so that the extra metal interconnections 6 extend in parallel to but are distanced from the second level interconnection 4, wherein it is important that the distance between the second level interconnection 4 and each of the extra metal interconnections 6 is sufficiently narrow but the extra metal interconnections 6 are sufficiently long. Thereafter, the second level interconnection 4 and the extra metal interconnections 6 are used as masks for etching surface regions of the second inter-layer insulator 3 between the second level interconnection 4 and the extra metal interconnections 6, so that fine and slender grooves 8a are formed between the second level interconnection 4 and the extra metal interconnections 6. The third inter-layer insulator 5 is deposited by using the high density plasma enhanced chemical vapor deposition system, wherein a radio frequency bias voltage is applied to a substrate, over which the first inter-layer insulator 1 extends, in order to cause a sputtering effect. The applied bias voltage to the substrate is adjusted so that the fine and slender grooves 8a defined between the second level interconnection 4 and the extra metal interconnections 6 are incompletely filled with the third inter-layer insulator 7, whereby the voids 8 are thus formed within the fine and slender grooves 8a which are isolated by thin walls of the third inter-layer insulator 7 from the second level interconnection 4 and the extra metal interconnections 6.

From the above descriptions, it can be understood that an object of providing the extra metal interconnections 6 is only to form the voids 8 by combining the high density plasma enhanced chemical vapor deposition method with the radio frequency bias voltage application to the substrate under voltage adjustment. Therefore, the extra metal interconnections 6 are not essential for the present invention in the structural viewpoints.

A fourth embodiment according to the present invention will be described in detail with reference to FIGS. 11A, 11B, 12A and 12B.

With reference to FIG. 11B, the following description is made directed to individual one of the novel fuse structures aligned, each of which comprises a metal plug connecting first and second level interconnections in an inter-layer insulator and a single void extending at the same level as the second level interconnection and on an extending longitudinal center line of the second level interconnection before the selected ones of the fuse structures are disconnected by an irradiation of laser beams.

A first level interconnection 2 extends over a first inter-layer insulator 1. A second inter-layer insulator 3 overlies the first inter-layer insulator 1 and the first level interconnection 2. The second inter-layer insulator 3 has a via hole within which a metal plug 5 is filled. Namely, the metal plug 5 is buried within the second inter-layer insulator 3. The metal plug 5 is electrically connected to a first connecting part of the first level interconnection. A second level interconnection 4 extends over the second inter-layer insulator 3 so that a second connecting part of the second level interconnection 4 is positioned over the via hole, whereby the second connecting part of the second level interconnection 4 is electrically connected to the metal plug 5. As a result, the first level interconnection 2 and the second level interconnection 4 are electrically connected through the metal plug 5 to each other. The first level interconnection 2 and the second level interconnection 4 extend in anti-parallel directions, for example, opposite directions. The first level interconnection 2 and the second level interconnection 4 have the same longitudinal direction. A first longitudinal axis of the first level interconnection 2 is aligned with a second longitudinal axis of the second level interconnection 4 in a plane view. The second connecting part of the second level interconnection 4 overlaps the first connecting part of the first level interconnection 2 in the plane view.

The second level interconnection 4 is wider than the first level interconnection 2 so that the second connecting part of the second level interconnection 4 cover the first connecting part of the first level interconnection 2 in the plane view.

A third inter-layer insulator 7 overlies the second inter-layer insulator 3 and the second level interconnection 4, whereby the second level interconnection 4 is buried in the third level interconnection 7. A passivation film 9 extends over the third inter-layer insulator 7 so that an entire surface of the third inter-layer insulator 7 is covered by the passivation film 9.

A single void 8 extends through the third inter-layer insulator 7 in parallel to the second level interconnection 4. The single void 8 extends at the same level as the second level interconnection 4. The single void 8 extends on an extending longitudinal center line of the second level interconnection 4, so that the single void 8 extends over the first level interconnection 2, whereby the single void 8 overlaps the adjacent part of the first level interconnection 2 to the first connecting part thereof in the plane view. The single void 8 is surrounded by the third inter-layer insulator 7, so that the single void 8 is isolated by a thin wall of the third inter-layer insulator 7 from the second connecting part as one end of the second level interconnection 4.

The first level interconnection 2 and the second level interconnection 4 may be made of aluminum. The metal plug 5 may be made of tungsten or aluminum. Alternatively, each of the first level interconnection 2 and the second level interconnection 4 may comprise laminations of a barrier metal layer such as a titanium nitride layer and an anti-reflecting film. In order to reduce a parasitic capacitance between the first level interconnection 2 and the second level interconnection 4, it is preferable that the first, second and third inter-layer insulators 1, 3 and 7 are made of an insulating material having a relatively low dielectric constant, for example, fluorine containing silicon oxide having a dielectric constant in the range of about 3.2 to about 3.5. The first, second and third fluorine containing silicon oxide inter-layer insulators 1, 3 and 7 may be deposited by a high density plasma enhanced chemical vapor deposition method in order to obtain a global planarization or an entire planarization. The first, second and third fluorine containing silicon oxide inter-layer insulators 1, 3 and 7 have a relatively high hygroscopicity, for which reason the passivation film 9 has to be made of an insulating material having a relatively low hygroscopicity, for example, one of polyimide resins or nitrogen containing silicon oxide, whereby the passivation film 9 prevents any substantive permeation of moisture into the third inter-layer insulator 7. This means that the passivation film 9 protects the second level interconnection 4, the metal plug 5 and the first level interconnection 2 from the moisture.

With reference to FIG. 11A, the above plurality of fuse structures including the voids 8 are aligned. As described above, the single void 8 is provided to individual one of the metal plug connecting the first level interconnection and the second level interconnection, so that the single void 8 extends on the extending longitudinal center line of the second level interconnection 4 and overlaps the adjacent part of the first level interconnection to the first connecting part thereof, whereby it is possible to further increase the density of the integration of the fuse structures or reduce the area of the fuse structure array as compared to when the single void 8 is provided to the individual one of the metal plug and in the predetermined one side of the second level interconnection 4.

The first level interconnection 2 and the second level interconnection 4 are connected to circuits for selecting a redundancy circuit, so that, upon electrical disconnection between the first level interconnection 2 and the second level interconnection 4, the defective circuit comes non-selected whilst the redundancy circuit comes selected. The electrical disconnection between the first level interconnection 2 and the second level interconnection 4 may be obtained by irradiation of a pulse laser beam toward the second connecting part of the second level interconnection 4 as a target in order to cause a rapid and explosive evaporation of the second connecting part of the second level interconnection 4.

With reference to FIG. 12B, the description will focus on the selected one of the fuse to be electrically disconnected. A pulse laser beam is irradiated toward the second connecting part of the second level interconnection 4 as a target so that the pulse laser beam penetrates through the passivation film 9 and the third inter-layer insulator 7 to be irradiated onto the second connecting part of the second level interconnection 4, where the pulse laser beam is absorbed by the second connecting part of the second level interconnection 4. Namely, the second connecting part of the second level interconnection 4 receives a large thermal energy, so that the second connecting part of the second level interconnection 4 shows a rapid and explosive evaporation, whereby the thin wall of the third inter-layer insulator between the second connecting part of the second level interconnection 4 and the single void 8 is broken by the above explosive evaporation of the second connecting part of the second level interconnection 4 and thus the single void 8 is connected with the second connecting part of the second level interconnection 4. As a result of the explosive evaporation of the second connecting part of the second level interconnection 4, the explosively evaporated material such as aluminum of the second connecting part of the second level interconnection 4 is explosively blown into the single void 8, whereby the evaporated material is then deposited on inner walls of the single void 8 thereby forming deposited metal films 10 on the inner walls of the void 8, whilst substantially no second connecting part of the second level interconnection 4 resides over the metal plug 5. As a result, the metal plug 5 is electrically disconnected from the second level interconnection 4 missing the second connecting part. Therefore, the second level interconnection 4 is electrically disconnected from the first level interconnection 2. Upon electrical disconnection between the first level interconnection 2 and the second level interconnection 4, the defective circuit comes non-selected whilst the redundancy circuit comes selected.

As a laser beam source, there may be used a solid-state semiconductor excited dimer laser having a wavelength in the range of about 1–1.3 micrometers. An aperture diameter of the solid-state semiconductor excited dimer laser is slightly larger than the width of the second level interconnection 4 so that at least an entire of the second connecting part of the second level interconnection receives the irradiation of the pulse laser beam so that the entire part of the second connecting part of the second level interconnection 4 shows the rapid and explosive evaporation. As described above, however, the second level interconnection 4 is wider than the first level interconnection 2, for which reason the first connecting part of the first level interconnection 2 is covered by the second connecting part of the second level interconnection 4, whereby the first level interconnection 2 is free from any irradiation of the pulse laser beam, for which reason the first level interconnection 2 is free from any unintended electrical disconnection. The pulse laser beam may be irradiated in an oblique direction toward the same direction as the second level interconnection 4 extends so that interconnection the first level interconnection 2 adjacent to the first connecting part thereof is ensured to be free from any irradiation of the pulse laser beam.

With reference to FIG. 12A, selected two of the fuse structures aligned are electrically disconnected by irradiation of the pulse laser beams in order to switch from the defective circuits into the redundancy circuits.

The existence of the single void adjacent to the second connecting part of the second level interconnection 4 but separated by the thin wall of the third inter-layer insulator 7 from the second connecting part of the second level interconnection 4 allows that, upon irradiation of the pulse laser beam toward the second connecting part of the second level interconnection 4, the second connecting part of the second level interconnection 4 is explosively evaporated and then the evaporated material of the second connecting part of the second level interconnection 4 is explosively blown through the broken thin wall of the third inter-layer insulator 7 into the single void 8 before the evaporated material is deposited onto the inner walls of the single void 8 thereby forming deposited metal films 10 on the inner walls of the void 8, whilst substantially no evaporated material of the second connecting part of the second level interconnection 4 resides over the metal plug 5, resulting in a certain electrical disconnection between the second level interconnection 4 is electrically disconnected from the first level interconnection 2.

The existence of the single void on the extending longitudinal center line of the second level interconnection 4 and overlapping the adjacent part of the first level interconnection 2 to the first connecting part increases the density of the integration of the fuse structures or reduces the area of the fuse structure array as compared to when the single void 8 is provided to the individual one of the metal plug but in the predetermined one side of the second level interconnection 4.

Further, the existence of the passivation film 9 having the relatively low hygroscopicity prevents any substantive permeation of moisture into the third inter-layer insulator 7, whereby the passivation film 9 protects the second level interconnection 4, the metal plug 5 and the first level interconnection 2 from the permeation of the moisture, whereby the second level interconnection 4, the metal plug 5 and the first level interconnection 2 are free from erosion due to the moisture permeation.

Each of the first inter-layer insulator 1, the second inter-layer insulator 3, and the third inter-layer insulator 7 may be made by both a high density plasma enhanced chemical vapor deposition of fluorine containing silicon oxide having a low dielectric constant but a high hygroscopicity and subsequent chemical mechanical polishing method to form a planer surface thereof.

A fifth embodiment according to the present invention will be described in detail with reference to FIGS. 13A, 13B, 14A and 14B.

With reference to FIG. 13B, the following description is made directed to individual one of the novel fuse structures aligned, each of which comprises a metal plug connecting first and second level interconnections in an inter-layer insulator and a single void extending at a higher level than the second level interconnection and over the second connecting part of the second level interconnection before the selected ones of the fuse structures are disconnected by an irradiation of laser beams.

A first level interconnection 2 extends over a first inter-layer insulator 1. A second inter-layer insulator 3 overlies the first inter-layer insulator 1 and the first level interconnection 2. The second inter-layer insulator 3 has a via hole within which a metal plug 5 is filled. Namely, the metal plug 5 is buried within the second inter-layer insulator 3. The metal plug 5 is electrically connected to a first connecting part of the first level interconnection. A second level interconnection 4 extends over to second inter-layer insulator 3 so that a second connecting part of the second level interconnection 4 is positioned over the via hole, whereby the second connecting part of the second level interconnection 4 is electrically connected to the metal plug 5. As a result, the first level interconnection 2 and the second level interconnection 4 are electrically connected through the metal plug 5 to each other. The first level interconnection 2 and the second level interconnection 4 extend in anti-parallel directions, for example, opposite directions. The first level interconnection 2 and the second level interconnection 4 have the same longitudinal direction. A first longitudinal axis of the first level interconnection 2 is aligned with a second longitudinal axis of the second level interconnection 4 in a plane view. The second connecting part of the second level interconnection 4 overlaps the first connecting part of the first level interconnection 2 in the plane view.

The second level interconnection 4 has an extension extending from the second connecting part in the same direction as the first level interconnection extends, so that the extension of the second level interconnection 4 overlaps an adjacent part of the first level interconnection 2 to the first connecting part. The second level interconnection 4 is wider than the first level interconnection 2 so that the second connecting part and the extension of the second level interconnection 4 cover the first connecting part of the first level interconnection 2 and the adjacent part thereof to the first connecting part in the plan view.

A third inter-layer insulator 7 overlies the second inter-layer insulator 3 and the second level interconnection 4, whereby the second level interconnection 4 is buried in the third level interconnection 7. A passivation film 9 extends over the third inter-layer insulator 7 so that an entire surface of the third inter-layer insulator 7 is covered by the passivation film 9.

A single void 8 extends through the third inter-layer insulator 7 in parallel to the second level interconnection 4. The single void 8 extends at a higher level than the second level interconnection 4. The single void 8 extends over the second connecting part of the second level interconnection 4. The single void 8 is surrounded by the third inter-layer insulator 7, so that the single void 8 is isolated by a thin wall of the third inter-layer insulator 7 from the second connecting part of the second level interconnection 4.

The first level interconnection 2 and the second level interconnection 4 may be made of aluminum. The metal plug 5 may be made of tungsten or aluminum. Alternatively, each of the first level interconnection 2 and the second level interconnection 4 may comprise laminations of a barrier metal layer such as a titanium nitride layer and an anti-reflecting film. In order to reduce a parasitic capacitance between the first level interconnection 2 and the second level interconnection 4, it is preferable that the first, second and third inter-layer insulators 1, 3 and 7 are made of an insulating material having a relatively low dielectric constant, for example, fluorine containing silicon oxide having a dielectric constant in the range of about 3.2 to about 3.5. The first, second and third fluorine containing silicon oxide inter-layer insulators 1, 3 and 7 may be deposited by a high density plasma enhanced chemical vapor deposition method in order to obtain a global planarization or an entire planarization. The first, second and third fluorine containing silicon oxide inter-layer insulators 1, 3 and 7 have a relatively high hygroscopicity, for which reason the passivation film 9 has to be made of an insulating material having a relatively low hygroscopicity, for example, one of polyimide resins or nitrogen containing silicon oxide, whereby the passivation film 9 prevents any substantive permeation of moisture into the third inter-layer insulator 7. This means that the passivation film 9 protects the second level interconnection 4, the metal plug 5 and the first level interconnection 2 from the moisture.

With reference to FIG. 13A, the above plurality of fuse structures including the voids 8 are aligned. As described above, the single void 8 is provided to individual one of the metal plug connecting the first level interconnection and the second level interconnection, so that the single void 8 extends over the second connecting part of the second level interconnection 4 and overlaps the adjacent part of the first level interconnection to the first connecting part thereof, whereby it is possible to further increase the density of the integration of the fuse structures or reduce the area of the fuse structure array as compared to when the single void 8 is provided to the individual one of the metal plug and in the predetermined one side of the second level interconnection 4.

The first level interconnection 2 and the second level interconnection 4 are connected to circuits for selecting a redundancy circuit, so that, upon electrical disconnection between the first level interconnection 2 and the second level interconnection 4, the defective circuit comes non-selected whilst the redundancy circuit comes selected. The electrical disconnection between the first level interconnection 2 and the second level interconnection 4 may be obtained by irradiation of a pulse laser beam toward the second connecting part of the second level interconnection 4 as a target in order to cause a rapid and explosive evaporation of the second connecting part of the second level interconnection 4.

With reference to FIG. 14B, the description will focus on the selected one of the fuse to be electrically disconnected. A pike laser beam is irradiated toward the second connecting part of the second level interconnection 4 as a target so that the pulse laser beam penetrates through the passivation film 9 and the third inter-layer insulator 7 and further through the void 8 to be irradiated onto the second connecting part of the second level interconnection 4, where the pulse laser beam is absorbed by the second connecting part of the second level interconnection 4. Namely, the second connecting part of the second level interconnection 4 receives a large thermal energy, so that the second connecting part of the second level interconnection 4 shows a rapid and explosive evaporation, whereby the thin wall of the third inter-layer insulator between the second connecting part of the second level interconnection 4 and the single void 8 is broken by the above explosive evaporation of the second connecting part of the second level interconnection 4 and thus the single void 8 is connected with the second connecting part of the second level interconnection 4. As a result of the explosive evaporation of the second connecting part of the second level interconnection 4, the explosively evaporated material such as aluminum of the second connecting part of the second level interconnection 4 is explosively blown into the single void 8, whereby the evaporated material is then deposited on inner walls of the single void 8 thereby forming deposited metal films 10 on the inner walls of the void 8, whilst substantially no second connecting part of the second level interconnection 4 resides over the metal plug 5. As a result, the metal plug 5 is electrically disconnected from the second level interconnection 4 missing the second connecting part. Therefore, the second level interconnection 4 is electrically disconnected from the first level interconnection 2. Upon electrical disconnection between the first level interconnection 2 and the second level interconnection 4, the defective circuit comes non-selected whilst the redundancy circuit comes selected.

As a laser beam source, there may be used a solid-state semiconductor excited dimer laser having a wavelength in the range of about 1–1.3 micrometers. An aperture diameter of the solid-state semiconductor excited dimer laser is slightly larger than the width of the second level interconnection 4 so that at least an entire of the second connecting part of the second level interconnection receives the irradiation of the pulse laser beam so that the entire part of the second connecting part of the second level interconnection 4 shows the rapid and explosive evaporation. As described above, however, the second level interconnection 4 has the extension and is wider than the first level interconnection 2, for which reason the first connecting part of the first level interconnection 2 and the adjacent part thereof to the first connecting part are covered by the extension and the second connecting part of the second level interconnection 4, whereby the first level interconnection 2 is free from any irradiation of the pulse laser beam, for which reason the first level interconnection 2 is free from any unintended electrical disconnection.

With reference to FIG. 14A, selected two of the fuse structures aligned are electrically disconnected by irradiation of the pulse laser beams in order to switch from the defective circuits into the redundancy circuits.

The existence of the single void adjacent to the second connecting part of the second level interconnection 4 but separated by the thin wall of the third inter-layer insulator 7 from the second connecting part of the second level interconnection 4 allows that, upon irradiation of the pulse laser beam toward the second connecting part of the second level interconnection 4, the second connecting part of the second level interconnection 4 is explosively evaporated and then the evaporated material of the second connecting part of the second level interconnection 4 is explosively blown through the broken thin wall of the third inter-layer insulator 7 into the single void 8 before the evaporated material is deposited onto the inner walls of the single void 8 thereby forming deposited metal films 10 on the inner walls of the void 8, whilst substantially no evaporated material of the second connecting part of the second level interconnection 4 resides over the metal plug 5, resulting in a certain electrical disconnection between the second level interconnection 4 is electrically disconnected from the first level interconnection 2.

The existence of the single void over the second connecting part of the second level interconnection 4 increases the density of the integration of the fuse structures or reduces the area of the fuse structure array as compared to when the single void 8 is provided to the individual one of the metal plug but in the predetermined one side of the second level interconnection 4.

Further, the existence of the passivation film 9 having the relatively low hygroscopicity prevents any substantive permeation of moisture into the third inter-layer insulator 7, whereby the passivation film 9 protects the second level interconnection 4, the metal plug 5 and the first level interconnection 2 from the permeation of the moisture, whereby the second level interconnection 4, the metal plug 5 and the first level interconnection 2 are free from erosion due to the moisture permeation.

Each of the first inter-layer insulator 1, the second inter-layer insulator 3, and the third inter-layer insulator 7 may be made by both a high density plasma enhanced chemical vapor deposition of fluorine containing silicon oxide having a low dielectric constant but a high hygroscopicity and subsequent chemical mechanical polishing method to form a planar surface thereof.

A sixth embodiment according to the present invention will be described in detail with reference to FIGS. 15A, 15B, 16A and 16B.

With reference to FIGS. 15A and 15B, the following description is made directed to individual one of the novel fuse structures aligned, each of which comprises a metal plug connecting first and second level interconnections in an inter-layer insulator and a single vertically extending U-shaped void extending from the same level as up to a higher level than the second level interconnection and over and opposite sides of the second connecting part of the second level interconnection before the selected ones of the fuse structures are disconnected by an irradiation of laser beams.

A first level interconnection 2 extends over a first inter-layer insulator 1. A second inter-layer insulator 3 overlies the first inter-layer insulator 1 and the first level interconnection 2. The second inter-layer insulator 3 has a via hole within which a metal plug 5 is filled. Namely, the metal plug 5 is buried within the second inter-layer insulator 3. The metal plug 5 is electrically connected to a first connecting part of the first level interconnection. A second level interconnection 4 extends over the second inter-layer insulator 3 so that a second connecting part of the second level interconnection 4 is positioned over the via hole, whereby the second connecting part of the second level interconnection 4 is electrically connected to the metal plug 5. As a result, the first level interconnection 2 and the second level interconnection 4 are electrically connected through the metal plug 5 to each other. The first level interconnection 2 and the second level interconnection 4 extend in anti-parallel directions, for example, opposite directions. The first level interconnection 2 and the second level interconnection 4 have the same longitudinal direction. A first longitudinal axis of the first level interconnection 2 is aligned with a second longitudinal axis of the second level interconnection 4 in a plane view. The second connecting part of the second level interconnection 4 overlaps the first connecting part of the first level interconnection 2 in the plane view.

The second level interconnection 4 has an extension extending from the second connecting part in the same direction as the first level interconnection extends, so that the extension of the second level interconnection 4 overlaps an adjacent part of the first level interconnection 2 to the first connecting part. The second level interconnection 4 is wider than the first level interconnection 2 so that the second connecting part and the extension of the second level interconnection 4 cover the first connecting part of the first level interconnection 2 and the adjacent part thereof to the first connecting part in the plane view.

A third inter-layer insulator 7 overlies the second inter-layer insulator 3 and the second level interconnection 4, whereby the second level interconnection 4 is buried in the third level interconnection 7. A passivation film 9 extends over the third inter-layer insulator 7 so that an entire surface of the third inter-layer insulator 7 is covered by the passivation film 9.

A single vertically extending U-shaped void 8 extends through the third inter-layer insulator 7 in parallel to the second level interconnection 4. The single vertically extending U-shaped void 8 extends from the same level as up to a higher level than the second level interconnection 4. The single vertically extending U-shaped void 8 extends over and opposite sides of the second connecting part of the second level interconnection 4. The single vertically extending U-shaped void 8 is surrounded by the third inter-layer insulator 7, so that the single vertically extending U-shaped void 8 is isolated by thin walls of the third inter-layer insulator 7 from the second connecting part of the second level interconnection 4.

The first level interconnection 2 and the second level interconnection 4 may be made of aluminum. The metal plug 5 may be made of tungsten or aluminum. Alternatively, each of the first level interconnection 2 and the second level interconnection 4 may comprise laminations of a barrier metal layer such as a titanium nitride layer and an anti-reflecting film. In order to reduce a parasitic capacitance between the first level interconnection 2 and the second level interconnection 4, it is preferable that the first, second and third inter-layer insulators 1, 3 and 7 are made of an insulating material having a relatively low dielectric constant, for example, fluorine containing silicon oxide having a dielectric constant in the range of about 3.2 to about 3.5. The first, second and third fluorine containing silicon oxide inter-layer insulators 1, 3 and 7 may be deposited by a high density plasma enhanced chemical vapor deposition method in order to obtain a global planarization or an entire planarization. The first, second and third fluorine containing silicon oxide inter-layer insulators 1, 3 and 7 have a relatively high hygroscopicity, for which reason the passivation film 9 has to be made of an insulating material having a relatively low hygroscopicity, for example, one of polyimide resins or nitrogen containing silicon oxide, whereby the passivation film 9 prevents any substantive permeation of moisture into the third inter-layer insulator 7. This means that the passivation film 9 protects the second level interconnection 4, the metal plug 5 and the first level interconnection 2 from the moisture.

The first level interconnection 2 and the second level interconnection 4 are connected to circuits for selecting a redundancy circuit, so that, upon electrical disconnection between the first level interconnection 2 and the second level interconnection 4, the defective circuit comes non-selected whilst the redundancy circuit comes selected. The electrical disconnection between the first level interconnection 2 and the second level interconnection 4 may be obtained by irradiation of a pulse laser beam toward the second connecting part of the second level interconnection 4 as a target in order to cause a rapid and explosive evaporation of the second connecting part of the second level interconnection 4.

With reference to FIGS. 16A and 16B, the description will focus on the selected one of the fuse to be electrically disconnected. A pulse laser beam is irradiated toward the second connecting part of the second level interconnection 4 as a target so that the pulse laser beam penetrates through the passivation film 9 and the third inter-layer insulator 7 and further through the top portion of the vertically extending U-shaped void 8 to be irradiated onto the second connecting part of the second level interconnection 4, where the pulse laser beam is absorbed by the second connecting part of the second level interconnection 4. Namely the second connecting part of the second level interconnection 4 receives a large thermal energy, so that the second connecting part of the second level interconnection 4 shows a rapid and explosive evaporation, whereby the thin walls of the third inter-layer insulator between the second connecting part of the second level interconnection 4 and the single vertically extending U-shaped void 8 is broken by the above explosive evaporation of the second connecting part of the second level interconnection 4 and thus the single vertically extending U-shaped void 8 is connected with the second connecting part of the second level interconnection 4. As a result of the explosive evaporation of the second connecting part of the second level interconnection 4, the explosively evaporated material such as aluminum of the second connecting part of the second level interconnection 4 is explosively blown into the single vertically extending U-shaped void 8, whereby the evaporated material is then deposited on inner walls of the single vertically extending U-shaped void 8 thereby forming deposited metal films 10 on the inner walls of the vertically extending U-shaped void 8, whilst substantially no second connecting part of the second level interconnection 4 resides over the metal plug 5. As a result, the metal plug 5 is electrically disconnected from the second level interconnection 4 missing the second connecting part. Therefore, the second level interconnection 4 is electrically disconnected from the first level interconnection 2. Upon electrical disconnection between the first level interconnection 2 and the second level interconnection 4, the defective circuit comes non-selected whilst the redundancy circuit comes selected.

As a laser beam source, there may be used a solid-state semiconductor excited dimer laser having a wavelength in the range of about 1–1.3 micrometers. An aperture diameter of the solid-state semiconductor excited dimer laser is slightly larger than the width of the second level interconnection 4 so that at least an entire of the second connecting part of the second level interconnection receives the irradiation of the pulse laser beam so that the entire part of the second connecting part of the second level interconnection 4 shows the rapid and explosive evaporation. As described above, however, the second level interconnection 4 has the extension and is wider than the first level interconnection 2, for which reason the first connecting part of the first level interconnection 2 and the adjacent part thereof to the first connecting part are covered by the extension and the second connecting part of the second level interconnection 4, whereby the first level interconnection 2 is free from any irradiation of the pulse laser beam, for which reason the first level interconnection 2 is free from any unintended electrical disconnection.

The existence of the single vertically extending U-shaped void adjacent to the second connecting part of the second level interconnection 4 but separated by the thin walls of the third inter-layer insulator 7 from the second connecting part of the second level interconnection 4 allows that, upon irradiation of the pulse laser beam toward the second connecting part of the second level interconnection 4, the second connecting part of the second level interconnection 4 is explosively evaporated and then the evaporated material of the second connecting part of the second level interconnection 4 is explosively blown through the broken thin walls of the third inter-layer insulator 7 into the single vertically extending U-shaped void 8 before the evaporated material is deposited onto the inner walls of the single vertically extending U-shaped void 8 thereby forming deposited metal films 10 on the inner walls of the vertically extending U-shaped void 8, whilst substantially no evaporated material of the second connecting part of the second level interconnection 4 resides over the metal plug 5, resulting in a certain electrical disconnection between the second level interconnection 4 is electrically disconnected from the first level interconnection 2.

Further, the existence of the passivation film 9 having the relatively low hygroscopicity prevents any substantive permeation of moisture into the third inter-layer insulator 7, whereby the passivation film 9 protects the second level interconnection 4, the metal plug 5 and the first level interconnection 2 from the permeation of the moisture, whereby the second level interconnection 4, the metal plug 5 and the first level interconnection 2 are free from erosion due to the moisture permeation.

Each of the first inter-layer insulator 1, the second inter-layer insulator 3, and the third inter-layer insulator 7 may be made by both a high density plasma enhanced chemical vapor deposition of fluorine containing silicon oxide having a low dielectric constant but a high hygroscopicity and subsequent chemical mechanical polishing method to form a planer surface thereof.

A seventh embodiment according to the present invention will be described in detail with reference to FIGS. 17A, 17B, 19C, 18A, 18B and 18C.

With reference to FIGS. 17A, 17B and 17C, the following description is made directed to individual one of the novel fuse structures aligned, each of which comprises a metal plug connecting first and second level interconnections in an inter-layer insulator and a single horizontally extending U-shaped void extending at the same level as the second level interconnection and in one end and opposite sides of the second connecting part of the second level interconnection before the selected ones of the fuse structures are disconnected by an irradiation of laser beams.

A first level interconnection 2 extends over a first inter-layer insulator 1. A second inter-layer insulator 3 overlies the first inter-layer insulator 1 and the first level interconnection 2. The second inter-layer insulator 3 has a via hole within which a metal plug 5 is filled. Namely, the metal plug 5 is buried within the second inter-layer insulator 3. The metal plug 5 is electrically connected to a first connecting part of the first level interconnection. A second level interconnection 4 extends over the second inter-layer insulator 3 so that a second connecting part of the second level interconnection 4 is positioned over the via hole, whereby the second connecting part of the second level interconnection 4 is electrically connected to the metal plug 5. As a result, the first level interconnection 2 and the second level interconnection 4 are electrically connected through the metal plug 5 to each other. The first level interconnection 2 and the second level interconnection 4 extend in anti-parallel diccons, for example, opposite directions. The first level interconnection 2 and the second level interconnection 4 have the same longitudinal direction. A first longitudinal axis of the first level interconnection 2 is aligned with a second longitudinal axis of the second level interconnection 4 in a plane view. The second connecting part of the second level in interconnection 4 overlaps the first connecting part of the first level interconnection 2 in the plane view.

The second level interconnection 4 is wider than the first level interconnection 2 so that the second connecting part of the second level interconnection 4 cover the first connecting part of the first level interconnection 2 and the adjacent part thereof to the first connecting part in the plane view.

A third inter-layer insulator 7 overlies the second inter-layer insulator 3 and the second level interconnection 4, whereby the second level interconnection 4 is buried in the third level interconnection 7. A passivation film 9 extends over the third inter-layer insulator 7 so that an entire surface of the third inter-layer insulator 7 is covered by the passivation film 9.

A single horizontally extending U-shaped void 8 extends through the third inter-layer insulator 7 in parallel to the second level interconnection 4. The single horizontally extending U-shaped void 8 extends at the same level as the second level interconnection 4. The single horizontally extending U-shaped void 8 extends in one end-and opposite sides of the second connecting part of the second level interconnection 4. The single horizontally extending U-shaped void 8 is surrounded by the third inter-layer insulator 7, so that the single horizontally extending U-shaped void 8 is isolated by thin walls of the third inter-layer insulator 7 from the second connecting part of the second level interconnection.

The first level interconnection 2 and the second level interconnection 4 may be made of aluminum. The metal plug 5 may be made of tungsten or aluminum. Alternatively, each of the first level interconnection 2 and the second level interconnection 4 may comprise laminations of a barrier metal layer such as a titanium nitride layer and an anti-reflecting film. In order to reduce a parasitic capacitance between the first level interconnection 2 and the second level interconnection 4, it is preferable that the first, second and third inter-layer insulators 1, 3 and 7 are made of an insulating material having a relatively low dielectric constant, for example, fluorine containing silicon oxide having a dielectric constant in the range of about 3.2 to about 3.5. The first, second and third fluorine containing silicon oxide inter-layer insulators 1, 3 and 7 may be deposited by a high density plasma enhanced chemical vapor deposition method in order to obtain a global planarization or an entire planarization. The first, second and third fluorine containing silicon oxide inter-layer insulators 1, 3 and 7 have a relatively high hygroscopicity, for which reason the passivation film 9 has to be made of an insulating material having a relatively low hygroscopicity, for example, one of polyimide resins or nitrogen containing silicon oxide, whereby the passivation film 9 prevents any substantive permeation of moisture into the third inter-layer insulator 7. This means that the passivation film 9 protects the second level interconnection 4, the metal plug 5 and the first level interconnection 2 from the moisture.

The first level interconnection 2 and the second level interconnection 4 are connected to circuits for selecting a redundancy circuit, so that, upon electrical disconnection between the first level interconnection 2 and the second level interconnection 4, the defective circuit comes non-selected whilst the redundancy circuit comes selected. The electrical disconnection between the first level interconnection 2 and the second level interconnection 4 may be obtained by irradiation of a pulse laser beam toward the second connecting part of the second level interconnection 4 as a target in order to cause a rapid and explosive evaporation of the second connecting part of the second level interconnection 4.

With reference to FIGS. 18A, 18B and 18C, the description will focus on the selected one of the fuse to be electrically diconnected. A pulse laser beam is irradiated toward the second connecting part of the second level interconnection 4 as a target so that the pulse laser beam penetrates through the passivation film 9 and the third inter-layer insulator 7 to be irradiated onto the second connecting part of the second level interconnection 4, where the pulse laser beam is absorbed by the second connecting part of the second level interconnection 4. Namely, the second connecting part of the second level interconnection 4 receives a large thermal energy, so that the second connecting part of the second level interconnection 4 shows a rapid and explosive evaporation, whereby the thin walls of the third inter-layer insulator between the second connecting part of the second level interconnection 4 and the single horizontally extending U-shaped void 8 is broken by the above explosive evaporation of the second connecting part of the second level interconnection 4 and thus the single horizontally extending U-shaped void 8 is connected with the second connecting part of the second level interconnection 4. As a result of the explosive evaporation of the second connecting part of die second level interconnection 4, the explosively evaporated material such as aluminum of the second connecting part of the second level interconnection 4 is explosively blown into the single horizontally extending U-shaped void 8, whereby the evaporated material is then deposited on inner walls of the single horizontally extending U-shaped void 8 thereby forming deposited metal films 10 on the inner walls of the horizontally extending U-shaped void 8, whilst substantially no second connecting part of the second level interconnection 4 resides over the metal plug 5. As a result, the metal plug 5 is electrically disconnected from the second level interconnection 4 missing the second connecting part. Therefore, the second level interconnection 4 is electrically disconnected from the first level interconnection 2. Upon electrical disconnection between the first level interconnection 2 and the second level interconnection 4, the defective circuit comes non-selected whilst the redundancy circuit comes selected.

As a laser beam source, there may be used a solid-state semiconductor excited dimer laser having a wavelength in the range of about 1–1.3 micrometers. An aperture diameter of the solid-state semiconductor excited dimer laser is slightly larger than the width of the second level interconnection 4 so that at least an entire of the second connecting part of the second level interconnection receives the irradiation of the pulse laser beam so that the entire part of the second connecting part of the second level interconnection 4 shows the rapid and explosive evaporation. As described above, however, the second level interconnection 4 is wider than the first level interconnection 2, for which reason the first connecting part of the first level interconnection 2 is covered by the second connecting part of the second level interconnection 4, whereby the first level interconnection 2 is free from any irradiation of the pulse laser beam, for which reason the first level interconnection 2 is free from any unintended electrical disconnection. The pulse laser beam may be irradiated in an oblique direction toward the same direction as the second level interconnection 4 extends so that the first level interconnection 2 adjacent to the first connecting part thereof is ensured of being free from an irradiation of the pulse laser beam.

The existence of the single horizontally extending U-shaped void adjacent to the second connecting part of the second level interconnection 4 but separated by the thin walls of the third inter-layer insulator 7 from the second connecting part of the second level interconnection 4 allows that, upon irradiation of the pulse laser beam toward the second connecting part of the second level interconnection 4, the second connecting part of the second level interconnection 4 is explosively evaporated and then the evaporated material of the second connecting part of the second level interconnection 4 is explosively blown through the broken thin walls of the third inter-layer insulator 7 into the single horizontally extending U-shaped void 8 before the evaporated material is deposited onto the inner walls of the single horizontally extending U-shaped void 8 thereby forming deposited metal films 10 on the inner walls of the horizontally extending U-shaped void 8, whilst substantially no evaporated material of the second connecting part of the second level interconnection 4 resides over the metal plug 5, resulting in a certain electrical disconnection between the second level interconnection 4 and the first level interconnection 2.

Further, the existence of the passivation film 9 having the relatively low hygroscopicity prevents any substantive permeation of moisture into the third inter-layer insulator 7, whereby the passivation film 9 protects the second level interconnection 4, the metal plug 5 and the first level interconnection 2 from the permeation of the moisture, whereby the second level interconnection 4, the metal plug 5 and the first level interconnection 2 are free from erosion due to the moisture permeation.

Each of the first inter-layer insulator 1, the second inter-layer insulator 3, and the third inter-layer insulator 7 may be made by both a high density plasma enhanced chemical vapor deposition of fluorine containing silicon oxide having a low dielectric constant but a high hygroscopicity and subsequent chemical mechanical polishing method to form a planer surface thereof.

An eighth embodiment according to the present invention will be described in detail with reference to FIGS. 19A, 19B, 20A and 20B.

With reference to FIGS. 19A and 19B, the following description is made directed to the novel fuse structure comprising a metal plug connecting first and second level interconnections in an inter-layer insulator and voids extending at the same level as the second level interconnection and along opposite sides of the second level interconnection before the fuse structure is disconnected by an irradiation of a laser beam.

A first level interconnection 2 extends over a first inter-layer insulator 1. A second inter-layer insulator 3 overlies the first inter-layer insulator 1 and the first level interconnection 2. The second inter-layer insulator 3 has a via hole within which a metal plug 5 is filled. Namely, the metal plug 5 is buried within the second inter-layer insulator 3. The metal plug 5 is electrically connected to a first connecting part of the fist level interconnection. A second level interconnection 4 extends over the second inter-layer insulator 3 so that a second connecting part of the second level interconnection 4 is positioned over the via hole, whereby the second connecting part of the second level interconnection 4 is electrically connected to the metal plug 5. As a result, the first level interconnection 2 and the second level interconnection 4 are electrically connected through the metal plug 5 to each other. The first level interconnection 2 and the second level interconnection 4 extend in anti-parallel directions, for example, opposite directions. The first level interconnection 2 and the second level interconnection 4 have the same longitudinal direction. A first longitudinal axis of the first level interconnection 2 is aligned with a second longitudinal axis of the second level interconnection 4 in a plane view. The second connecting part of the second level interconnection 4 overlaps the first connecting part of the first level interconnection 2 in the plan view.

The second level interconnection 4 has an extension extending from the second connecting part in the same direction as the first level interconnection extends, so that the extension of the second level interconnection 4 overlaps an adjacent part of the first level interconnection 2 to the first connecting part. The second level interconnection 4 is wider than the first level interconnection 2 so that the second connecting part and the extension of the second level interconnection 4 cover the first connecting part of the first level interconnection 2 and the adjacent part thereof to the first connecting part in the plane view.

A third inter-layer insulator 7 overlies the second inter-layer insulator 3 and the second level interconnection 4, whereby the second level interconnection 4 is buried in the third level interconnection 7. A passivation film 9 extends over the third inter-layer insulator 7 so that an entire surface of the third inter-layer insulator 7 is covered by the passivation film 9.

Two voids 8 extend through the third inter-layer insulator 7 in parallel to the second level interconnection 4. The two voids 8 extend at the same level as the second level interconnection 4. The two voids 8 extend in opposite sides of the second connecting part of the second level interconnection 4. The two voids 8 are partially surrounded by the third inter-layer insulator 7, so that the two voids 8 are connected with the second connecting part of the second level interconnection 4.

The first level interconnection 2 and the second level interconnection 4 may be made of aluminum. The metal plug 5 may be made of tungsten or aluminum. Alternatively, each of the first level interconnection 2 and the second level interconnection 4 may comprise laminations of a barrier metal layer such as a titanium nitride layer and an anti-reflecting film. In order to reduce a parasitic capacitance between the first level interconnection 2 and the second level interconnection 4, it is preferable that the first, second and third inter-layer insulators 1, 3 and 7 are made of an insulating material having a relatively low dielectric constant, for example, fluorine containing silicon oxide having a dielectric constant in the range of about 3.2 to about 3.5. The first, second and third fluorine containing silicon oxide inter-layer insulators 1, 3 and 7 may be deposited by a high density plasma enhanced chemical vapor deposition method in order to obtain a global planarization or an entire planarization. The first, second and third fluorine containing silicon oxide inter-layer insulators 1, 3 and 7 have a relatively high hygroscopicity, for which reason the passivation film 9 has to be made of an insulating material having a relatively low hygroscopicity, for example, one of polyimide resins or nitrogen containing silicon oxide, whereby the passivation film 9 prevents any substantive permeation of moisture into the third inter-layer insulator 7. This means that the passivation film 9 protects the second level interconnection 4, the metal plug 5 and the first level interconnection 2 from the moisture.

The first level interconnection 2 and the second level interconnection 4 are connected to circuits for selecting a redundancy circuit, so that, upon electrical disconnection between the first level interconnection 2 and the second level interconnection 4, the defective circuit comes non-selected whilst the redundancy circuit comes selected. The electrical disconnection between the first level interconnection 2 and the second level interconnection 4 may be obtained by irradiation of a pulse laser beam toward the second connecting part of the second level interconnection 4 as a target in order to cause a rapid and explosive evaporation of the second connecting part of the second level interconnection 4.

With reference to FIGS. 20A and 20B, a pulse laser beam is irradiated toward the second connecting part of the second level interconnection 4 as a target so that the pulse laser beam penetrates through the passivation film 9 and the third inter-layer insulator 7 to be irradiated onto the second connecting part of the second level interconnection 4, where the pulse laser beam is absorbed by the second connecting part of the second level interconnection 4. Namely, the second connecting part of the second level interconnection 4 receives a large thermal energy, so that the second connecting part of the second level interconnection 4 shows a rapid and explosive evaporation, whereby the explosively evaporated material such as aluminum of the second connecting part of the second level interconnection 4 is explosively blown into the two voids 8, whereby the evaporated material is then deposited on inner walls of the two voids 8 thereby forming deposited metal films 10 on the inner walls of the voids 8, whilst substantially no second connecting part of the second level interconnection 4 resides over the metal plug 5. As a result, the metal plug 5 is electrically disconnected from the second level interconnection 4 missing the second connecting part. Therefore, the second level interconnection 4 is electrically disconnected from the first level interconnection 2. Upon electrical disconnection between the first level interconnection 2 and the second level interconnection 4, the defective circuit comes non-selected whilst the redundancy circuit comes selected.

As a laser beam source, there may be used a solid-state semiconductor excited dimer laser having a wavelength in the range of about 1–1.3 micrometers. An aperture diameter of the solid-state semiconductor excited dimer laser is slightly larger than the width of the second level interconnection 4 so that at least an entire of the second connecting part of the second level interconnection receives the irradiation of the pulse laser beam so that the entire part of the second connecting part of the second level interconnection 4 shows the rapid and explosive evaporation. As described above, however, the second level interconnection 4 has the extension and is wider than the first level interconnection 2, for which reason the first connecting part of the first level interconnection 2 and the adjacent part thereof to the first connecting part are covered by the extension and the second connecting part of the second level interconnection 4, whereby the first level interconnection 2 is free from any irradiation of the pulse laser beam, for which reason the first level interconnection 2 is free from any unintended electrical disconnection.

The existence of the two voids connected with the second connecting part of the second level interconnection 4 but partially surrounded by the third inter-layer insulator 7 allows that, upon irradiation of the pulse laser beam toward the second connecting part of the second level interconnection 4, the second connecting part of the second level interconnection 4 is explosively evaporated and then the evaporated material of the second connecting part of the second level interconnection 4 is explosively blown into the two voids 8 before the evaporated material is deposited onto the inner walls of the two voids 8 thereby forming deposited metal films 10 on the inner walls of the voids 8, whilst substantially no evaporated material of the second connecting part of the second level interconnection 4 resides over the metal plug 5, resulting in a certain electrical disconnection between the second level interconnection 4 is electrically disconnected from the first level interconnection 2.

Further, the existence of the passivation film 9 having the relatively low hygroscopicity prevents any substantive permeation of moisture into the third inter-layer insulator 7, whereby the passivation film 9 protects the second level interconnection 4, the metal plug 5 and the first level interconnection 2 from the permeation of the moisture, whereby the second level interconnection 4, the metal plug 5 and the first level interconnection 2 are free from erosion due to the moisture permeation.

Each of the first inter-layer insulator 1, the second inter-layer insulator 3, and the third inter-layer insulator 7 may be made by both a high density plasma enhanced chemical vapor deposition of fluorine containing silicon oxide having a low dielectric constant but a high hygroscopicity and subsequent chemical mechanical polishing method to form a planar surface thereof.

A ninth embodiment according to the present invention will be described in detail with reference to FIGS. 21A, 21B, 22A and 22B.

With reference to FIG. 21B, the following description is made directed to individual one of the novel fuse structures aligned, each of which comprises a metal plug connecting first and second level interconnections in an inter-layer insulator and a single void extending at the same level as the second level interconnection and along a predetermined one side of the second level interconnection before the selected ones of the fuse structures are disconnected by an irradiation of laser beams.

A first level interconnection 2 extends over a first inter-layer insulator 1. A second inter-layer insulator 3 overlies the first inter-layer insulator 1 and the first level interconnection 2. The second inter-layer insulator 3 has a via hole within which a metal plug 5 is filled. Namely, the metal plug 5 is buried within the second inter-layer insulator 3. The metal plug 5 is electrically connected to a first connecting part of the first level interconnection. A second level interconnection 4 extends over the second inter-layer insulator 3 so that a second connecting part of the second level interconnection 4 is positioned over the via hole, whereby the second connecting part of the second level interconnection 4 is electrically connected to the metal plug 5. As a result, the first level interconnection 2 and the second level interconnection 4 are electrically connected through the metal plug 5 to each other The first level interconnection 2 and the second level interconnection 4 extend in anti-parallel directions, for example, opposite directions. The first level interconnection 2 and the second level interconnection 4 have the same longitudinal direction. A first longitudinal axis of the first level interconnection 2 is aligned with a second longitudinal axis of the second level interconnections 4 in a plane view. The second connecting part of the second level interconnection 4 overlaps the first connecting part of the first level interconnection 2 in the plane view.

The second level interconnection 4 has an extension extending from the second connecting part in the same direction as the first level interconnection extends, so that the extension of the second level interconnection 4 overlaps an adjacent part of the first level interconnection 2 to the first connecting part. The second level interconnection 4 is wider than the first level interconnection 2 so that the second connecting part and the extension of the second level interconnection 4 cover the first connecting part of the first level interconnection 2 and the adjacent part thereof to the first connecting part in the plane view.

A third inter-layer insulator 7 overlies the second inter-layer insulator 3 and the second level interconnection 4, whereby the second level interconnection 4 is buried in the third level interconnection 7. A passivation film 9 extends over the third inter-layer insulator 7 so that an entire surface of the third inter-layer insulator 7 is covered by the passivation film 9.

A single void 8 extends through the third inter-layer insulator 7 in parallel to the second level interconnection 4. The single void 8 extends at the same level as the second level interconnection 4. The single void 8 extends in a predetermined one side of the second connecting part of the second level interconnection 4. The single void 8 is partially surrounded by the third inter-layer insulator 7, so that the single void 8 is in contact with the second level interconnection 4. The single void 8 extends symmetrical with reference to the center line extending on the center of the metal plug 5 or the second connecting part of the second level interconnection and also extending in a direction perpendicular to the longitudinal direction of the first level and second level interconnections 2 and 4.

The first level interconnection 2 and the second level interconnection 4 may be made of aluminum. The metal plug 5 may be made of tungsten or aluminum. Alternatively, each of the first level interconnection 2 and the second level interconnection 4 may comprise laminations of a barrier metal layer such as a titanium nitride layer and an anti-reflecting film. In order to reduce a parasitic capacitance between the first level interconnection 2 and the second level interconnection 4, it is preferable that the first, second and third inter-layer insulators 1, 3 and 7 are made of an insulating material having a relatively low dielectric constant, for example, fluorine containing silicon oxide having a dielectric constant in the range of about 3.2 to about 3.5. The first, second and third fluorine containing silicon oxide inter-layer insulators 1, 3 and 7 may be deposited by a high density plasma enhanced chemical vapor deposition method in order to obtain a global planarization or an entire planarization. The first, second and third fluorine containing silicon oxide inter-layer insulators 1, 3 and 7 have a relatively high hygroscopicity, for which reason the passivation film 9 has to be made of an insulating material having a relatively low hygroscopicity, for example, one of polyimide sins or nitrogen containing silicon oxide, whereby the passivation film 9 prevents any substantive permeation of moisture into the third inter-layer insulator 7. This means that the passivation film 9 protects the second level interconnection 4, the metal plug 5 and the first level interconnection 2 from the moisture.

With reference to FIG. 21A, the above plurality of fuse structures including the voids 8 are aligned. As described above, the single void 8 is provided to individual one of the metal plug connecting the first level interconnection and the second level interconnection, whereby it is possible to increase the density of the integration of the fuse structures or reduce the area of the fuse structure array as compared to when the dual voids 8 are to the individual one of the metal plug.

The first level interconnection 2 and the second level interconnection 4 are connected to circuits for selecting a redundancy circuit, so that, upon electrical disconnection between the first level interconnection 2 and the second level interconnection 4, the defective circuit comes non-selected whilst the redundancy circuit comes selected. The electrical disconnection between the first level interconnection 2 and the second level interconnection 4 may be obtained by irradiation of a pulse laser beam toward the second connecting part of the second level interconnection 4 as a target in order to cause a rapid and explosive evaporation of the second connecting part of the second level interconnection 4.

With reference to FIG. 22B, the description will focus on the selected one of the fuse to be electrically disconnected. A pulse laser beam is irradiated toward the second connecting part of the second level interconnection 4 as a target so that the pulse laser beam penetrates through the passivation film 9 and the third inter-layer insulator 7 to be irradiated onto the second connecting part of the second level interconnection 4, where the pulse laser beam is absorbed by the second connecting part of the second level interconnection 4. Namely, the second connecting part of the second level interconnection 4 receives a large thermal energy, so that the second connecting part of the second level interconnection 4 shows a rapid and explosive evaporation, whereby the explosively evaporated material such as aluminum of the second connecting part of the second level interconnection 4 is explosively blown into the single void 8, whereby the evaporated material is then deposited on inner walls of the single void 8 thereby forming deposited metal films 10 on the inner walls of the void 8, whilst substantially no second connecting part of the second level interconnection 4 resides over the metal plug 5. As a result, the metal plug 5 is electrically disconnected from the second level interconnection 4 missing the second connecting part. Therefore, the second level interconnection 4 is electrically disconnected from the first level interconnection 2. Upon electrical disconnection between the first level interconnection 2 and the second level interconnection 4, the defective circuit comes non-selected whilst the redundancy circuit comes selected.

As a laser beam source, there may be used a solid-state semiconductor excited dimer laser having a wavelength in the range of about 1–1.3 micrometers. An aperture diameter of the solid-state semiconductor excited dimer laser is slightly larger than the width of the second level interconnection 4 so that at least an entire of the second connecting part of the second level interconnection receives the irradiation of the pulse laser beam so that the entire part of the second connecting part of the second level interconnection 4 shows the rapid and explosive evaporation. As described above, however, the second level interconnection 4 has the extension and is wider than the first level interconnection 2, for which reason the first connecting part of the first level interconnection 2 and the adjacent part thereof to the first connecting part are covered by the extension and the second connecting part of the second level interconnection 4, whereby the first level interconnection 2 is free from any irradiation of the pulse laser beam, for which reason the first level interconnection 2 is free from any unintended electrical disconnection.

With reference to FIG. 22A, selected two of the fuse structures aligned are electrically disconnected by irradiation of the pulse laser beams in order to switch from the defective circuits into the redundancy circuits.

The existence of the single void connected with the second connecting part of the second level interconnection 4 but partially surrounded by the third inter-layer insulator 7 allows that, upon irradiation of the pulse laser beam toward the second connecting part of the second level interconnection 4, the second connecting part of the second level interconnection 4 is explosively evaporated and then the evaporated material of the second connecting part of the second level interconnection 4 is explosively blown into the single void 8 before the evaporated material is deposited onto the inner walls of the single void 8 thereby forming deposited metal films 10 on the inner walls of the void 8, whilst substantially no evaporated material of the second connecting part of the second level interconnection 4 resides over the metal plug 5, resulting in a certain electrical disconnection between the second level interconnection 4 is electrically disconnected from the first level interconnection 2.

The existence of the single void in the predetermined one side of the second level interconnection 4 increases the density of the integration of the fuse structures or reduces the area of the fuse structure array as compared to when the dual voids 8 are provided to the individual one of the metal plug.

Further, the existence of the passivation film 9 having the relatively low hygroscopicity prevents any substantive permeation of moisture into the third inter-layer insulator 7, whereby the passivation film 9 protects the second level interconnection 4, the metal plug 5 and the first level interconnection 2 from the permeation of the moisture, whereby the second level interconnection 4, the metal plug 5 and the first level interconnection 2 are free from erosion due to the moisture permeation.

Each of the first inter-layer insulator 1, the send inter-layer insulator 3, and the third inter-layer insulator 7 may be made by both a high density plasma enhanced chemical vapor deposition of fluorine containing silicon oxide having a low dielectric constant but a high hygroscopicity and subsequent chemical mechanical polishing method to form a planar surface thereof.

A tenth embodiment according to the present invention will be described in detail with reference to FIGS. 23A, 23B, 24A and 24B.

With reference to FIG. 23B, the following description is made directed to individual one of the novel fuse structures aligned, each of which comprises a metal plug connecting first and second level interconnections in an inter-layer insulator and a single void extending at the same level as the second level interconnection and on an extending longitudinal center line of the second level interconnection before the selected ones of the fuse structures are disconnected by an irradiation of laser beams.

A first level interconnection 2 extends over a first inter-layer insulator 1. A second inter-layer insulator 3 overlies the first inter-layer insulator 1 and the first level interconnection 2. The second inter-layer insulator 3 has a via hole within which a metal plug 5 is filled. Namely, the metal plug 5 is buried within the second inter-layer insulator 3. The metal plug 5 is electrically connected to a first connecting part of the first level interconnection. A second level interconnection 4 extends over the second inter-layer insulator 3 so that a second connecting part of the second level interconnection 4 is positioned over the via hole, whereby the second connecting part of the second level interconnection 4 is electrically connected to the metal plug 5. As a result, the first level interconnection 2 and the second level interconnection 4 are electrically connected through the metal plug 5 to each other. The first level interconnection 2 and the second level interconnection 4 extend in anti-parallel directions, for example, opposite directions. The first level interconnection 2 and the second level interconnection 4 have the same longitudinal direction. A first longitudinal axis of the first level interconnection 2 is aligned with a second longitudinal axis of the second level interconnection 4 in a plane view. The second connecting part of the second level interconnection 4 overlaps the first connecting part of the first level interconnection 2 in the plan view.

The second level interconnection 4 is wider than the first level interconnection 2 so that the second connecting part of the second level interconnection 4 cover the first connecting part of the first level interconnection 2 in the plane view.

A third inter-layer insulator 7 overlies the second inter-layer insulator 3 and the second level interconnection 4, whereby the second level interconnection 4 is buried in the third level interconnection 7. A passivation film 9 extends over the third inter-layer insulator 7 so that an entire surface of the third inter-layer insulator 7 is covered by the passivation film 9.

A single void 8 extends through the third inter-layer insulator 7 in parallel to the second level interconnection 4. The single void 8 extends at the same level as the second level interconnection 4. The single void 8 extends on an extending longitudinal center line of the second level interconnection 4, so that the single void 8 extends over the first level interconnection 2, whereby the single void 8 overlaps the adjacent part of the first level interconnection 2 to the first connecting part thereof in the plane view. The single void 8 is partially surrounded by the third inter-layer insulator 7, so that the single void 8 is connected with the second connecting part as one end of the second level interconnection 4.

The first level interconnection 2 and the second level interconnection 4 may be made of aluminum. The metal plug 5 may be made of tungsten or aluminum. Alternatively, each of the first level interconnection 2 and the second level interconnection 4 may comprise laminations of a barrier metal layer such as a titanium nitride layer and an anti-reflecting film. In order to reduce a parasitic capacitance between the first level interconnection 2 and the second level interconnection 4, it is preferable that the first, second and third inter-layer insulators 1, 3 and 7 are made of an insulating material having a relatively low dielectric constant, for example, fluorine containing silicon oxide having a dielectric constant in the range of about 3.2 to about 3.5. The first, second and third fluorine containing silicon oxide inter-layer insulators 1, 3 and 7 may be deposited by a high density plasma enhanced chemical vapor deposition method in order to obtain a global planarization or an entire planarization. The first, second and third fluorine containing silicon oxide inter-layer insulators 1, 3 and 7 have a relatively high hygroscopicity, for which reason the passivation film 9 has to be made of an insulating material, having a relatively low hygroscopicity, for example, one of polyimide resins or nitrogen containing silicon oxide, whereby the passivation film 9 prevents any substantive permeation of moisture into the third inter-layer insulator 7. This means that the passivation film 9 protects the second level interconnection 4, the metal plug 5 and the first level interconnection 2 from the moisture.

With reference to FIG. 23A, the above plurality of fuse structures including the voids 8 are aligned. As described above, the single void 8 is provided to individual one of the metal plug connecting the first level interconnection and the second level interconnection, so that the single void 8 extends on the extending longitudinal center line of the second level interconnection 4 and overlaps the adjacent part of first level interconnection to the first connecting part thereof, whereby it is possible to further increase the density of the integration of the fuse structures or reduce the area of the fuse structure array as compared to when the single void 8 is provided to the individual one of the metal plug and in the predetermined one side of the second level interconnection 4.

The first level interconnection 2 and the second level interconnection 4 are connected to circuits for selecting a redundancy circuit, so that, upon electrical disconnection between the first level interconnection 2 and the second level interconnection 4, the defective circuit comes non-selected whilst the redundancy circuit comes selected. The electrical disconnection between the first level interconnection 2 and the second level interconnection 4 may be obtained by irradiation of a pulse laser beam toward the second connecting part of the second level interconnection 4 as a target in order to cause a rapid and explosive evaporation of the second connecting part of the second level interconnection 4.

With reference to FIG. 24B, the description will focus on the selected one of the fuse to be electrically disconnected. A pulse laser beam is irradiated toward the second connecting part of the second level interconnection 4 as a target so that the pulse laser beam penetrates through the passivation film 9 and the third inter-layer insulator 7 to be irradiated onto the second connecting part of the second level interconnection 4, where the pulse laser beam is absorbed by the second connecting part of the second level interconnection 4. Namely, the second connecting part of the second level interconnection 4 receives a large thermal energy, so that the second connecting part of the second level interconnection 4 shows a rapid and explosive evaporation, whereby the explosively evaporated material such as aluminum of the second connecting part of the second level interconnection 4 is explosively blown into the single void 8, whereby the evaporated material is then deposited on inner walls of the single void 8 thereby forming deposited metal films 10 on the inner walls of the void 8, whilst substantially no second connecting part of the second level interconnection 4 resides over the metal plug 5. As a result, the metal plug 5 is electrically disconnected from the second level interconnection 4 missing the second connecting part. Therefore, the second level interconnection 4 is electrically disconnected from the first level interconnection 2. Upon electrical disconnection between the first level interconnection 2 and the second level interconnection 4, the defective circuit comes non-selected whilst the redundancy circuit comes selected.

As a laser beam source, there may be used a solid-state semiconductor excited dimer laser having a wavelength in the range of about 1–1.3 micrometers. An aperture diameter of the solid-state semiconductor excited dimer laser is slightly larger than the width of the second level interconnection 4 so that at least an entire of the second connecting part of the second level interconnection receives the irradiation of the pulse laser beam so that the entire part of the second connecting part of the second level interconnection 4 shows the rapid and explosive evaporation. As described above, however, the second level interconnection 4 is wider than the first level interconnection 2, for which reason the first connecting part of the first level interconnection 2 is covered by the second connecting part of the second level interconnection 4, whereby the first level interconnection 2 is free from any irradiation of the pulse laser beam, for which reason the first level interconnection 2 is free from any unintended electrical disconnection. The pulse laser beam may be irradiated in an oblique direction toward the same direction as the second level interconnection 4 extends so that the first level interconnection 2 adjacent to the first connecting part thereof is ensured of being free from any irradiation of the pulse laser beam.

With reference to FIG. 24A, selected two of the fuse structures aligned are electrically disconnected by irradiation of the pulse laser beams in order to switch from the defective circuits into the redundancy circuits.

The existence of the single void connected with the second connecting part of the second level interconnection 4 but partially surrounded by the third inter-layer insulator 7 allows that, upon irradiation of the pulse laser beam toward the second connecting part of the second level interconnection 4, the second connecting part of the second level interconnection 4 is explosively evaporated and then the evaporated material of the second connecting part of the second level interconnection 4 is explosively blown into the single void 8 before the evaporated material is deposited onto the inner walls of the single void 8 thereby forming deposited metal films 10 on the inner walls of the void 8, whilst substantially no evaporated material of the second connecting part of the second level interconnection 4 resides over the metal plug 5, resulting in a certain electrical disconnection between the second level interconnection 4 and the first level interconnection 2.

The existence of the single void on the extending longitudinal center line of the second level interconnection 4 and overlapping the adjacent part of the first level interconnection 2 to the first connecting part increases the density of the integration of the fuse structures or reduces the area of the fuse structure array as compared to when the single void 8 is provided to the individual one of the metal plug but in the predetermined one side of the second level interconnection 4.

Further, the existence of the passivation film 9 having the relatively low hygroscopicity prevents any substantive permeation of moisture into the third inter-layer insulator 7, whereby the passivation film 9 protects the second level interconnection 4, the metal plug 5 and the first level interconnection 2 from the permeation of the moisture, whereby the second level interconnection 4, the metal plug 5 and the first level interconnection 2 are free from erosion due to the moisture permeation.

Each of the first inter-layer insulator 1, the second inter-layer insulator 3, and the third inter-layer insulator 7 may be made by both a high density plasma enhanced chemical vapor deposition of fluorine containing silicon oxide having a low dielectric constant but a high hygroscopicity and subsequent chemical mechanical polishing method to form a planer surface thereof.

An eleventh embodiment according to the present invention will be described in detail with reference to FIGS. 25A, 25B, 26A and 26B.

With reference to FIG. 25B, the following description is made directed to individual one of the novel fuse structures aligned, each of which comprises a metal plug connecting first and second level interconnections in an inter-layer insulator and a single void extending at a higher level than the second level interconnection and over the second connecting part of the second level interconnection before the selected ones of the fuse structures are disconnected by an irradiation of laser beams.

A first level interconnection 2 extends over a first inter-layer insulator 1. A second inter-layer insulator 3 overlies the first inter-layer insulator 1 and the first level interconnection 2. The second inter-layer insulator 3 has a via hole within which a metal plug 5 is filled. Namely, the metal plug 5 is buried within the second inter-layer insulator 3. The metal plug 5 is electrically connected to a first connecting part of the first level interconnection. A second level interconnection 4 extends over the second inter-layer insulator 3 so that a second connecting part of the second level interconnection 4 is positioned over the via hole, whereby the second connecting part of the second level interconnection 4 is electrically connected to the metal plug 5. As a result, the first level interconnection 2 and the second level interconnection 4 are electrically connected through the metal plug 5 to each other. The first level interconnection 2 and the second level interconnection 4 extend in anti-parallel directions, for example, opposite directions. The first level interconnection 2 and the second level interconnection 4 have the same longitudinal direction. A first longitudinal axis of the first level interconnection 2 is aligned with a second longitudinal axis of the second level interconnection 4 in a plan view. The second connecting part of the second level interconnection 4 overlaps the first connecting part of the first level interconnection 2 in the plan view.

The second level interconnection 4 has an extension extending from the second connecting part in the same direction as the first level interconnection extends, so that the extension of the second level interconnection 4 overlaps an adjacent part of the first level interconnection 2 to the first connecting part. The second level interconnection 4 is wider than the first level interconnection 2 so that the second connecting part and the extension of the second level interconnection 4 cover the first connecting part of the first level interconnection 2 and the adjacent part thereof to the first connecting part in the plan view.

A third inter-layer insulator 7 overlies the second inter-layer insulator 3 and the second level interconnection 4, whereby the second level interconnection 4 is buried in the third level interconnection 7. A passivation film 9 extends over the third inter-layer insulator 7 so that an entire surface of the third inter-layer insulator 7 is covered by the passivation film 9.

A single void 8 extends through the third inter-layer insulator 7 in parallel to the second level interconnection 4. The single void 8 extends at a higher level than the second level interconnection 4. The single void 8 extends over the second connecting part of the second level interconnection 4. The single void 8 is partially surrounded by the third inter-layer insulator 7, so that the single void 8 is connected with the second connecting part of the second level interconnection 4.

The first level interconnection 2 and the second level interconnection 4 may be made of aluminum. The metal plug 5 may be made of tungsten or aluminum. Alternatively, each of the first level interconnection 2 and the second level interconnection 4 may comprise laminations of a barrier metal layer such as a titanium nitride layer and an anti-reflecting film. In order to reduce a parasitic capacitance between the first level interconnection 2 and the second level interconnection 4, it is preferable that the first, second and third inter-layer insulators 1, 3 and 7 are made of an insulating material having a relatively or electric constant, for example, fluorine containing silicon oxide having a dielectric constant in the range of about 3.2 to about 3.5. The first, and third fluorine containing silicon oxide inter-layer insulators 1, 3 and 7 may be deposited by a high density plasma enhanced chemical vapor deposition method in order to obtain a global planarization or an entire planarization. The first, second and third fluorine containing silicon oxide inter-layer insulators 1, 3 and 7 have a relatively high hygroscopicity, for which reason the passivation film 9 has to be made of an insulating material having a relatively low hygroscopicity, for example, one of polyimide resins or nitrogen containing silicon oxide, whereby the passivation film 9 prevents any substantive permeation of moisture into the third inter-layer insulator 7. This means that the passivation film 9 protects the second level interconnection 4, the metal plug 5 and the first level interconnection 2 from the moisture.

With reference to FIG. 25A, the above plurality of false structures including the voids 8 are aligned. As described above, the single void 8 is provided to individual one of the metal plug connecting the first level interconnection and the second level interconnection, so that the single void 8 extends over the second connecting part of the second level interconnection 4 and overlaps the adjacent part of the first level interconnection to the first connecting part thereof, whereby it is possible to further increase the density of the integration of the fuse structures or reduce the area of the fuse structure array as compared to when the single void 8 is provided to the individual one of the metal plug and in the predetermined one side of the second level interconnection 4.

The first level interconnection 2 and the second level interconnection 4 are connected to circuits for selecting a redundancy circuit, so that, upon electrical disconnection between the first level interconnection 2 and the second level interconnection 4, the defective circuit comes non-selected whilst the redundancy circuit comes selected. The electrical disconnection between the first level interconnection 2 and the second level interconnection 4 may be obtained by irradiation of a pulse laser beam toward the second connecting part of the second level interconnection 4 as a target in order to cause a rapid and explosive evaporation of the second connecting part of the second level interconnection 4.

With reference to FIG. 26B, the description will focus on the selected one of the fuse to be electrically disconnected. A pulse laser beam is irradiated toward the second connecting part of the second level interconnection 4 as a target so that the pulse laser beam penetrates through the passivation film 9 and the third inter-layer insulator 7 and further through the void 8 to be irradiated onto the second connecting part of the second level interconnection 4, where the pulse laser beam is absorbed by the second connecting part of the second level interconnection 4. Namely, the second connecting part of the second level interconnection 4 receives a large thermal energy, so that the second connecting part of the second level interconnection 4 shows a rapid and explosive evaporation, whereby the explosively evaporated material such as aluminum of the second connecting part of the second level interconnection 4 is explosively blown into the single void 8, whereby the evaporated material is then deposited on inner walls of the single void 8 thereby forming deposited metal films 10 on the inner walls of the void 8, whilst substantially no second connecting part of the second level interconnection 4 resides over the metal plug 5. As a result, the metal plug 5 is electrically disconnected from the second level interconnection 4 missing the second connecting part. Therefore, the second level interconnection 4 is electrically disconnected from the first level interconnection 2. Upon electrical disconnection between the first level interconnection 2 and the second level interconnection 4, the defective circuit comes non-selected whilst the redundancy circuit comes selected.

As a laser beam source, there may be used a solid-state semiconductor excited dimer laser having a wavelength in the range of about 1–1.3 micrometers. An aperture diameter of the solid-state semiconductor excited dimer laser is slightly larger than the width of the second level interconnection 4 so that at least an entire of the second connecting part of the second level interconnection receives the irradiation of the pulse laser beam so that the entire part of the second connecting part of the second level interconnection 4 shows the rapid and explosive evaporation. As described above, however, the second level interconnection 4 has the extension and is wider than the first level interconnects 2, for which reason the first connecting part of the first level interconnection 2 and the adjacent part thereof to the first connecting part are covered by the extension and the second connecting part of the second level interconnection 4, whereby the first level interconnection 2 is free from any irradiation of the pulse laser beam, for which reason level interconnection 2 is free from any unintended electrical disconnection.

With reference to FIG. 26A, selected two of the fuse structures aligned are electrically disconnected by irradiation of the pulse laser beams in order to switch from the defective circuits into the redundancy circuits.

The existence of the single void connected with the second connecting part of the second level interconnection 4 but partially surrounded by the third inter-layer insulator 7 allows that, upon irradiation of the pulse laser beam toward the second connecting part of the second level interconnection 4, the second connecting part of the second level interconnection 4 is explosively evaporated and then the evaporated material of the second connecting part of the second level interconnection 4 is explosively blown into the single void 8 before the evaporated material is deposited onto the inner walls of the single void 8 thereby forming deposited metal films 10 on the inner walls of the void 8, whilst substantially no evaporated material of the second connecting part of the second level interconnection 4 resides over the metal plug 5, resulting in a certain electrical disconnection between the second level interconnection 4 is electrically disconnected from the first level interconnection 2.

The existence of the single void over the second connecting part of the second level interconnection 4 increases the density of the integration of the fuse structures or reduces the area of the fuse structure array as compared to when the single void 8 is provided to the individual one of the metal plug but in the predetermined one side of the second level interconnection 4.

Further, the existence of the passivation film 9 having the relatively low hygroscopicity prevents any substantive permeation of moisture into the third inter-layer insulator 7, whereby the passivation film 9 protects the second level interconnection 4, the metal plug 5 and the first level interconnection 2 from the permeation of the moisture, whereby the second level interconnection 4, the metal plug 5 and the first level interconnection 2 are free from erosion due to the moisture permeation.

Each of the first inter-layer insulator 1, tho second inter-layer insulator 3, and the third inter-layer insulator 7 may be made by both a high density plasma enhanced chemical vapor deposition of fluorine containing silicon oxide having a low dielectric constant but a high hygroscopicity and subsequent chemical mechanical polishing method to form a planar surface thereof.

A twelfth embodiment according to the present invention will be described in detail with reference to FIGS. 27A, 27B, 28A and 28B.

With reference to FIGS. 27A and 27B, the following description is made directed to individual one of the novel fuse structures aligned, each of which comprises a metal plug connecting first and second level interconnections in an inter-layer insulator and a single vertically extending U-shaped void extending from the same level as up to a higher level than the second level interconnection and over and opposite sides of the second connecting part of the second level interconnection before the selected ones of the fuse structures are disconnected by an irradiation of laser beams.

A first level interconnection 2 extends over a first inter-layer insulator 1. A second inter-layer insulator 3 overlies the first inter-layer insulator 1 and the first level interconnection 2. The second inter-layer insulator 3 has a via hole within which a metal plug 5 is filled. Namely, the metal plug 5 is buried within the second inter-layer insulator 3. The metal plug 5 is electrically connected to a first connecting part of the first level interconnection. A second level interconnection 4 extends over the second inter-layer insulator 3 so that a second connecting part of the second level interconnection 4 is positioned over the via hole, whereby the second connecting part of the second level interconnection 4 is electrically connected to the metal plug 5. As a result, the first level interconnection 2 and the second level interconnection 4 are electrically connected through the metal plug 5 to each other. The first level interconnection 2 and the second level interconnection 4 extend in anti-parallel directions, for example, opposite directions. The first level interconnection 2 and the second level interconnection 4 have the same longitudinal direction. A first longitudinal axis of the first level interconnection 2 is aligned with a second longitudinal axis of the second level interconnection 4 in a plan view. The second connecting part of the second level interconnection 4 overlaps the first connecting part of the first level interconnection 2 in the plan view.

The second level interconnection 4 has an extension extending from the second connecting part in the same direction as the first level interconnection extends, so that the extension of the second level interconnection 4 overlaps an adjacent part of the first level interconnection 2 to the first connecting part. The second level interconnection 4 is wider than the first level interconnection 2 so that the second connecting part and the extension of the second level interconnection 4 cover the first connecting part of the first level interconnection 2 and the adjacent part thereof to the first connecting part in the plan view.

A third inter-layer insulator 7 overlies the second inter-layer insulator 3 and the second level interconnection 4, whereby the second level interconnection 4 is buried in the third level interconnection 7. A passivation film 9 extends over the third inter-layer insulator 7 so that an entire surface of the third inter-layer insulator 7 is covered by the passivation film 9.

A single vertically extending U-shaped void 8 extends through the third inter-layer insulator 7 in parallel to the second level interconnection 4. The single vertically extending U-shaped void 8 extends from the same level as up to a higher level than the second level interconnection 4. The single vertically extending U-shaped void 8 extends over and opposite sides of the second connecting part of the second level interconnection 4. The single vertically extending U-shaped void 8 is partially surrounded by the third inter-layer insulator 7, so that the single vertically extending U-shaped void 8 is connected with the second connecting part of the second level interconnection 4.

The first level interconnection 2 and the second level interconnection 4 may be made of aluminum. The metal plug 5 may be made of tungsten or aluminum. Alternatively, each of the first level interconnection 2 and the second level interconnection 4 may comprise laminations of a barrier metal layer such as a titanium nitride layer and an anti-reflecting film. In order to reduce a parasitic capacitance between the first level interconnection 2 and the second level interconnection 4, it is preferable that the first, second and third inter-layer insulators 1, 3 and 7 are made of an insulating material having a relatively low dielectric constant, for example, fluorine containing silicon oxide having a dielectric constant in the range of about 3.2 to about 3.5. The first, second and third fluorine containing silicon oxide inter-layer insulators 1, 3 and 7 may be deposited by a high density plasma enhanced chemical vapor deposition method in order to obtain a global planarization or an entire planarization. The first, second and third fluorine containing silicon oxide inter-layer insulators 1, 3 and 7 have a relatively high hygroscopicity, for which reason the passivation film 9 has to be made of an insulating material having a relatively low hygroscopicity, for example, one of polyimide resins or nitrogen containing silicon oxide, whereby the passivation film 9 prevents any substantive permeation of moisture into the third inter-layer insulator 7. This means that the passivation film 9 protects the second level interconnection 4, the metal plug 5 and the first level interconnection 2 from the moisture.

The first level interconnection 2 and the second level interconnection 4 are connected to circuits for selecting a redundancy circuit, so that, upon electrical disconnection between the first level interconnection 2 and the second level interconnection 4, the defective circuit comes non-selected whilst the redundancy circuit comes selected. The electrical disconnection between the first level interconnection 2 and the second level interconnection 4 may be obtained by irradiation of a pulse laser beam toward the second connecting part of the second level interconnection 4 as a target in order to cause a rapid and explosive evaporation of the second connecting part of the second level interconnection 4.

With reference to FIGS. 28A and 28B, the description will focus on the selected one of the fuse to be electrically disconnected. A pulse laser beam is irradiated toward the second connecting part of the second level interconnection 4 as a target so that the pulse laser beam penetrates through the passivation film 9 and the third inter-layer insulator 7 and further through the top portion of the vertically extending U-shaped void 8 to be irradiated onto the second connecting part of the second level interconnection 4, where the pulse laser beam is absorbed by the second connecting part of the second level interconnection 4. Namely, the second connecting part of the second level interconnection 4 receives a large thermal energy, so that the second connecting part of the second level interconnection 4 shows a rapid and explosive evaporation, whereby the explosively evaporated material such as aluminum of the second connecting part of the second level interconnection 4 is explosively blown into the single vertically extending U-shaped void 8, whereby the evaporated material is then deposited on inner walls of the single vertically extending U-shaped void 8 thereby forming deposited metal films 10 on the inner walls of the vertically extending U-shaped void 8, whilst substantially no second connecting part of the second level interconnection 4 resides over the metal plug 5. As a result, the metal plug 5 electrically disconnected from the second level interconnection 4 missing the second connecting part. Therefore, the second level interconnection 4 is electrically disconnected from the first level interconnection 2. Upon electrical disconnection between the first level interconnection 2 and the second level interconnection 4, the defective circuit comes non-selected whilst the redundancy circuit comes selected.

As a laser beam source, there may be used a solid-state semiconductor excited dimer laser having a wavelength in the range of about 1–1.3 micrometers. An aperture diameter of the solid-state semiconductor excited dimer laser is slightly larger than the width of the second level interconnection 4 so that at least an entire of the second connecting part of the second level interconnection receives the irradiation of the pulse laser beam so that the entire part of the second connecting part of the second level interconnection 4 shows the rapid and explosive evaporation. As described above, however, the second level interconnection 4 has the extension and is wider than the first level interconnection 2, for which reason the first connecting part of the first level interconnection 2 and the adjacent part thereof to the first connecting part are covered by the extension and the second connecting part of the second level interconnection 4, whereby the first level interconnection 2 is free from any irradiation of the pulse laser beam, for which reason the first level interconnection 2 is free from any unintended electrical disconnection.

The existence of the single vertically extending U-shaped void connected with the second connecting part of the second level interconnection 4 but partially surrounded by the third inter-layer insulator 7 allows that, upon irradiation of the pulse laser beam toward the second connecting part of the second level interconnection 4, the second connecting part of the second level interconnection 4 is explosively evaporated and then the evaporated material of the second connecting part of the second level interconnection 4 is explosively blown into the single vertically extending U-shaped void 8 before the evaporated material is deposited onto the inner walls of the single vertically extending U-shaped void 8 thereby forming deposited metal films 10 on the inner walls of the vertically extending U-shaped void 8, whilst substantially no evaporated material of the second connecting part of the second level interconnection 4 resides over the metal plug 5, resulting in a certain electrical disconnection between the second level interconnection 4 and the first level interconnection 2.

Further, the existence of the passivation film 9 having the relatively low hygroscopicity prevents any substantive permeation of moisture into the third inter-layer insulator 7, whereby the passivation film 9 protects the second level interconnection 4, the metal plug 5 and the first level interconnection 2 from the permeation of the moisture, whereby the second level interconnection 4, the metal plug 5 and the first level interconnection 2 are free from erosion due to the moisture permeation.

Each of the first inter-layer insulator 1, the second inter-layer insulator 3, and the third inter-layer insulator 7 may be made by both a high density plasma enhanced chemical vapor deposition of fluorine containing silicon oxide having a low dielectric constant but a high hygroscopicity and subsequent chemical mechanical polishing method to form a planer surface thereof.

A thirteenth embodiment according to the present invention will be described in detail with reference to FIGS. 29A, 29B, 29C, 30A, 30B and 30C.

With reference to FIGS. 29A, 29B and 29C, the following description is made directed to individual one of the novel fuse structures aligned, each of which comprises a metal plug connecting and second level interconnections in an inter-layer insulator and a single horizontally extending U-shaped void extending at the same level as the second level interconnection and in one end and opposite sides of the second connecting part of the second level interconnection before the selected ones of the fuse structures are disconnected by an irradiation of laser beams.

A first level interconnection 2 extends over a first inter-layer insulator 1. A second inter-layer insulator 3 overlies the first inter-layer insulator 1 and the first level interconnection 2. The second inter-layer insulator 3 has a via hole within which a metal plug 5 is filled. Namely, the metal plug 5 is buried within the second inter-layer insulator 3. The metal plug 5 is electrically connected to a first connecting part of the first level interconnection. A second level interconnection 4 extends over the second inter-layer insulator 3 so that a second connecting part of the second level interconnection 4 is positioned over the via hole, whereby the second connecting part of the second level interconnection 4 is electrically connected to the metal plug 5. As a result, the first level interconnection 2 and the second level interconnection 4 are electrically connected through the metal plug 5 to each other. The first level interconnection 2 and the second level interconnection 4 extend in anti-parallel directions, for example, opposite directions. The first level interconnection 2 and the second level interconnection 4 have the same longitudinal direction. A first longitudinal axis of the first level interconnection 2 is aligned with a second longitudinal axis of the second level interconnection 4 in a plan view. The second connecting part of the second level interconnection 4 overlaps the first connecting part of the first level interconnection 2 in the plan view.

The second level interconnection 4 is wider than the first level interconnection 2 so that the second connecting part of the second level interconnection 4 cover the first connecting part of the first level interconnection 2 and the adjacent part thereof to the first connecting part in the plan view.

A third inter-layer insulator 7 overlies the second inter-layer insulator 3 and the second level interconnection 4, whereby the second level interconnection 4 is buried in the third level interconnection 7. A passivation film 9 extends over the third inter-layer insulator 7 so that an entire surface of the third inter-layer insulator 7 is covered by the passivation film 9.

A single horizontally extending U-shaped void 8 extends through the third inter-layer insulator 7 in parallel to the second level interconnection 4. The single horizontally extending U-shaped void 8 extends at the same level as the second level interconnection 4. The single horizontally extending U-shaped void 8 extends in one end and opposite sides of the second connecting part of the second level in on 4. The single horizontally extending U-shaped void 8 is partially surrounded by the third inter-layer insulator 7, so that the single horizontally extending U-shaped void 8 is connected with the second connecting part of the second level interconnection 4.

The first level interconnection 2 and the second level interconnection 4 may be made of aluminum. The metal plug 5 may be made of tungsten or aluminum. Alternatively, each of the first level interconnection 2 and the second level interconnection 4 may comprise laminations of a barrier metal layer such as a titanium nitride layer and an anti-reflecting film. In order to reduce a parasitic capacitance between the first level interconnection 2 and the second level interconnection 4, it is preferable that the first, second and third inter-layer insulators 1, 3 and 7 are made of an insulating material having a relatively low dielectric constant, for example, fluorine containing silicon oxide having a dielectric constant in the range of about 3.2 to about 3.5. The first, second and third fluorine containing silicon oxide inter-layer insulators 1, 3 and 7 may be deposited by a high density plasma enhanced chemical vapor deposition method in order to obtain a global planarization or an entire planarization. The first, second and third fluorine containing silicon oxide inter-layer insulators 1, 3 and 7 have a relatively high hygroscopicity, for which reason the passivation film 9 has to be made of an insulating material having a relatively low hygroscopicity, for example, one of polyimide resins or nitrogen containing silicon oxide, whereby the passivation film 9 prevents any substantive permeation of moisture into the third inter-layer insulator 7. This means that the passivation film 9 protects the second level interconnection 4, the metal plug 5 and the first level interconnection 2 from the moisture.

The first level interconnection 2 and the second level interconnection 4 are connected to circuits for selecting a redundancy circuit, so that, upon electrical disconnection between the first level interconnection 2 and the second level interconnection 4, the defective circuit comes non-selected whilst the redundancy circuit comes selected. The electrical disconnection between the first level interconnection 2 and the second level interconnection 4 may be obtained by irradiation of a pulse laser beam toward the second connecting part of the second level interconnection 4 as a target in order to cause a rapid and explosive evaporation of the second connecting part of the second level interconnection 4.

With reference to FIGS. 30A, 30B and 30C, the description will focus on the selected one of the fuse to be electrically disconnected. A pulse laser beam is irradiated toward the second connecting part of the second level interconnection 4 as a target so that the pulse laser beam penetrates through the passivation film 9 and the third inter-layer insulator 7 to be irradiated onto the second connecting part of the second level interconnection 4, where the pulse laser beam is absorbed by the second connecting part of the second level interconnection 4. Namely, the second connecting part of the second level interconnection 4 receives a large thermal energy, so that the second connecting part of the second level interconnection 4 shows a rapid and explosive evaporation, whereby the explosively evaporated material such as aluminum of the second connecting part of the second level interconnection 4 is explosively blown into the single horizontally extending U-shaped void 8, whereby the evaporated material is then deposited on inner walls of the single horizontally extending U-shaped void 8 thereby forming deposited metal films 10 on the inner walls of the horizontally extending U-shaped void 8, whilst substantially no second connecting part of the second level interconnection 4 resides over the metal plug 5. As a result, the metal plug 5 is electrically disconnected from the second level interconnection 4 missing the second connecting part. Therefore, the second level interconnection 4 is electrically disconnected from the first level interconnection 2. Upon electrical disconnection between the first level interconnection 2 and the second level interconnection 4, the defective circuit comes non-selected whilst the redundancy circuit comes selected.

As a laser beam source, there may be used a solid-state semiconductor excited dimer laser having a wavelength in the range of about 1–1.3 micrometers. An aperture diameter of the solid-state semiconductor excited dimer laser is slightly larger than the width of the second level interconnection 4 so that at least an entire of the second connecting part of the second level interconnection receives the irradiation of the pulse laser beam so that the entire part of the second connecting part of the second level interconnection 4 shows the rapid and explosive evaporation. As described above, however, the second level interconnection 4 is wider than the first level interconnection 2, for which reason the first connecting part of the first level interconnection 2 is covered by the second connecting part of the second level interconnection 4, whereby the first level interconnection 2 is free from any irradiation of the pulse laser beam, for which reason the first level interconnection 2 is free from any unintended electrical disconnection. The pulse laser beam may be irradiated in an oblique direction toward the same direction as the second level interconnection 4 extends so that the first level interconnection 2 adjacent to the first connecting part thereof is ensured of being free from any irradiation of the pulse laser beam.

The existence of the single horizontally extending U-shaped void connected with the second connecting part of the second level interconnection 4 but partially surrounded by the third inter-layer insulator 7 allows that, upon irradiation of the pulse laser beam toward the second connecting part of the second level interconnection 4, the second connecting part of the second level interconnection 4 is explosively evaporated and then the evaporated material of the second connecting part of the second level interconnection 4 is explosively blown into the single horizontally extending U-shaped void 8 before the evaporated material is deposited onto the inner walls of the single horizontally extending U-shaped void 8 thereby forming deposited metal films 10 on the inner walls of the horizontally extending U-shaped void 8, whilst substantially no evaporated material of the second connecting part of the second level interconnection 4 resides over the metal plug 5, resulting in a certain electrical disconnection between the second level interconnection 4 and the first level interconnection 2.

Further, the existence of the passivation film 9 having the relatively low hygroscopicity prevents any substantive permeation of moisture into the third inter-layer insulator 7, whereby the passivation film 9 protects the second level interconnection 4, the metal plug 5 and the first level interconnection 2 from the permeation of the moisture, whereby the second level interconnection 4, the metal plug 5 and the first level interconnection 2 are free from erosion due to the moisture permeation.

Each of the first inter-layer insulator 1, the second inter-layer insulator 3, and the third inter-layer insulator 7 may be made by both a high density plasma enhanced chemical vapor deposition of fluorine containing silicon oxide having a low dielectric constant but a high hygroscopicity and subsequent chemical mechanical polishing method to form a planar surface thereof.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims all modifications which fall within the spirit and scope of the present invention.

What is claimed is:

1. A fuse structure formed in an inter-layer insulator, wherein said fuse structure has a first level interconnection and a second level interconnection isolated by said inter-layer insulator from said first level interconnection, said fuse structure comprising a conductive plug for providing an electrical connection between a first connecting part of said first level interconnection and a second connecting part of said second level interconnection, wherein said fuse structure further comprises at least a void which extends within said inter-layer insulator and also at least a part of said void extends adjacent to said second connecting part of said second level interconnection, so that when said second connecting part is rapidly evaporated by receiving a thermal energy, an evaporated material of said second connecting part is deposited on an inner wall of said void for causing an electrical disconnection between said first and second interconnections.

2. The fuse structure as claimed in claim 1, wherein said void is separated by a part of said inter-layer insulator from said second connecting part of said second level interconnection.

3. The fuse structure as claimed in claim 1, wherein said void extends in contact with said second connecting part of said second level interconnection.

4. The fuse structure as claimed in claim 1, wherein said void has substantially the same level as said second level interconnection and said void extends in one side of said second level interconnection, so that said void is displaced from a longitudinal center line of said second level interconnection.

5. The fuse structure as claimed in claim 4, wherein said first level interconnection and said second level interconnection extend in anti-parallel to each other from said first and second connecting parts respectively, so that said first level interconnection and said second level interconnection have the same longitudinal direction, wherein said second interconnection has an extension extending from said second connecting part in the longitudinal direction of said second interconnection, so that said extension of said second level interconnection extends over said first level interconnection, and wherein said second level interconnection including said extension is wider than said first level interconnection so that said first connecting part and other parts of said first level interconnection in the vicinity of said second connecting part are covered by said second level interconnection with said extension.

6. The fuse structure as claimed in claim 5, further comprising an extra interconnection extending in parallel to said second level interconnection, wherein said extra interconnection has substantially the same level as said second level interconnection, and said extra interconnection is displaced from said second level interconnection in a direction perpendicular to said longitudinal direction of said second level interconnection, and further said extra interconnection extends substantially symmetrical with reference to a center line extending both on a center of said second connecting part and in said direction perpendicular to said longitudinal direction of said second level interconnection, thereby to define an inter-layer insulator channel region between said second level interconnection and said extra interconnection, and wherein said void extends along said inter-layer insulator channel region between said second level interconnection and said extra interconnection, so that said void extends in parallel to said second level interconnection and also parallel to said extra interconnection, and opposite ends of said void are positioned in correspondence with opposite ends of said extra interconnection in a view perpendicular to said longitudinal direction of said second level interconnection, whereby said void extends substantially symmetrical with reference to said center line extending on said second connecting part and in said direction perpendicular to said longitudinal direction of said second level interconnection.

7. The fuse structure as claimed in claim 1, wherein two of said void have substantially the same level as said second level interconnection and said two voids extend in opposite sides of said second level interconnection, so that said two voids sandwich said second connecting part in a direction perpendicular to a longitudinal direction of said second level interconnection.

8. The fuse structure as claimed in claim 7, wherein said first level interconnection and said second level interconnection extend in anti-parallel to each other from said first and second connecting parts respectively, so that said first level interconnection and said second level interconnection have the same longitudinal direction, wherein said second interconnection has an extension extending from said second connecting part in the longitudinal direction of said second interconnection, so that said extension of said second level interconnection extends over said first level interconnection, and wherein said second level interconnection including said extension is wider than said first level interconnection so that said first connecting part and other parts of said first level interconnection in the vicinity of said second connecting part are covered by said second level interconnection with said extension.

9. The fuse structure as claimed in claim 8, further comprising a pair of extra interconnections extending in parallel to said second level interconnection, wherein each of said paired extra interconnections has substantially the same level as said second level interconnection, and said paired extra interconnections are displaced from said second level interconnection in a direction perpendicular to said longitudinal direction of said second level interconnection, and further said paired extra interconnections extend substantially symmetrical with reference to a center line extending both on a center of said second connecting part and in said direction perpendicular to said longitudinal direction of said second level interconnection, thereby to define two inter-layer insulator channel regions between said second level interconnection and said paired extra interconnections respectively, and wherein said two voids extend along said two inter-layer insulator channel regions between said second level interconnection and said paired extra interconnections, so that said two voids extend in parallel to said second level interconnection and also parallel to said paired extra interconnections, and opposite ends of each of said two voids are positioned in correspondence with opposite ends of each of said paired extra interconnections in a view perpendicular to said longitudinal direction of said second level interconnection, whereby each of said two voids extends substantially symmetrical with reference to said center line extending on said second connecting part and in said direction perpendicular to said longitudinal direction of said second level interconnection.

10. The fuse structure as claimed in claim 1, wherein said second connecting part of said second level interconnection comprises one end of said second level interconnection, and
wherein said void has substantially the same level as said second level interconnection, and said void extends in one end side of said second level interconnection, so that said void extends on an extending longitudinal center line of said second level interconnection.

11. The fuse structure as claimed in claim 1, wherein said void extends over said second connecting part of said second level interconnection.

12. The fuse structure as claimed in claim 1, wherein said second connecting part of said second level interconnection comprises one end of said second level interconnection, and
wherein said void extends in a form of a U-shape which surrounds said second connecting part in about three quarter of omnidirections, so that said U-shape of said void has substantially the same level as said second level interconnection, and said U-shape of said void extends in one end side and in opposite sides of said second connecting part of said second level interconnection.

13. The fuse structure as claimed in claim 1, where said void extends in a form of a U-shape which surrounds said second connecting part in about three quarter of omnidirections, so that said U-shape of said void has substantially the same level as and higher level than said second level interconnection, and said U-shape of said void extends over and in opposite sides of said second connecting part of said second level interconnection.

14. The fuse structure of claim 1, further comprising a passivation film having a lower hygroscopicity than said inter-layer insulator, wherein said inter-layer insulator is covered by said passivation film.

15. A fuse array comprising a plurality of fuse structures formed in an inter-layer insulator, wherein each of said fuse structures has a first level interconnection and a second level interconnection isolated by said inter-layer insulator from said first level interconnection, said first level and said second level interconnections having the same longitudinal direction as each other, said fuse structures comprising a conductive plug for providing an electrical connection between a first connecting part of said first level interconnection and a second connecting part of said second level interconnection,
wherein each of said fuse structures further comprises at least a void which extends within said inter-layer insulator and also at least a part of said void extends adjacent to said second connecting part of said second level interconnection, so that when said second connecting part is rapidly evaporated by receiving thermal energy, evaporated material of said second connecting part is deposited on an inner wall of said void, causing an electrical disconnection between said first and second interconnections, and
wherein said fuse structures are aligned alternately to be displaced from each other in a direction parallel to said longitudinal direction of said first level and second level interconnections so as to form a plurality of parallel alignments of said fuse structures extending in a direction perpendicular to said longitudinal direction of said first level and second level inter connections.

16. The fuse array as claimed in claim 15, wherein said void is separated by a part of said inter-layer insulator from said second connecting part of said second level interconnection.

17. The fuse array as claimed in claim 15, wherein said void extends in contact with said second connecting part of said second level interconnection.

18. The fuse array as claimed in claim 15, wherein said void has substantially the same level as said second level interconnection and said void extends in one side of said second level interconnection, so that said void is displaced from a longitudinal center line of said second level interconnection.

19. The fuse array as claimed in claim 18, wherein said first level interconnection and said second level interconnection extend in anti-parallel to each other from said first and second connecting parts respectively, so that said first level interconnection and said second level interconnection have the same longitudinal direction,
wherein said second interconnection has an extension extending from said second connecting part in the longitudinal direction of said second interconnection, so that said extension of said second level interconnection extends over said first level interconnection, and
wherein said second level interconnection including said extension is wider than said first level interconnection so that said first connecting part and other parts of said first level interconnection in the vicinity of said second connecting part are covered by said second level interconnection with said extension.

20. The fuse array as claimed in claim 19, further comprising an extra interconnection extending in parallel to said second level interconnection,
wherein said extra interconnection has substantially the same level as said second level interconnection, and said extra interconnection is displaced from said second level interconnection in a direction perpendicular to said longitudinal direction of said second level interconnection, and further said extra interconnection extends substantially symmetrical with reference to a center line extending both on a center of said second connecting part and in said direction perpendicular to said longitudinal direction of said second level interconnection, thereby to define an inter-layer insulator channel region between said second level interconnection and said extra interconnection, and
wherein said void extends along said inter-layer insulator channel region between said second level interconnection and said extra interconnection, so that said void extends in parallel to said second level interconnection and also parallel to said extra interconnection, and opposite ends of said void are positioned in correspondence with opposite ends of said extra interconnection in a view perpendicular to said longitudinal direction of said second level interconnection, whereby said void extends substantially symmetrical with reference to said center line extending on said second connecting part and in said direction perpendicular to said longitudinal direction of said second level interconnection.

21. The fuse array as claimed in claim 15, wherein two of said void have substantially the same level as said second level interconnection and said two voids extend in opposite sides of said second level interconnection, so that said two voids sandwich said second connecting part in a direction perpendicular to a longitudinal direction of said second level interconnection.

22. The fuse array as claimed in claim 21, wherein said first level interconnection and said second level interconnection extend, in anti-parallel to each other from said first and second connecting parts respectively, so that said first level interconnection and said second level interconnection have the same longitudinal direction, wherein said second interconnection has an extension extending from said second connecting part in the longitudinal direction of said second interconnection, so that said extension of said second level interconnection extends over said first level interconnection, and wherein said second level interconnection including said extension is wider than said first level interconnection so that said first connecting part and other parts of said first level interconnection in the vicinity of said second connecting part are covered by said second level interconnection with said extension.

23. The fuse array as claimed in claim 22, further comprising a pair of extra interconnections extending in parallel to said second level interconnection, wherein each of said paired extra interconnections has substantially the same level as said second level interconnection, and said paired extra interconnections are displaced from said second level interconnection in a direction perpendicular to said longitudinal direction of said second level interconnection, and further said paired extra interconnections extend substantially symmetrical with reference to a center line extending both on a center of said second connecting part and in said direction perpendicular to said longitudinal direction of said second level interconnection, thereby to define two inter-layer insulator channel regions between said second level interconnection and said paired extra interconnections respectively, and wherein said two voids extend along said two inter-layer insulator channel regions between said second level interconnection and said paired extra interconnections, so that said two voids extend in parallel to said second level interconnection and also parallel to said paired extra interconnections, and opposite ends of each of said two voids are positioned in correspondence with opposite ends of each of said paired extra interconnections in a view perpendicular to said longitudinal direction of said second level interconnection, whereby each of said two voids extends substantially symmetrical with reference to said center line extending on said second connecting part and in said direction perpendicular to said longitudinal direction of said second level interconnection.

24. The fuse array as claimed in claim 15, wherein said second connecting part of said second level interconnection comprises one end of said second level interconnection, and wherein said void has substantially the same level as said second level interconnection, and said void extends in one end side of said second level interconnection, so that said void extends on an extending longitudinal center line of said second level interconnection.

25. The fuse array as claimed in claim 15, wherein said void extends over said second connecting part of said second level interconnection.

26. The fuse array as claimed in claim 15, wherein said second connecting part of said second level interconnection comprises one end of said second level interconnection, and wherein said void extends in a form of a U-shape which surrounds said second connecting part in about three quarter of omnidirections, so that said U-shape of said void has substantially the same level as said second level interconnection, and said U-shape of said void extends in one end side and in opposite sides of said second connecting part of said second level interconnection.

27. The fuse array as claimed in claim 15, wherein said void extends in a form of a U-shape which surrounds said second connecting part in about three quarter of omnidirections, so that said U-shape of said void has substantially the same level as and higher level than said second level interconnection, and said U-shape of said void extends over and in opposite sides of said second connecting part of said second level interconnection.

28. The fuse array of claim 15, wherein each of said fuse structures further comprises a passivation film having a lower hygroscopicity than said inter-layer insulator, wherein said inter-layer insulator is covered by said passivation film.

29. A fuse structure formed in an inter-layer insulator, wherein said fuse structure has a first level interconnection and a second level interconnection isolated by said inter-layer insulator from said first level interconnection, said inter-layer insulator being covered by a passivation film having a lower hygroscopicity than said inter-layer insulator, said fuse structure comprising a conductive plug for providing an electrical connection between a first connecting part of said first level interconnection and a second connecting part of said second level interconnection, wherein said fuse structure further comprises at least a void which extends within said inter-layer insulator and also at least a part of said void extends adjacent to said second connecting part of said second level interconnection, so that when said second connecting part is rapidly evaporated by receiving a thermal energy, an evaporated material of said second connecting part is deposited on an inner wall of said void for causing an electrical disconnection between said first and second interconnections.

30. The fuse structure of claim 29, wherein said void is separated by a part of said inter-layer insulator from said second connecting part of said level interconnection.

31. The fuse structure of claim 29, wherein said void extends in contact with said second connecting part of said second level interconnection.

32. The fuse structure of claim 29, wherein a top of said void is in contact with a bottom of said passivation film.

33. The fuse structure of claim 29, wherein a top of said void is separated by said inter-layer insulator from a bottom of said passivation film.

34. The fuse structure of claim 29, wherein said void has substantially the same level as said second level interconnection and said void extends in one side of said second level interconnection, so that said void is displaced from a longitudinal center line of said second level interconnection.

35. The fuse structure of claim 34, wherein said first level interconnection and said second level interconnection extend anti-parallel to each other from said first and second connecting parts respectively, so that said first level interconnection and said second level interconnection have the same longitudinal direction, wherein said second interconnection has an extension extending from said second connecting part in the longitudinal direction of said second interconnection, so that said extension of said second level interconnection extends over said first level interconnection, and wherein said second level interconnection including said extension is wider than said first level interconnection so that said first connecting part and other parts of said first level interconnection in the vicinity of said second connecting part are covered by said second level interconnection with said extension.

36. The fuse structure of claim 35, further comprising an extra interconnection extending in parallel to said second level interconnection, wherein said extra interconnection has substantially the same level as said second level interconnection, and said extra interconnection is displaced from said second level interconnection in a direction perpendicular to said longitudinal direction of said second level interconnection, and further said extra interconnection extends substantially symmetrical with reference to a center line extending both on a center of said second connecting part and in said direction perpendicular to said longitudinal direction of said second level interconnection, thereby to define an inter-layer insulator channel region between said second level interconnection and said extra interconnection, and wherein said void extends along said inter-layer insulator channel region between said second level interconnection and said extra interconnection, so that said void extends in parallel to said second level interconnection and also parallel to said extra interconnection, and opposite ends of said void are positioned in correspondence with opposite ends of said extra interconnection in a view perpendicular to said longitudinal direction of said second level interconnection, whereby said void extends substantially symmetrical with reference to said center line extending on said second connecting part and in said direction perpendicular to said longitudinal direction of said second level interconnection.

37. The fuse structure of claim 29, wherein two of said voids have substantially the same level as said second level interconnection and said two voids extend along opposite sides of said second level interconnection, so that said two voids sandwich said second connecting part in a direction perpendicular to a longitudinal direction of said second level interconnection.

38. The fuse structure of claim 37, wherein said first level interconnection and said second level interconnection extend anti-parallel to each other from said first and second connecting parts respectively, so that said first level interconnection and said second level interconnection have the same longitudinal direction, wherein said second interconnection has an extension extending from said second connecting part in the longitudinal direction of said second interconnection, so that said extension of said second level interconnection extends over said first level interconnection, and wherein said second level interconnection including said extension is wider than said first level interconnection so that said first connecting part and other parts of said first level interconnection in the vicinity of said second connecting part are covered by said second level interconnection with said extension.

39. The fuse structure of claim 38, further comprising a pair of extra interconnections extending in parallel to said second level interconnection, wherein each of said paired extra interconnections has substantially the same level as said second level interconnection, and said paired extra interconnections are displaced from said second level interconnection in a direction perpendicular to said longitudinal direction of said second level interconnection, and further said paired extra interconnections extend substantially symmetrical with reference to a center line extending both on a center of said second connecting part and in said direction perpendicular to said longitudinal direction of said second level interconnection, thereby to define two inter-layer insulator channel regions between said second level interconnection and said paired extra interconnections respectively, and wherein said two voids extend along said two inter-layer insulator channel regions between said second level interconnection and said paired extra interconnections, so that said two voids extend in parallel to said second level interconnection and also parallel to said paired extra interconnections, and opposite ends of each of said two voids are positioned in correspondence with opposite ends of each of said paired extra interconnections in a view perpendicular to said longitudinal direction of said second level interconnection, whereby each of said two voids extends substantially symmetrical with reference to said center line extending on said second connecting part and in said direction perpendicular to said longitudinal direction of said second level interconnection.

40. The fuse structure of claim 29, wherein said second connecting part of said second level interconnection comprises one end of said second level interconnection, and wherein said void has substantially the same level as said second level interconnection, and said void extends in one end side of said second level interconnection, so that said void extends on an extending longitudinal center line of said second level interconnection.

41. The fuse structure of claim 29, wherein said void extends over said second connecting part of said second level interconnections.

42. The fuse structure of claim 29, wherein said second connecting part of said second level interconnection comprises one end of said second level interconnection, and wherein said void extends in a form of a U-shape which surrounds said second connecting part in about three quarter of omnidirections, so that said U-shape of said void has substantially the same level as said second level interconnection, and said U-shape of said void extends in one end side and in opposite sides of said second connecting part of said second level interconnection.

43. The fuse structure of claim 29, wherein said void extends in a form of a U-shape which surrounds said second connecting part in about three quarter of omnidirections, so that said U-shape of said void has substantially the same level as and higher level than said second level interconnection, and said U-shape of said void extends over and in opposite sides of said second connecting part of said second level interconnection.

* * * * *